(12) United States Patent
Tu et al.

(10) Patent No.: US 12,355,001 B2
(45) Date of Patent: Jul. 8, 2025

(54) SEMICONDUCTOR PACKAGE STRUCTURE AND METHOD FOR FORMING THE SAME

(71) Applicant: Taiwan Semiconductor Manufacturing Company, Ltd., Hsinchu (TW)

(72) Inventors: Yen-Chu Tu, Kaohsiung (TW); Shang-Lun Tsai, Hsinchu (TW); Monsen Liu, Hsinchu County (TW); Shuo-Mao Chen, New Taipei (TW); Shin-Puu Jeng, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 637 days.

(21) Appl. No.: 17/669,914

(22) Filed: Feb. 11, 2022

(65) Prior Publication Data
US 2023/0154892 A1 May 18, 2023

Related U.S. Application Data

(60) Provisional application No. 63/280,276, filed on Nov. 17, 2021.

(51) Int. Cl.
*H01L 25/065* (2023.01)
*H01L 21/48* (2006.01)
(Continued)

(52) U.S. Cl.
CPC ...... *H01L 25/0655* (2013.01); *H01L 21/4857* (2013.01); *H01L 21/563* (2013.01);
(Continued)

(58) Field of Classification Search
CPC ..... H01L 23/535–5381; H01L 23/5383; H01L 23/5386
See application file for complete search history.

(56) References Cited

U.S. PATENT DOCUMENTS

2021/0134728 A1* 5/2021 Rubin ................ H01L 21/4853
2021/0305132 A1* 9/2021 Karhade ................ H01L 24/83
(Continued)

*Primary Examiner* — Evan G Clinton
(74) *Attorney, Agent, or Firm* — Birch, Stewart, Kolasch & Birch, LLP

(57) ABSTRACT

A semiconductor package structure is provided. The semiconductor package structure includes a carrier substrate, an interposer substrate, a connecting element, a first semiconductor device, a second semiconductor device, a first underfill layer, and a package layer. The interposer substrate is disposed on the carrier substrate. The connecting element is disposed in the interposer substrate. The connecting element includes a dielectric element and first conductive features disposed in the dielectric element. The first semiconductor device and the second semiconductor device are disposed on the interposer substrate. The first semiconductor device is electrically connected to the second semiconductor device through the connecting element. The first underfill layer is disposed between the first semiconductor device, the second semiconductor device, and the interposer substrate. The package layer surrounds the first semiconductor device, the second semiconductor device, and the first underfill layer.

19 Claims, 65 Drawing Sheets

(51) Int. Cl.
  *H01L 21/56* (2006.01)
  *H01L 23/00* (2006.01)
  *H01L 23/31* (2006.01)
  *H01L 23/498* (2006.01)
  *H01L 23/538* (2006.01)
  *H01L 25/00* (2006.01)
(52) U.S. Cl.
  CPC .... *H01L 23/3157* (2013.01); *H01L 23/49811* (2013.01); *H01L 23/5383* (2013.01); *H01L 23/5386* (2013.01); *H01L 24/16* (2013.01); *H01L 24/17* (2013.01); *H01L 24/73* (2013.01); *H01L 25/50* (2013.01); *H01L 2224/16227* (2013.01); *H01L 2224/17177* (2013.01); *H01L 2224/73204* (2013.01)

(56) References Cited

U.S. PATENT DOCUMENTS

| | | | | |
|---|---|---|---|---|
| 2021/0305163 A1* | 9/2021 | Akkinepally | ....... | H01L 23/5381 |
| 2022/0302010 A1* | 9/2022 | Shen | .................. | H01L 21/6836 |
| 2022/0352075 A1* | 11/2022 | Weng | .................. | H01L 23/3157 |
| 2023/0115073 A1* | 4/2023 | Lee | ...................... | H01L 23/481 |
| | | | | 257/690 |

* cited by examiner

SEMICONDUCTOR PACKAGE STRUCTURE AND METHOD FOR FORMING THE SAME

PRIORITY CLAIM AND CROSS-REFERENCE

The present application claims priority of U.S. Provisional Patent Application Ser. No. 63/280,276, filed on Nov. 17, 2021, the entirety of which is incorporated by reference herein.

BACKGROUND

Semiconductor devices are used in a variety of electronic applications, such as personal computers, cell phones, digital cameras, and other electronic equipment. Semiconductor devices are fabricated by sequentially depositing insulating or dielectric layers, conductive layers, and semiconductor layers over a semiconductor substrate, and patterning the various material layers using lithography and etching processes to form circuit components and elements thereon. Many integrated circuits (ICs) are typically manufactured on a single semiconductor wafer, and individual dies on the wafer are singulated by sawing between the integrated circuits along a scribe line. The individual dies are typically packaged separately, in multi-chip modules, for example, or in other types of packaging.

A package (structure) not only provides protection for semiconductor devices from environmental contaminants, but also provides a connection interface for the semiconductor devices packaged therein. Smaller package structures, which take up less area or are lower in height, have been developed to package the semiconductor devices.

Although existing packaging structures and methods for fabricating package structure have generally been adequate for their intended purposes, they have not been entirely satisfactory in all respects.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
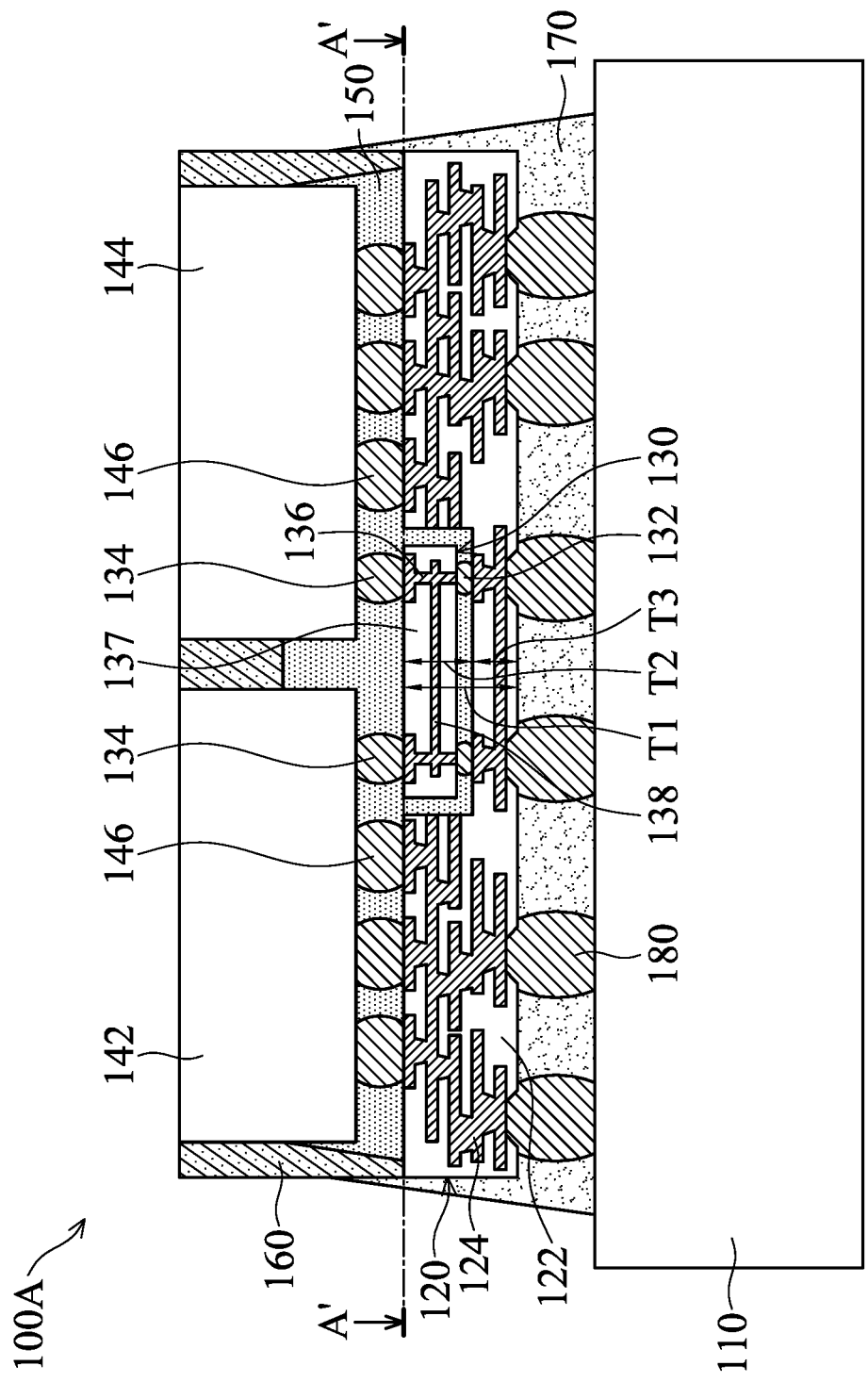
FIG. 1A is a schematic view of a semiconductor package structure, in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The term "substantially" in the description, such as in "substantially flat" or in "substantially coplanar", etc., will be understood by the person skilled in the art. In some embodiments the adjective substantially may be removed. Where applicable, the term "substantially" may also include embodiments with "entirely", "completely", "all", etc. Where applicable, the term "substantially" may also relate to 90% or higher, such as 95% or higher, especially 99% or higher, including 100%. Furthermore, terms such as "substantially parallel" or "substantially perpendicular" are to be interpreted as not to exclude insignificant deviation from the specified arrangement and may include for example deviations of up to 10°. The word "substantially" does not exclude "completely" e.g. a composition which is "substantially free" from Y may be completely free from Y.

Terms such as "about" in conjunction with a specific distance or size are to be interpreted so as not to exclude insignificant deviation from the specified distance or size and may include for example deviations of up to 10%. The term "about" in relation to a numerical value x may mean x ±5 or 10%. The terms "each" in the description are to be interpreted so as not to exclude variations among units and not to exclude an omission of a part of the units.

Embodiments will be described with respect to a specific context, namely a packaging technique with an interposer substrate or other active chip in a two and a half dimensional integrated circuit (2.5DIC) structure or a three dimensional IC (3DIC) structure. Embodiments discussed herein are to provide examples to enable making or using the subject matter of this disclosure, and a person having ordinary skill in the art will readily understand modifications that can be made while remaining within contemplated scopes of different embodiments. Although method embodiments may be discussed below as being performed in a particular order, other method embodiments contemplate steps that are performed in any logical order.

A semiconductor package structure and the method for forming the same are provided in accordance with various embodiments. Some variations of some embodiments are discussed. Throughout the various views and illustrative embodiments, like reference numbers are used to designate like elements. In accordance with some embodiments of the present disclosure, a semiconductor package structure having an interposer substrate is provided. In some embodiments, a recess is formed on the interposer substrate, and a connecting element, such as a silicon bridge, is disposed in the recess. In some embodiments, the connecting element allows semiconductor devices in the semiconductor package structure connect each other with finer pitch electrical connection through high density silicon interconnects, thereby improves the electrical performance of die-to-die connections, and maintains the interposer substrate routability and bump density. In some embodiments, the connecting element enables vertical connection of the elements above and below the connecting element.

In some embodiments, an accommodating space is formed on the interposer substrate, and a connecting element is disposed on the accommodating space, such as enclosed in the accommodating space. Therefore, the connecting element is separated from an underfill layer in contact with semiconductor devices above the interposer substrate by the interposer substrate. In some embodiments, the connecting element allows the semiconductor devices in the semiconductor package structure connect each other, thereby improves the electrical performance of die-to-die connections, and maintains the interposer substrate routability and bump density. In some embodiments, the connecting element enables vertical connection of the elements above and below the connecting element. In some embodiments, the connecting element is sandwiched between two portions of the interposer substrate, one portion is above the connecting element, and another portion is below the connecting element, so the mechanical strength of the interposer substrate may be maintained.

FIG. 1A is a schematic view of a semiconductor package structure 100A, in accordance with some embodiments of the present disclosure. As shown in FIG. 1A, the semiconductor package structure 100A mainly includes a carrier substrate 110, an interposer substrate 120, a connecting element 130, a first semiconductor device 142, a second semiconductor device 144, an underfill layer 150, a molding layer 160, and an underfill layer 170, in accordance with some embodiments of the present disclosure.

In some embodiments, the carrier substrate 110 is a semiconductor substrate. By way of example, the material of the carrier substrate 110 may include elementary semiconductor such as silicon or germanium; a compound semiconductor such as silicon germanium, silicon carbide, gallium arsenic, gallium phosphide, indium phosphide or indium arsenide; or combinations thereof. Alternatively, the carrier substrate 110 may be a silicon-on-insulator (SOI) substrate, a germanium-on-insulator (GOI) substrate, or the like. In some other embodiments, the carrier substrate 110 is a printed circuit board (PCB), a ceramic substrate, or another suitable package substrate. The carrier substrate 110 may be a core or a core-less substrate, in accordance with some embodiments.

In some embodiments, the interposer substrate 120 is disposed on the carrier substrate 110, such as connected to the carrier substrate 110 by conductive structures 180. An underfill layer 170 is provided to surround and protect the conductive structures 180, in accordance with some embodiments of the present disclosure. In some embodiments, the interposer substrate 120, such as an organic interposer, includes a board 122 and conductive features 124. The conductive features 124 may be made of or include copper, aluminum, cobalt, nickel, gold, silver, tungsten, one or more other suitable materials, or a combination thereof. The board 122 may be made of or include a polymer material, a ceramic material, a metal material, a semiconductor material, one or more other suitable materials, or a combination thereof. For example, the board 122 includes resin, prepreg, glass, and/or ceramic. In the embodiments that the board 122 includes organic materials, the coefficient of thermal expansion (CTE) mismatch issue between the board 122 and other elements may be mitigated, which reduces the stress between the elements. In cases where the board 122 is made of a metal material or a semiconductor material, dielectric layers may be formed between the board 122 and the conductive features 124 to prevent short circuiting. In some embodiments, the conductive features 124 include circuits with pitches between about 2 μm to about 20 μm. In some embodiments, the conductive features 124 include circuits with linewidths between about 1 μm to about 10 μm.

In some embodiments, the conductive structures 180 may include conductive pillars, solder bumps, one or more other suitable bonding structures, or a combination thereof. The conductive structures 180 are made of a solder material, such as Sn and Ag or another suitable conductive material (e.g., gold), in accordance with some embodiments. The conductive structures 180 are solder balls, in accordance with some embodiments. A reflow process (not shown) may be performed to make the metallurgical connections between the carrier substrate 110, the conductive structures 180, and the interposer substrate 120, in accordance with some embodiments of the present disclosure.

In some embodiments, the underfill layer 170 is dispensed (e.g., by a dispenser (not shown)) into the space between the interposer substrate 120 and the carrier substrate 110 and the space between adjacent conductive structures 180, and then cured (e.g., ultraviolet (UV) or thermally cured) to harden. The underfill layer 170 may be configured to provide a stronger mechanical connection and a heat bridge between the interposer substrate 120 and the carrier substrate 110, to reduce cracking in the conductive structures 180 caused by thermal expansion mismatches between the interposer substrate 120 and the carrier substrate 110, and to protect the joints from contaminants, thereby improving reliability of the fabricated semiconductor package structure 100A. In some embodiments, the underfill layer 170 includes liquid epoxy, deformable gel, silicon rubber, or the like.

In cases where the board 122 is made of or includes a polymer material, the board 122 may further include fillers that are dispersed in the polymer material. The polymer material may be made of or include epoxy-based resin, polyimide-based resin, one or more other suitable polymer materials, or a combination thereof. The examples of the fillers may include fibers (such as silica fibers and/or carbon-containing fibers), particles (such as silica particles and/or carbon-containing particles), or a combination thereof.

In some embodiments, a recess is formed in the interposer substrate 120, and the connecting element 130 is disposed in the recess of the interposer substrate 120. In some embodiments, a portion of the interposer substrate 120 extends between the connecting element 130 and the carrier substrate 110. In some embodiments, the first semiconductor device 142 and the second semiconductor device 144 are connected to the connecting element 130 through conductive structures 134. Therefore, the first semiconductor device 142 is electrically connected to the second semiconductor device 144 through the connecting element 130. The connecting element 130 may be a silicon bridge, which enables direct fine pitch electrical connection through high density silicon interconnects of the connecting element 130, in accordance with some embodiments of the present disclosure.

In some embodiments, the first semiconductor device 142 or the second semiconductor device 144 may be a functional integrated circuit (IC) die such as a semiconductor die, an electronic die, a Micro-Electro Mechanical Systems (MEMS) die, or a combination thereof. The functional IC die may include one or more application processors, logic circuits, memory devices, power management integrated circuits, analog circuits, digital circuits, mixed signal circuits, one or more other suitable functional integrated circuits, or a combination thereof, depending on actual needs. In some alternative embodiments, the first semiconductor device 142 or the second semiconductor device 144 may be a package module that has one or more semiconductor dies and an interposer substrate carrying these semiconductor dies. These structures of the first semiconductor device 142 or the second semiconductor device 144 are well known in the art and therefore not described herein. The first semiconductor device 142 or the second semiconductor device 144 can be fabricated by various processes such as deposition, etching, implantation, photolithography, annealing, and/or other suitable processes.

In some embodiments, the connecting element 130 includes a passive device (such as a capacitor, a resistor, etc.), a transistor, a memory device, etc. disposed in a dielectric element 137 of the connecting element 130. In some embodiments, conductive structures 132 may be disposed below the connecting element 130, and disposed between the interposer substrate 120 and the connecting element 130. In some embodiments, conductive features 136 and conductive features 138 may be provided in the dielectric element 137 of the connecting element 130, such as embedded in the dielectric element 137. In some embodiments, a portion of the conductive features 136 is exposed from the dielectric element 137, such as in contact with the conductive structures 132 for electrical conduction. In some embodiments, the conductive features 136 may be through silicon vias (TSV) and vertically pass through the dielectric element 137 of the connecting element 130 to provide electrical connection in the vertical direction. In some embodiments, the material of the conductive features 136 may include metal, such as Cu, Al, W, or another suitable conductive material. In some embodiments, the dielectric element 137 includes dielectric materials, such as silicon or another suitable dielectric material. In some embodiments, the material of the conductive features 138 may include metal, such as Cu, Al, W, or another suitable conductive material. In some embodiments, the conductive features 138 include circuits with pitches between about 0.8 μm and about 2 μm. In some embodiments, the conductive features 138 include circuits with linewidths between about 0.4 μm and about 1 μm.

For example, the conductive features 136 may in contact with the conductive structures 132 below the connect element 130 and the conductive structures 134 above the connecting element 130. Therefore, electrical signal may be transported vertically from the first semiconductor device 142 or the second semiconductor device 144 through the conductive structures 134 above the connecting element 130, the conductive features 136 in the connecting element 130, and the conductive structures 132 under the connecting element 130 to the interposer substrate 120, in accordance with some embodiments of the present disclosure. As a result, electrical signal can be transmitted to the first semiconductor device 142 or the second semiconductor device 144 in a shorter path, in accordance with some embodiments of the present disclosure.

In some embodiments, the conductive features 138 may be a redistribution layer to connect the conductive features 136, so that the first semiconductor device 142 may be electrically connected to the second semiconductor device 144 through the conductive features 136 and the conductive features 138. Therefore, the signal transport speed of the semiconductor package structure 100A may be increased by the connecting element 130, in accordance with some embodiments of the present disclosure. Moreover, using the connecting element 130 for signal transmission reduces the number of required through silicon vias (TSVs), which reduces overall cost and preserves low resistance for high frequency signals, in accordance with some embodiments of the present disclosure.

In some embodiments, as shown in FIG. 1A, the interposer substrate 120 has a thickness T1, and the recess has a depth T2. In some embodiments, a ratio of the thickness T1 of the interposer substrate 120 to the depth T2 of the recess is between 1.2 and 2. In other words, a ratio of the thickness T3 of the portion of the interposer substrate 120 under the connecting element 130 to the depth T2 of the recess is between 1:1 and 1:5. Therefore, enough space is provided for the connecting element 130, so that the connecting element 130 can provide better electrical connection for the first semiconductor device 142 and the second semiconductor device 144, in accordance with some embodiments of the present disclosure.

Moreover, the conductive features 124 may be provided in the portion of the interposer substrate 120 under the connecting element 130 as well, so the routability of the interposer substrate 120 can be maintained, in accordance with some embodiments of the present disclosure. Moreover, more conductive structures 180 may be provided on the interposer substrate 120, such as may be provided on the portion of the interposer substrate 120 under the recess, in accordance with some embodiments of the present disclosure. The interposer substrate 120 and the connecting element 130 have substantially coplanar top surfaces, in accordance with some embodiments of the present disclosure. In some embodiments, the connecting element 130 is thinner than the interposer substrate 120 to achieve miniaturization.

In some embodiments, the conductive structures 132 may include conductive pillars, solder bumps, one or more other suitable bonding structures, or a combination thereof. The conductive structures 132 are made of a solder material, such as Sn and Ag or another suitable conductive material (e.g., gold), in accordance with some embodiments. The conductive structures 132 are solder balls, in accordance with some embodiments. A reflow process (not shown) may be performed to make the metallurgical connections between the interposer substrate 120 and the connecting element 130, in accordance with some embodiments of the present disclosure.

In some embodiments, the first semiconductor device 142 and the second semiconductor device 144 are bonded onto the conductive structures 134 and conductive structures 146. The conductive structures 134 and the conductive structures 146 may include conductive pillars, solder bumps, one or more other suitable bonding structures, or a combination thereof, in accordance with some embodiments of the present disclosure. The conductive structures 134 and the conductive structures 146 are made of a solder material, such as Sn and Ag or another suitable conductive material (e.g., gold), in accordance with some embodiments of the present disclosure. The conductive structures 134 and the conductive structures 146 are solder balls, in accordance with some embodiments. A reflow process (not shown) may be performed to make the metallurgical connections between the interposer substrate 120, the connecting element 130, the first semiconductor device 142, the second semiconductor device 144, the conductive structures 134, and the conductive structures 146, in accordance with some embodiments of the present disclosure.

In some embodiments, an underfill layer 150 is dispensed (e.g., by a dispenser (not shown)) into the space between the interposer substrate 120, the connecting element 130, the first semiconductor device 142, and the second semiconductor device 144, and then cured (e.g., ultraviolet (UV) or thermally cured) to harden. The underfill layer 150 may be configured to provide a stronger mechanical connection and a heat bridge between the interposer substrate 120, the connecting element 130, the first semiconductor device 142, and the second semiconductor device 144 to reduce cracking in the conductive structures 134 and the conductive structures 146 caused by thermal expansion mismatches between the interposer substrate 120, the connecting element 130, the first semiconductor device 142, and the second semiconductor device 144, and to protect the joints from contaminants, thereby improving reliability of the fabricated semiconductor package structure 100A, in accordance with some embodiments of the present disclosure. In some embodiments, the underfill layer 150 includes liquid epoxy, deformable gel, silicon rubber, or the like.

In some embodiments, a molding layer 160 is provided to fill gaps between the first semiconductor device 142 and the second semiconductor device 144, in accordance with some embodiments. The molding layer 160 in the gaps surrounds the first semiconductor device 142 and the second semiconductor device 144, in accordance with some embodiments. The molding layer 160 may be configured to provide package stiffness, a protective or hermetic shielding, and/or provide a heat conductive path to prevent chip overheating, in accordance with some embodiments of the present disclosure. The molding layer 160 may be formed by a spin-on coating process, an injection molding process, or the like, in accordance with some embodiments of the present disclosure.

The molding layer 160 includes a polymer material, in accordance with some embodiments. The term "polymer" here can represent thermosetting polymers, thermoplastic polymers, or any mixtures thereof, in accordance with some embodiments. The polymer material can include, for example, plastic materials, epoxy resin, polyimide, polyethylene terephthalate (PET), polyvinyl chloride (PVC), polymethylmethacrylate (PMMA), polymer components doped with specific fillers including fiber, clay, ceramic, inorganic particles, or any combinations thereof. In other embodiments, the molding layer 160 can be made of epoxy resin, such as epoxy cresol novolac (ECN), biphenyl epoxy resin, multifunctional liquid epoxy resin, or any combinations thereof, in accordance with some embodiments. In still other embodiments, the molding layer 160 can be made of epoxy resin optionally including one or more fillers to provide the composition with any of a variety of desirable properties. Examples of fillers can be aluminum, titanium dioxide, carbon black, calcium carbonate, silica, or any combinations thereof, in accordance with some embodiments. A thermal process is performed on the molding layer 160 to cure the molding layer 160, in accordance with some embodiments of the present disclosure.

Figure 1B:
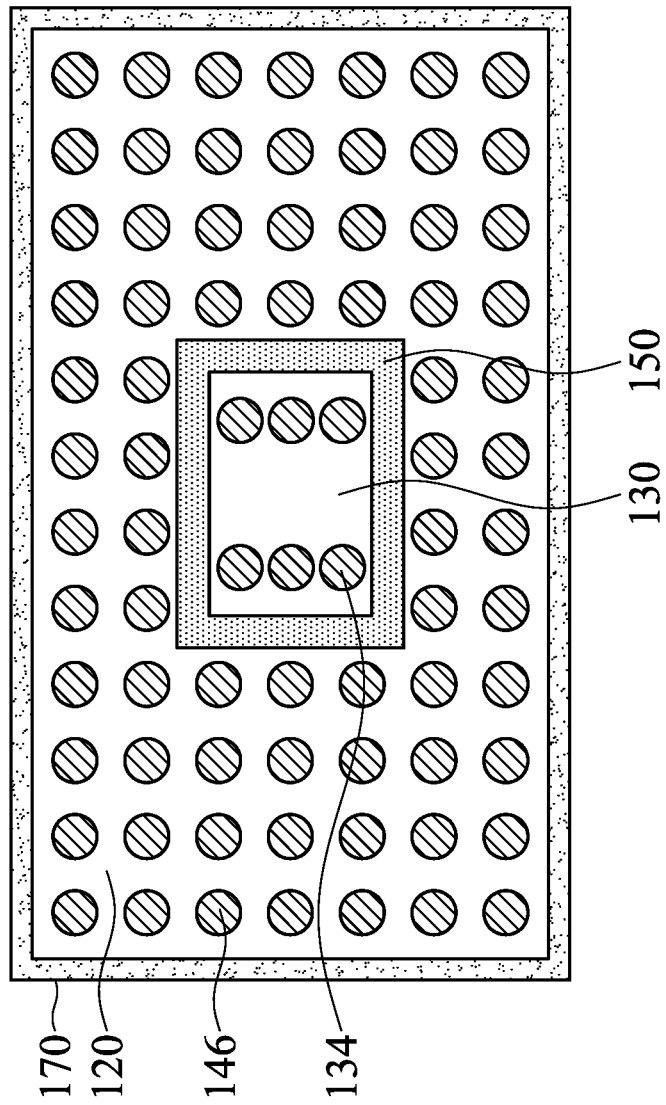
FIG. 1B is a top view illustrated along line A'-A' in FIG. 1A, in accordance with some embodiments of the present disclosure.

In some embodiments, the connecting element 130 and the interposer substrate 120 are separated by the underfill layer 150. For example, FIG. 1B is a top view illustrated along line A'-A' in FIG. 1A, in accordance with some embodiments of the present disclosure. In some embodiments, the connecting element 130 is surrounded by the interposer substrate 120, and the underfill layer 150 fills the gap between the connecting element 130 and the interposer substrate 120. In some embodiments, the conductive structures 134 overlap the connecting element 130, and the conductive structures 146 overlap the interposer substrate 120. In other words, the conductive structures 146 are separated from the connecting element 130 in the top view, in accordance with some embodiments of the present disclosure.

Figure 2A:
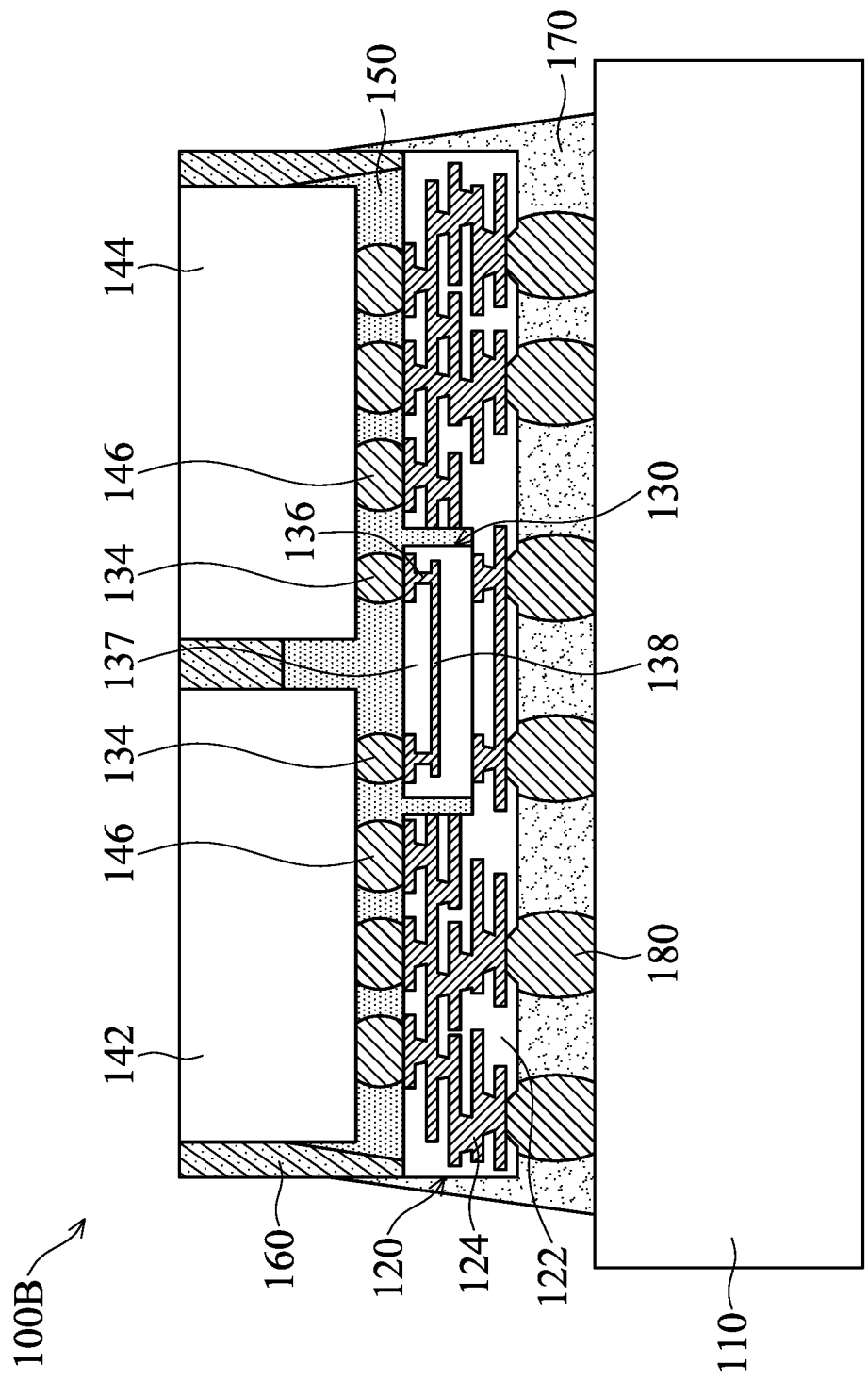
FIG. 2A is a schematic view of a semiconductor package structure, in accordance with some embodiments of the present disclosure.

In some embodiments, the conductive structures 132 may be omitted. For example, FIG. 2A is a schematic view of a semiconductor package structure 100B, in accordance with some embodiments of the present disclosure. In FIG. 2A, the connecting element 130 is in contact with a bottom surface of the recess (e.g. see FIG. 6B) of the interposer substrate 120. In some embodiments, the connecting element 130 is not directly electrically connected to the interposer substrate 120 through the contact area between the interposer substrate 120 and the connecting element 130. Therefore, the process steps and costs may be reduced.

Figure 2B:
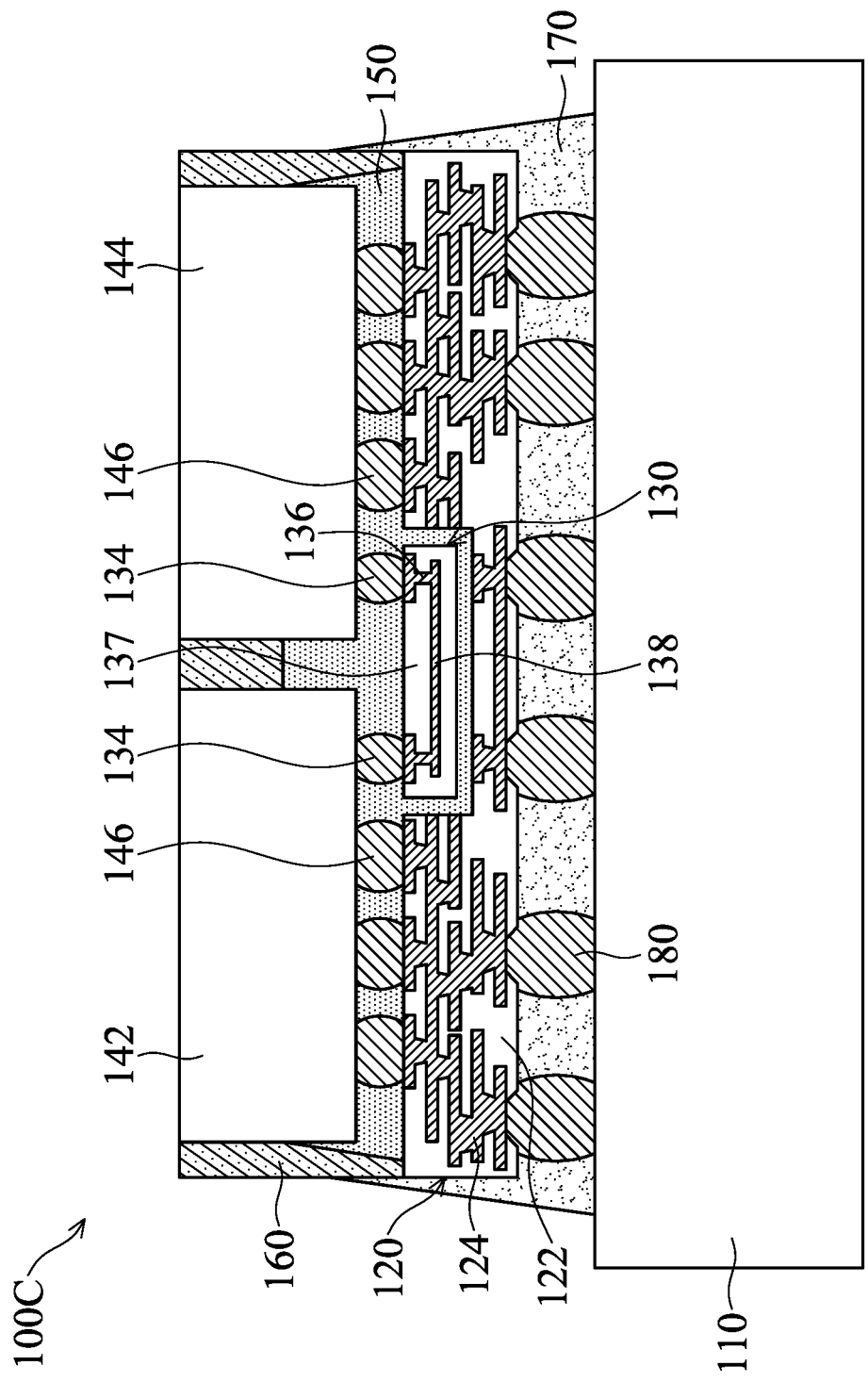
FIG. 2B is a schematic view of a semiconductor package structure, in accordance with some embodiments of the present disclosure.

FIG. 2B is a schematic view of a semiconductor package structure 100C, in accordance with some embodiments of the present disclosure. In some embodiments, the connecting element 130 is separated from the interposer substrate 120, and the underfill layer 150 fills the space between the interposer substrate 120 and the connecting element 130. Since in the semiconductor package structure 100C, no conductive structure is provided between the interposer substrate 120 and the connecting element 130 in the recess of the interposer substrate 120, the process steps and costs may be reduced, in accordance with some embodiments of the present disclosure.

Figure 3A:
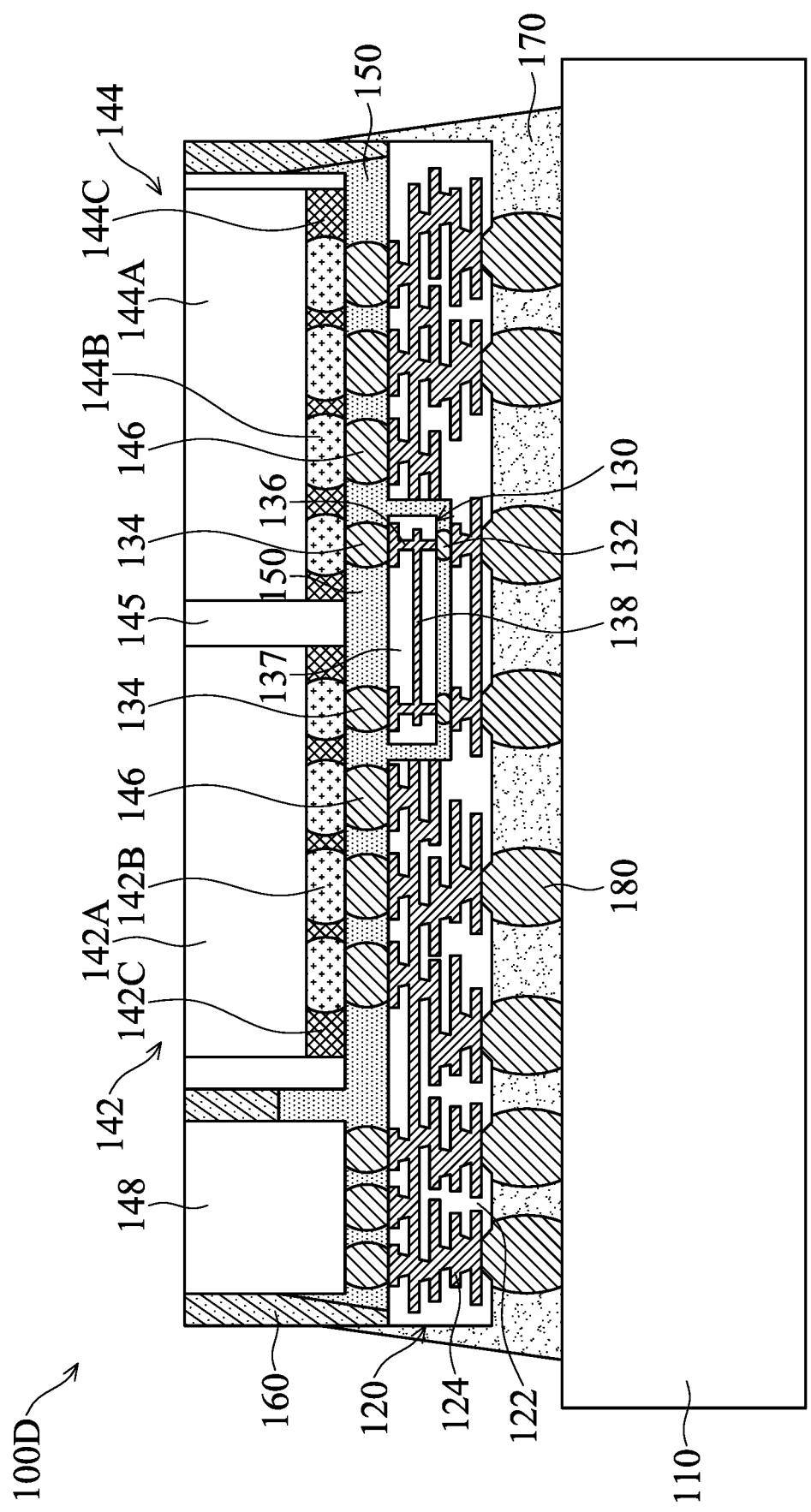
FIG. 3A is a schematic view of a semiconductor package structure, in accordance with some embodiments of the present disclosure.

FIG. 3A is a schematic view of a semiconductor package structure 100D, in accordance with some embodiments of the present disclosure. In the semiconductor package structure 100D, the first semiconductor device 142 and the second semiconductor device 144 may be chip packages. For example, the first semiconductor device 142 includes a chip 142A, conductive structures 142B under the chip 142A, and an underfill layer 142C under the chip 142A and surrounding the conductive structures 142B, in accordance with some embodiments of the present disclosure.

The second semiconductor device 144 includes a chip 144A, conductive structures 144B under the chip 144A, and an underfill layer 144C under the chip 144A and surrounding the conductive structures 144B, in accordance with some embodiments of the present disclosure. A molding structure 145 is provided to continuously surround the first semiconductor device 142 and the second semiconductor device 144, in accordance with some embodiments of the present disclosure. In some embodiments, a third semiconductor device 148 is provided in the semiconductor package structure 100D. In some embodiments, the third semiconductor device 148 is connected to the interposer substrate 120, and is surrounded by the underfill layer 150 and the molding layer 160. In some embodiments, the chip 142A, the chip 144A, and the third semiconductor device 148 have different heights or functions. For example, the heights the conductive structures 142B and conductive structures 144B are adjustable for chips with different heights.

Figure 3B:
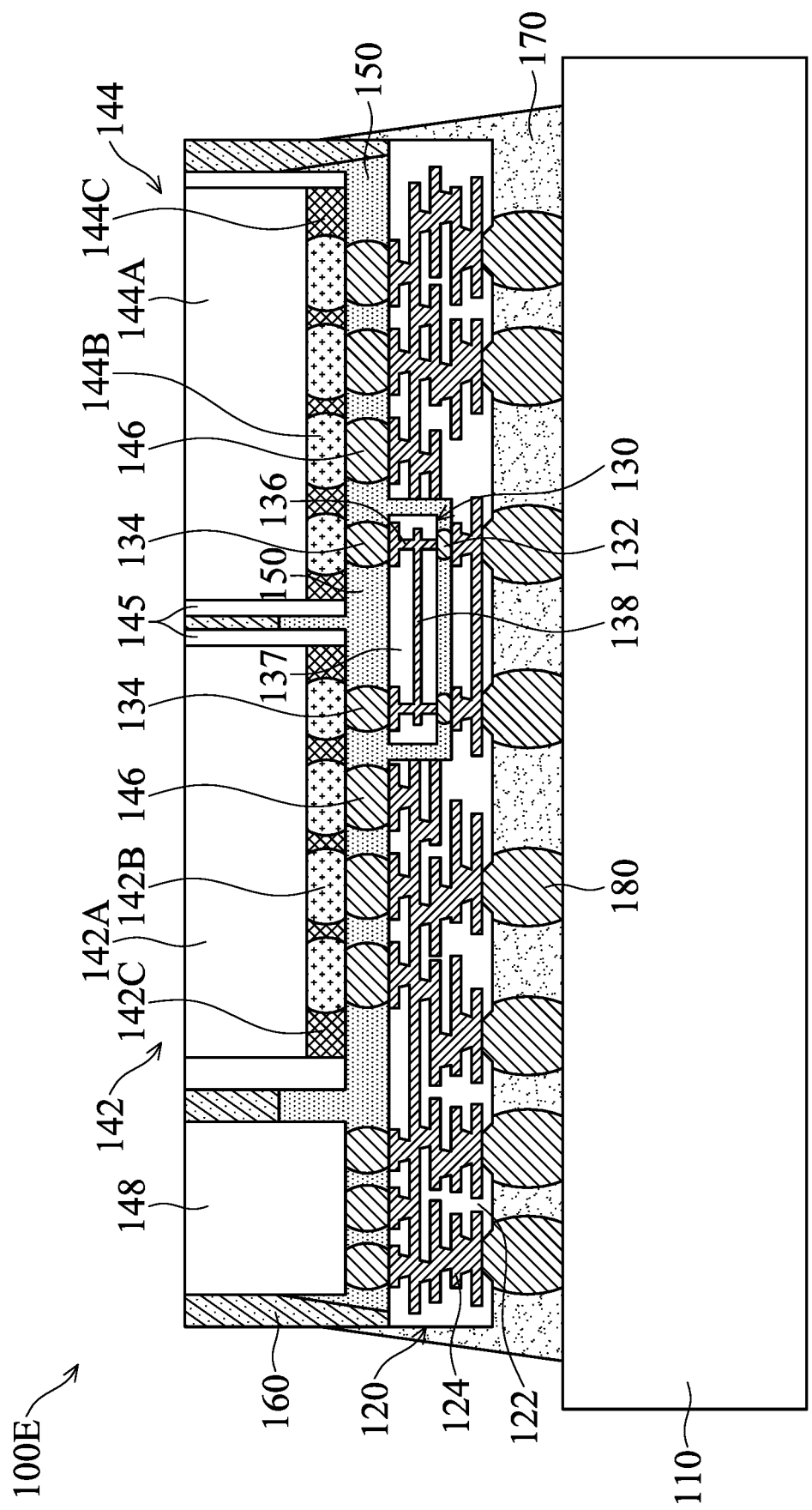
FIG. 3B is a schematic view of a semiconductor package structure, in accordance with some embodiments of the present disclosure.

FIG. 3B is a schematic view of a semiconductor package structure 100E, in accordance with some embodiments of the present disclosure. The semiconductor package structure 100E is similar to the previous embodiment, and the difference is that the molding structures 145 surrounding the first semiconductor device 142 and the second semiconductor device 144 are separated from each other, in accordance with some embodiments of the present disclosure. In other words, a portion of the underfill layer 150 and a portion of the molding layer 160 extend between the molding structures 145.

Figure 3C:
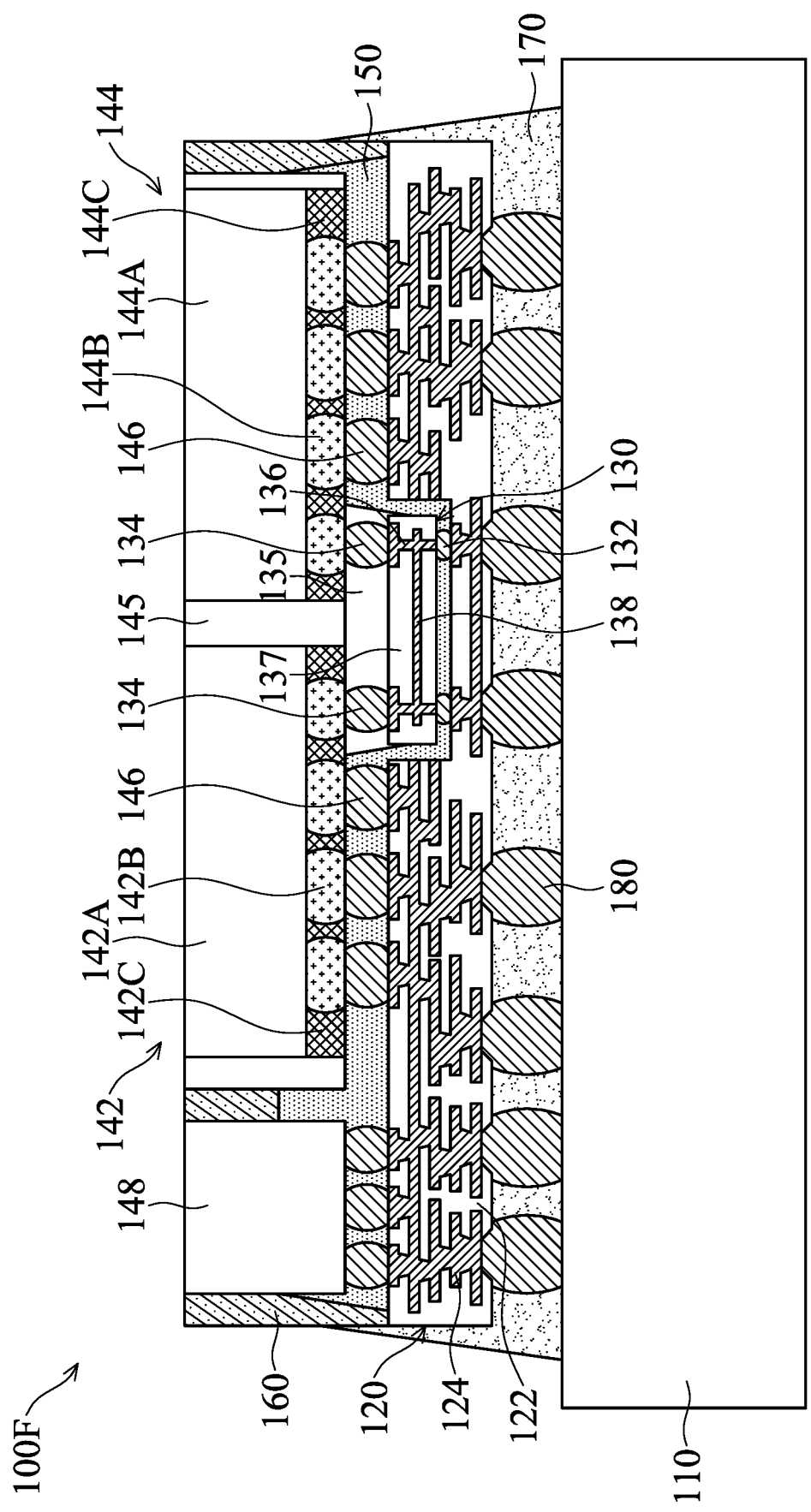
FIG. 3C is a schematic view of a semiconductor package structure, in accordance with some embodiments of the present disclosure.

FIG. 3C is a schematic view of a semiconductor package structure 100F, in accordance with some embodiments of the present disclosure. The semiconductor package structure 100F is similar to the previous embodiment, and the difference is that an underfill 135 is provided between the connecting element 130, the first semiconductor device 142, and the second semiconductor device 144 to surround and protect the conductive structures 134. In some embodiments, the underfill 135 and the underfill layer 150 are made from different material. Therefore, the conductive structures 134 are further protected from being damaged.

Figure 4A:
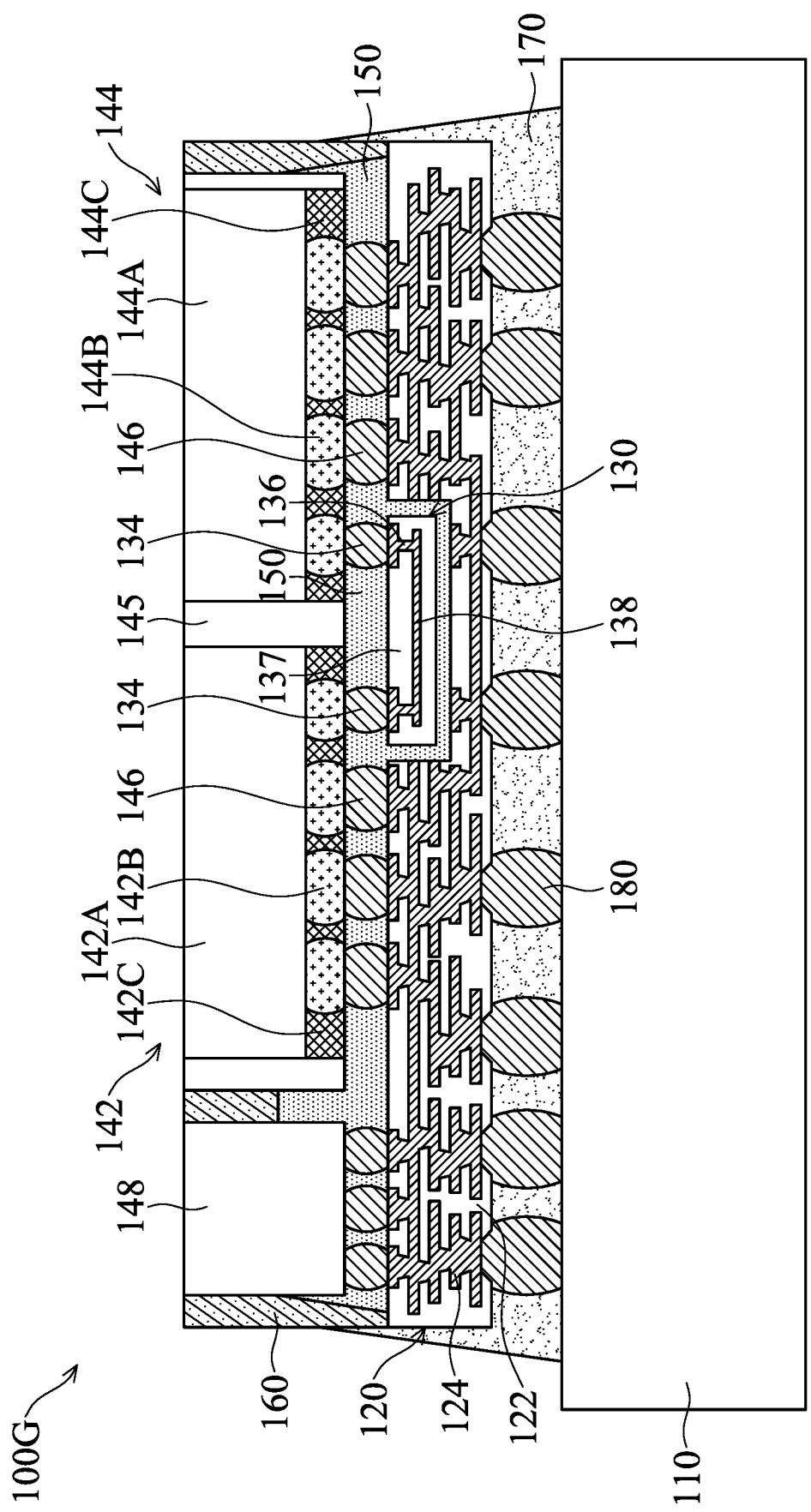
FIG. 4A is a schematic view of a semiconductor package structure, in accordance with some embodiments of the present disclosure.
Figure 4B:
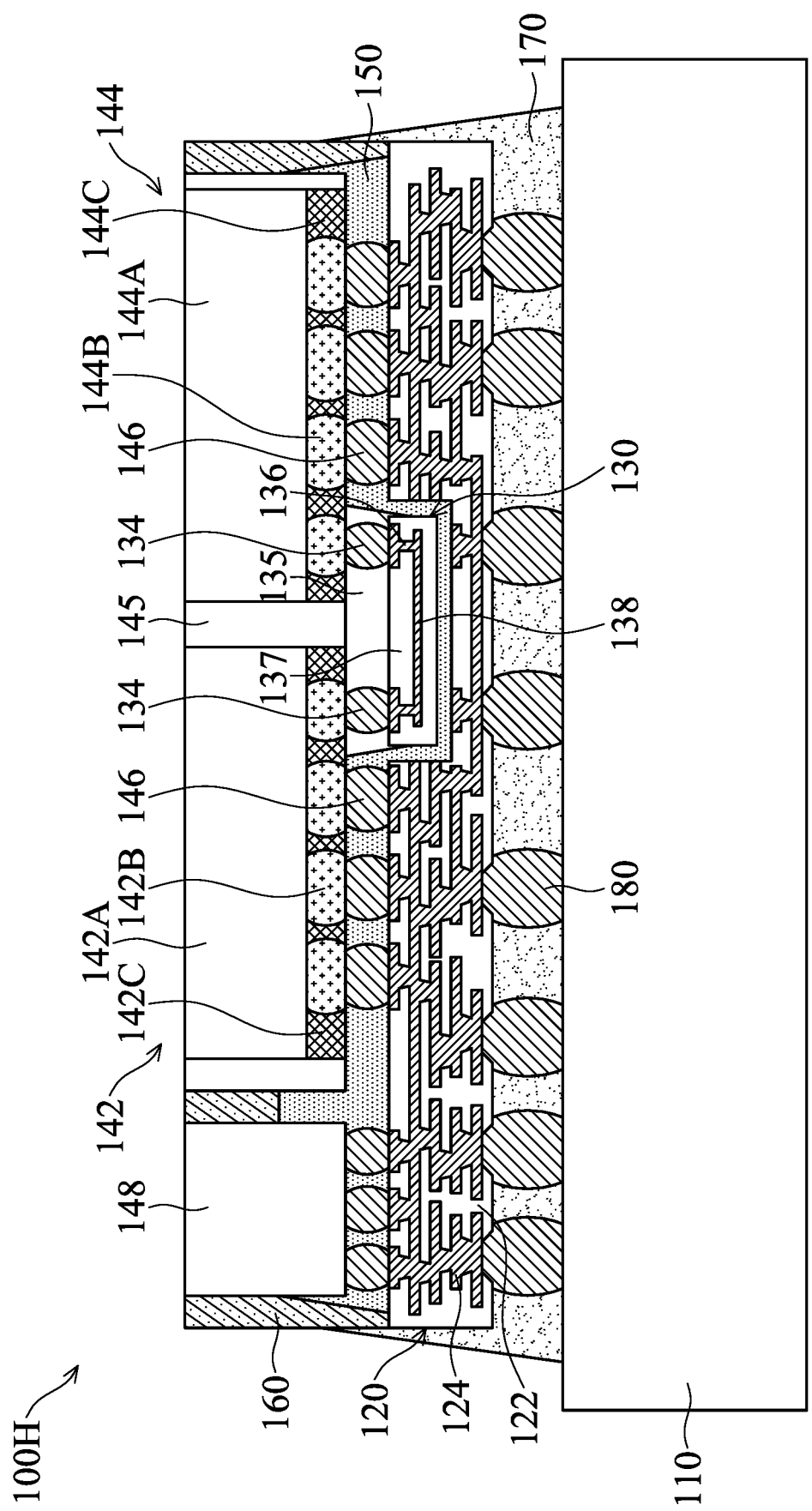
FIG. 4B is a schematic view of a semiconductor package structure, in accordance with some embodiments of the present disclosure.

In accordance with some embodiments of the present disclosure, FIG. 4A and FIG. 4B are schematic views of a semiconductor package structure 100G and a semiconductor package structure 100H, respectively. In some embodiments, the connecting element 130 in the semiconductor package structure 100G and the semiconductor package structure 100H are in contact with the interposer substrate 120, and the underfill 135 is provided in the semiconductor package structure 100H to surround the conductive structures 134.

Figure 5A:
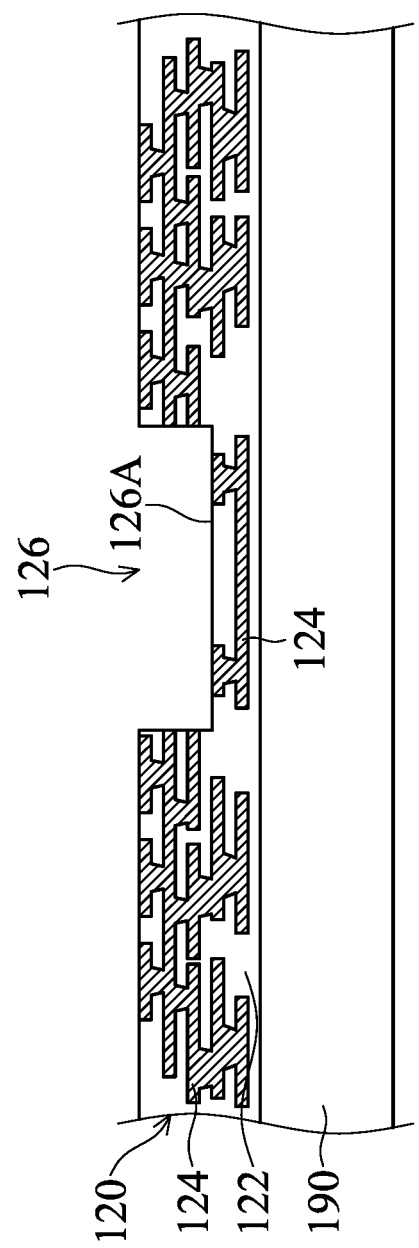
FIG. 5A to FIG. 5L show a process flow of forming the semiconductor package structure, in accordance with some embodiments of the present disclosure.

FIG. 5A to FIG. 5L show a process flow of forming the semiconductor package structure 100A, in accordance with some embodiments of the present disclosure. In FIG. 5A, the interposer substrate 120 is provide on a first carrier 190, in accordance with some embodiments of the present disclosure. In some embodiments, the interposer substrate includes a recess 126. In some embodiments, conductive features 124 are disposed in the portion of the interposer substrate 120 under the recess 126. In some embodiments, a die attach film (DAF) is provided between the first carrier 190 and the interposer substrate 120 to attach the first carrier 190 onto the interposer substrate 120, in accordance with some embodiments of the present disclosure.

Figure 5B:
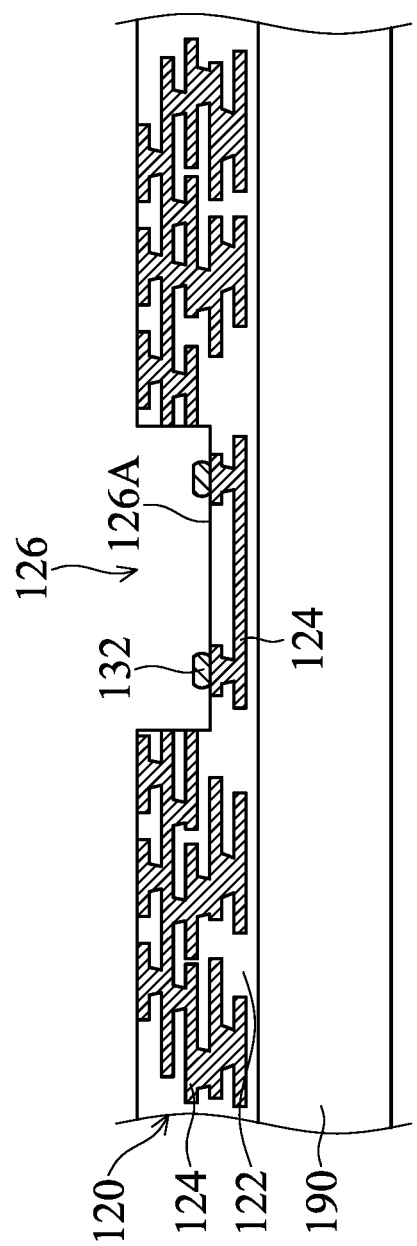
Figure 5C:
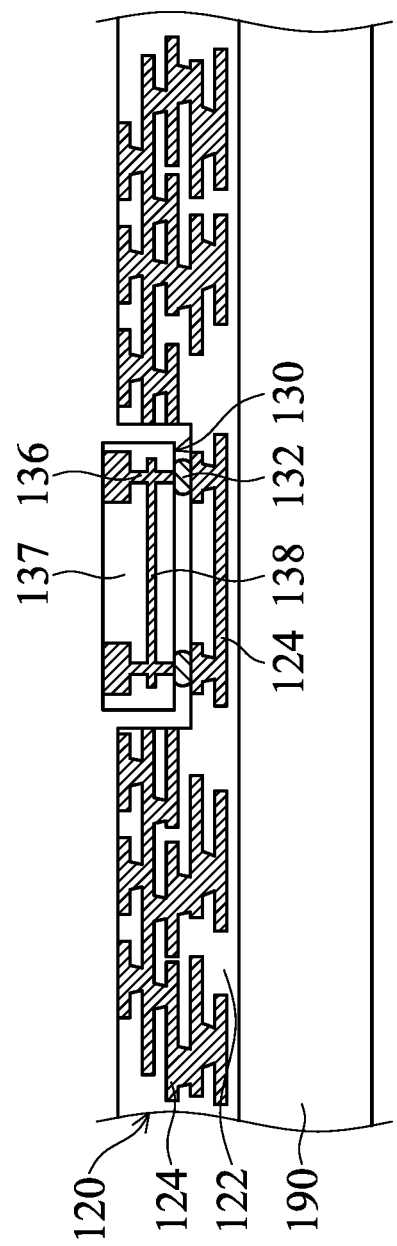

In FIG. 5B, conductive structures 132 are disposed in the recess 126 of the interposer substrate 120, in accordance with some embodiments of the present disclosure. In some embodiments, the conductive structures 132 are electrically connected to the conductive features 124 in the portion of the interposer substrate 120 under the recess 126. In FIG. 5C, the connecting element 130 is provided in the recess 126 and disposed on the conductive structures 132, in accordance with some embodiments of the present disclosure. In some embodiments, the connecting element 130 protrudes from the recess 126. In other words, the top surface of the connecting element 130 is higher than the top surface of the interposer substrate 120.

Figure 5D:
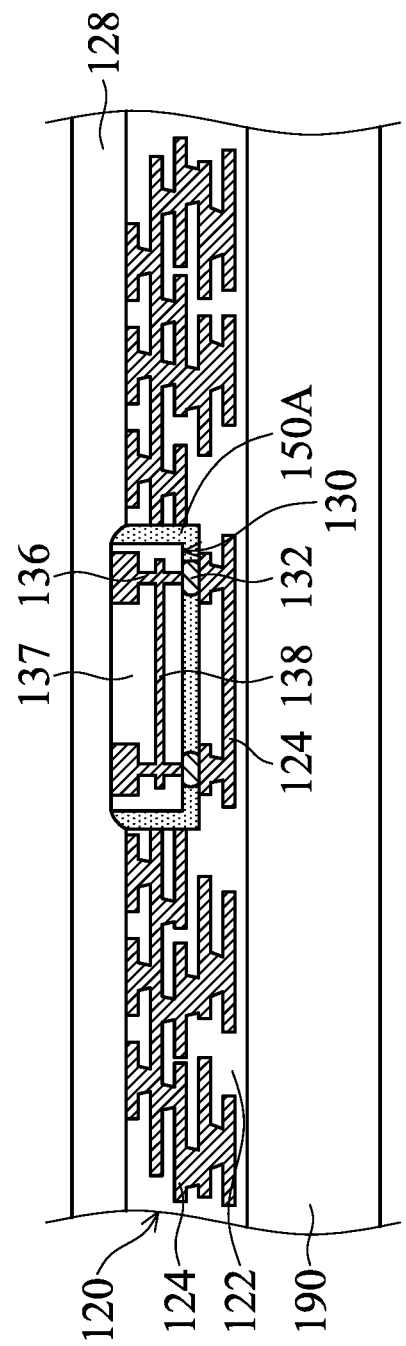

In FIG. 5D, an underfill element 150A is provided to fill the space in the recess 126, such as the space between the connecting element 130 and the interposer substrate 120. In some embodiments, the underfill element 150A surrounds the conductive structures 132. A molding compound 128 is provided to cover the interposer substrate 120, the connecting element 130, and the underfill element 150A, in accordance with some embodiments of the present disclosure. In some embodiments, the underfill element 150A and the molding compound 128 may include different materials, such as different kinds of epoxy with different compositions and additives.

The molding compound 128 includes a polymer material, in accordance with some embodiments. The term "polymer" here can represent thermosetting polymers, thermoplastic polymers, or any mixtures thereof, in accordance with some embodiments. The polymer material can include, for example, plastic materials, epoxy resin, polyimide, polyethylene terephthalate (PET), polyvinyl chloride (PVC), polymethylmethacrylate (PMMA), polymer components doped with specific fillers including fiber, clay, ceramic, inorganic particles, or any combinations thereof. In other embodiments, the molding compound 128 can be made of epoxy resin, such as epoxy cresol novolac (ECN), biphenyl epoxy resin, multifunctional liquid epoxy resin, or any combinations thereof, in accordance with some embodiments. In still other embodiments, the molding compound 128 can be made of epoxy resin optionally including one or more fillers to provide the composition with any of a variety of desirable properties. Examples of fillers can be aluminum, titanium dioxide, carbon black, calcium carbonate, silica, or any combinations thereof, in accordance with some embodiments. A thermal process is performed on the molding compound 128 to cure the molding compound 128, in accordance with some embodiments of the present disclosure.

Figure 5E:
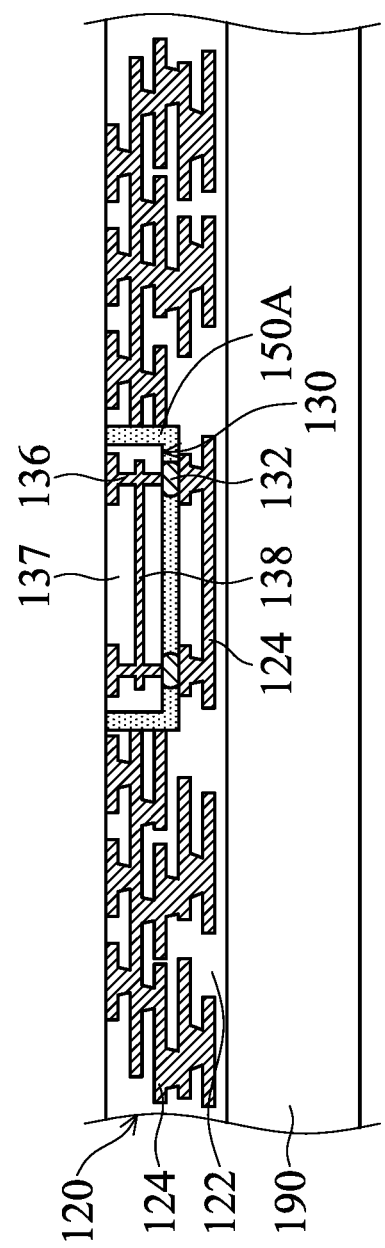

In FIG. 5E, the molding compound 128 and a portion of the connecting element 130 are removed (e.g. by grinding), so that the connecting element 130 and the interposer substrate 120 have substantially coplanar top surfaces, in accordance with some embodiments of the present disclosure. In some embodiments, a portion of the interposer substrate 120 is removed as well.

Figure 5F:
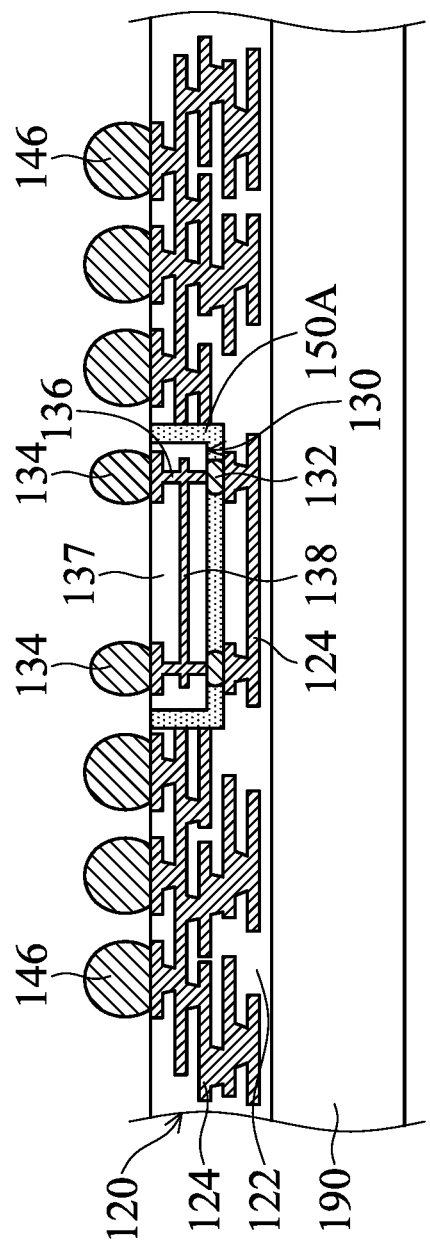

In FIG. 5F, the conductive structures 134 are provided on the connecting element 130, and the conductive structures 146 are provided on the interposer substrate 120, in accordance with some embodiments of the present disclosure. In some embodiments, the size of the conductive structures 134 and the conductive structures 146 may be identical or different. For example, the size of the conductive structures 134 may be smaller than the size of the conductive structures 146, in accordance with some embodiments of the present disclosure.

Figure 5G:
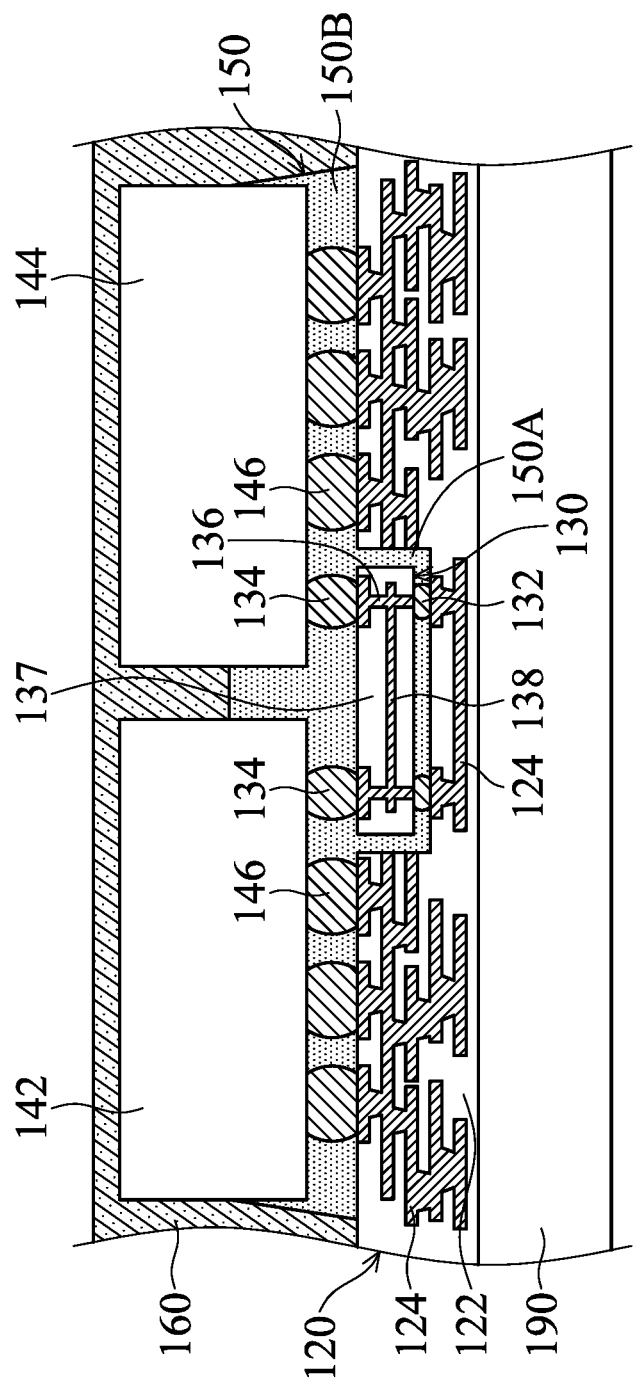

In FIG. 5G, the first semiconductor device 142 and the second semiconductor device 144 are provided on the conductive structures 134 and the conductive structures 146, in accordance with some embodiments of the present disclosure. In some embodiments, the connecting element 130 is exposed from the interposer substrate 120 when the first semiconductor device 142 and the second semiconductor device 144 are provided on the interposer substrate 120. In some embodiments, an underfill element 150B provided on the interposer substrate 120 and the underfill element 150A, and between the first semiconductor device 142 and the second semiconductor device 144. In some embodiments, the underfill element 150A and the underfill element 150B form the underfill layer 150. Therefore, the underfill layer 150 continuously extends between the interposer substrate 120, the connecting element 130, first semiconductor device 142, and the second semiconductor device 144. In some embodiments, the molding layer 160 is provided to cover and surround the first semiconductor device 142 and the second semiconductor device 144.

Figure 5H:
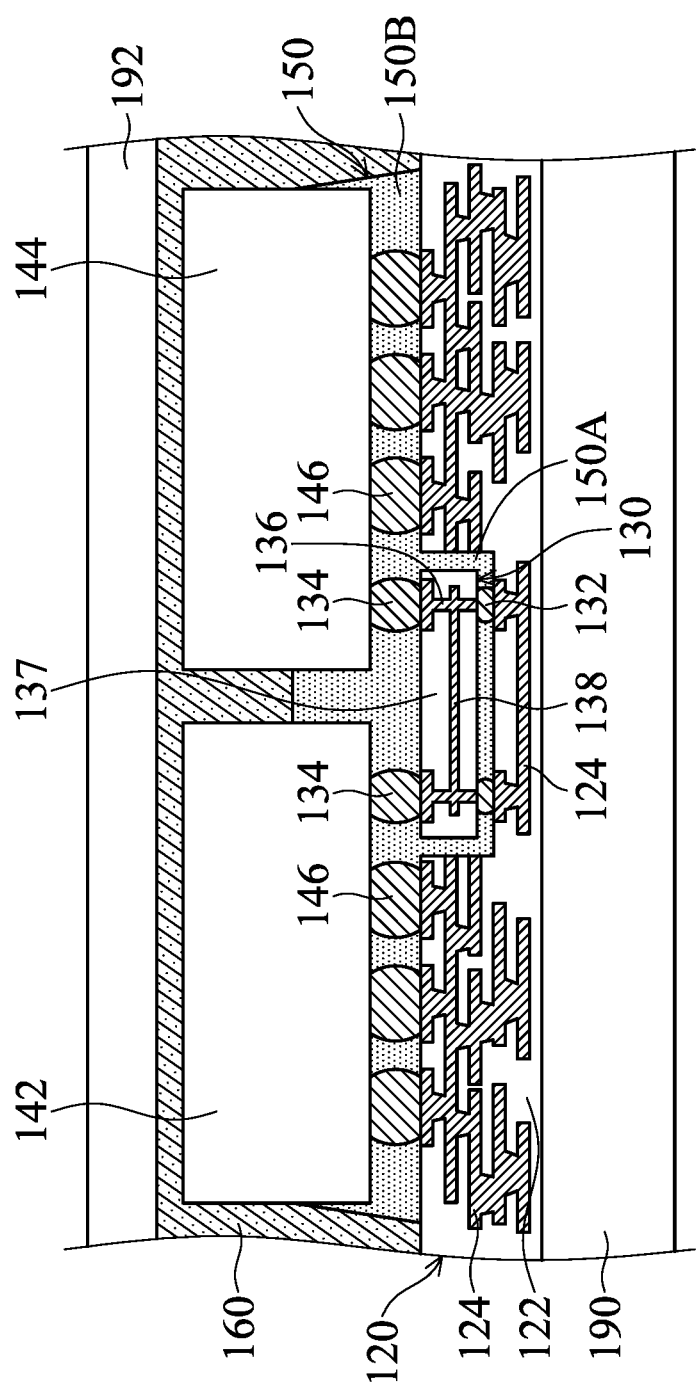
Figure 5I:
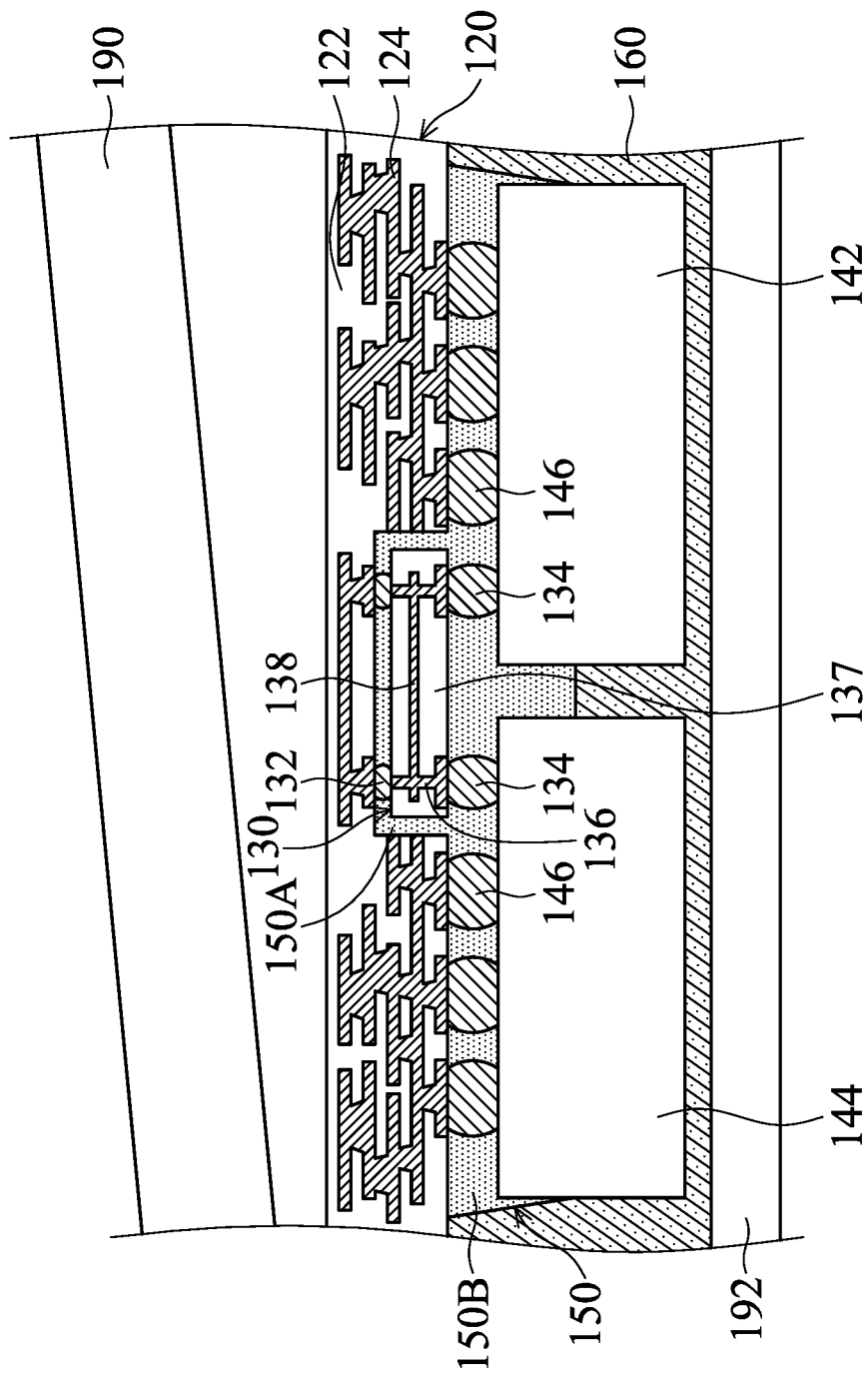

In FIG. 5H, a second carrier 192 is provided on the molding layer 160. In some embodiments, the first carrier 190 and the second carrier 192 are disposed on opposite sides of the interposer substrate 120. In some embodiments, a die attach film (DAF) is provided between the second carrier 192 and the molding layer 160 to attach the second carrier 192 onto the molding layer 160, in accordance with some embodiments of the present disclosure. In FIG. 5I, the whole structure is flipped, and the first carrier 190 is removed in some embodiments.

Figure 5J:
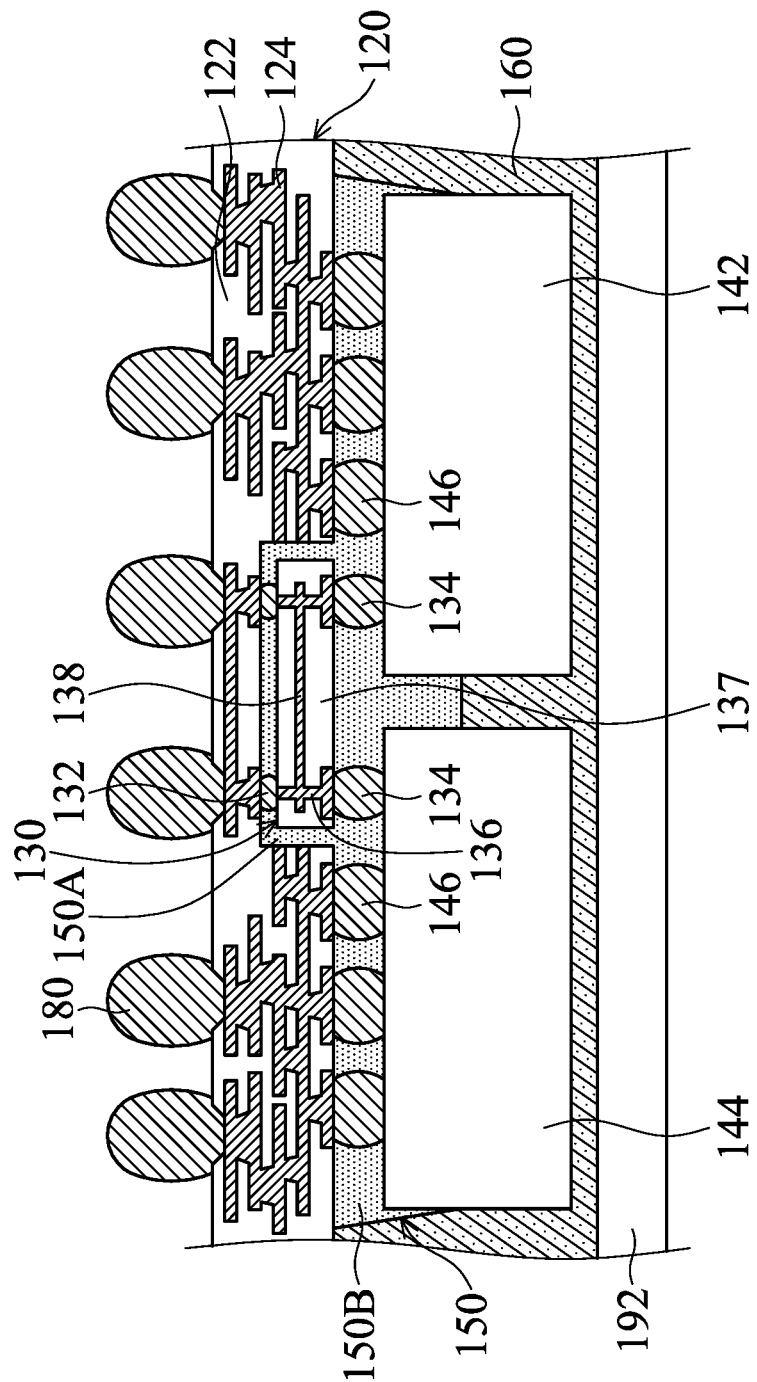

In FIG. 5J, holes are formed on the interposer substrate 120 (e.g. by etching) to expose the conductive features 124, and conductive structures 180 are formed on the interposer substrate 120 and partially formed in the holes of the interposer substrate 120 to in contact with the conductive features 124 in the interposer substrate 120, in accordance with some embodiments of the present disclosure.

Figure 5K:
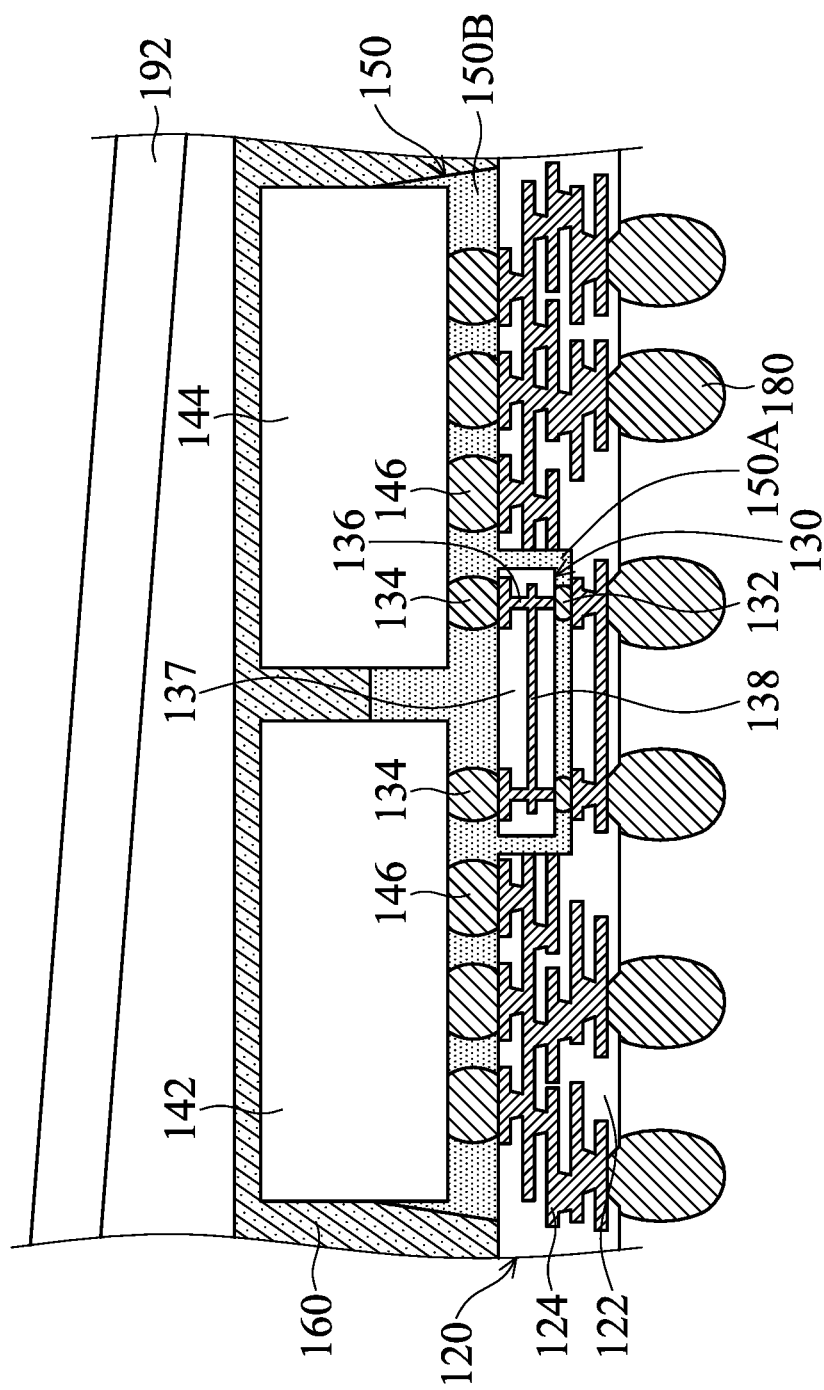
Figure 5L:
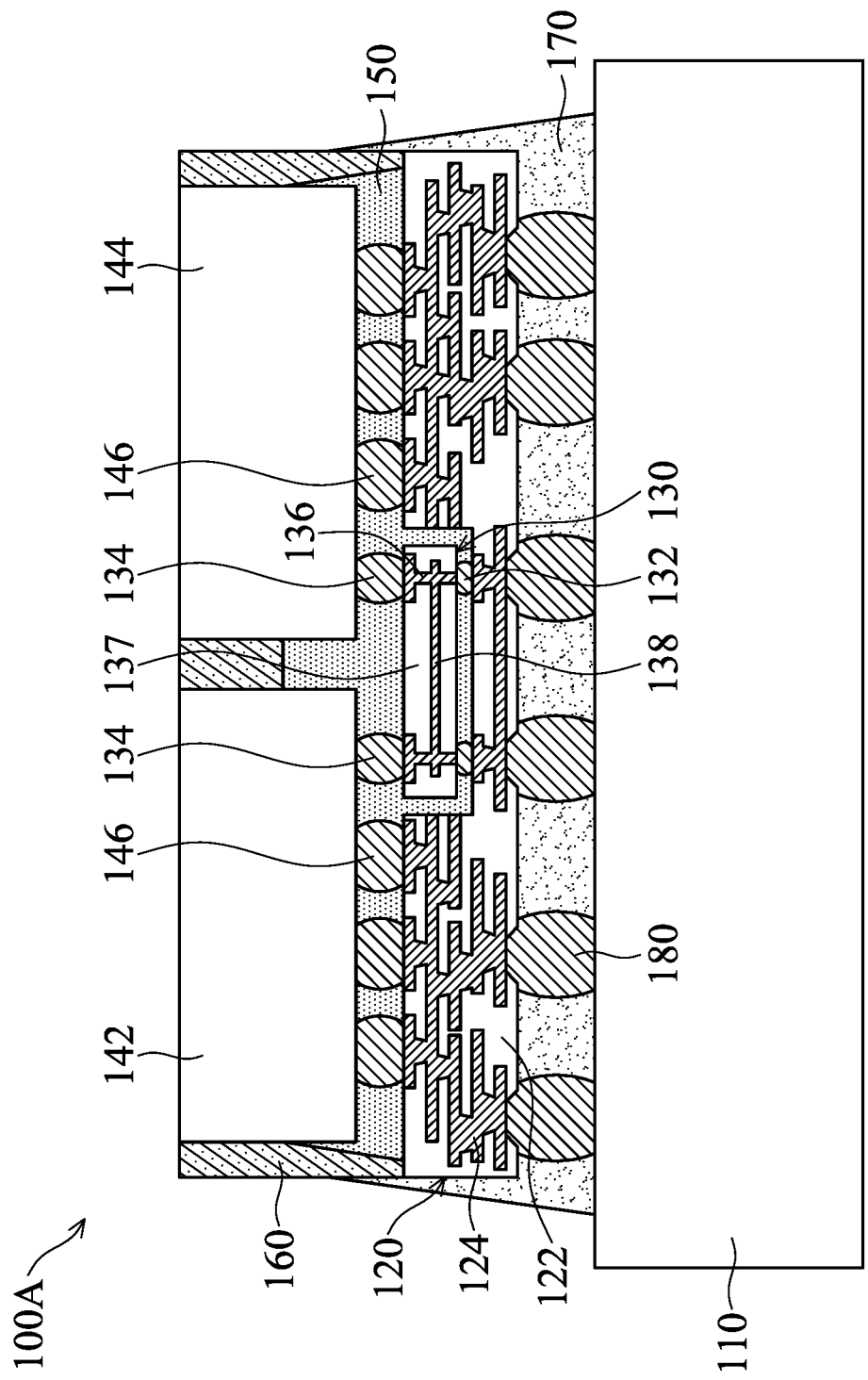

In FIG. 5K, the second carrier 192 is removed. In FIG. 5L, a dicing process is performed to let the molding layer 160 and the interposer substrate 120 have a straight sidewall, and then the carrier substrate 110 is connected to the interposer substrate 120 by the conductive structures 180, in accordance with some embodiments of the present disclosure. The underfill layer 170 is provided to surround the conductive structures 180, in accordance with some embodiments of the present disclosure. In some embodiments, a portion of the molding layer 160 is removed to expose the top surface of the first semiconductor device 142 and/or the top surface of the second semiconductor device 144, such as by grinding in some embodiments of the present disclosure. Therefore, the semiconductor package structure 100A is formed, in accordance with some embodiments of the present disclosure.

Figure 6A:
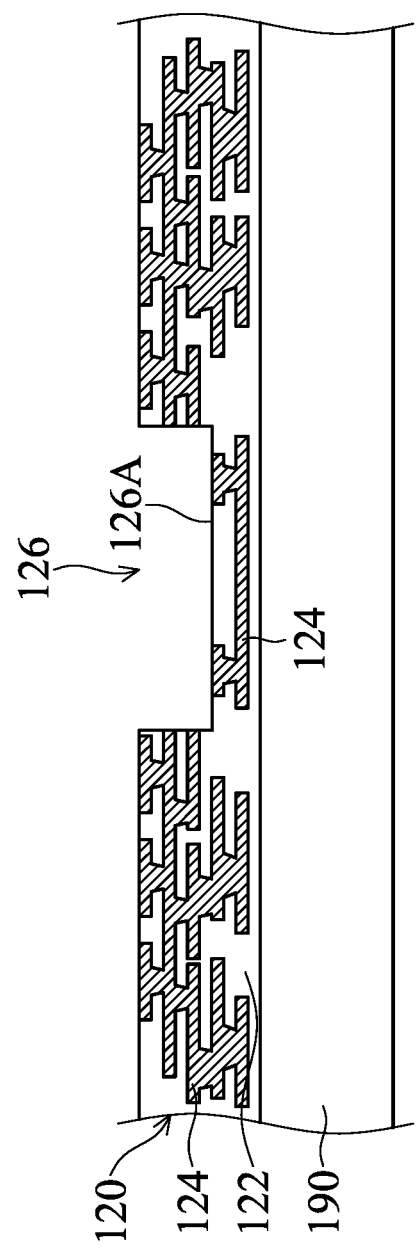
FIG. 6A to FIG. 6K show a process flow of forming the semiconductor package structure, in accordance with some embodiments of the present disclosure.

FIG. 6A to FIG. 6K show a process flow of forming the semiconductor package structure 100B, in accordance with some embodiments of the present disclosure. In FIG. 6A, the interposer substrate 120 is provide on a first carrier 190, in accordance with some embodiments of the present disclosure. In some embodiments, the interposer substrate includes a recess 126. In some embodiments, conductive features 124 are formed in the portion of the interposer substrate 120 under the recess 126. In some embodiments, a die attach film (DAF) is provided between the first carrier 190 and the interposer substrate 120 to attach the first carrier 190 onto the interposer substrate 120, in accordance with some embodiments of the present disclosure.

Figure 6B:
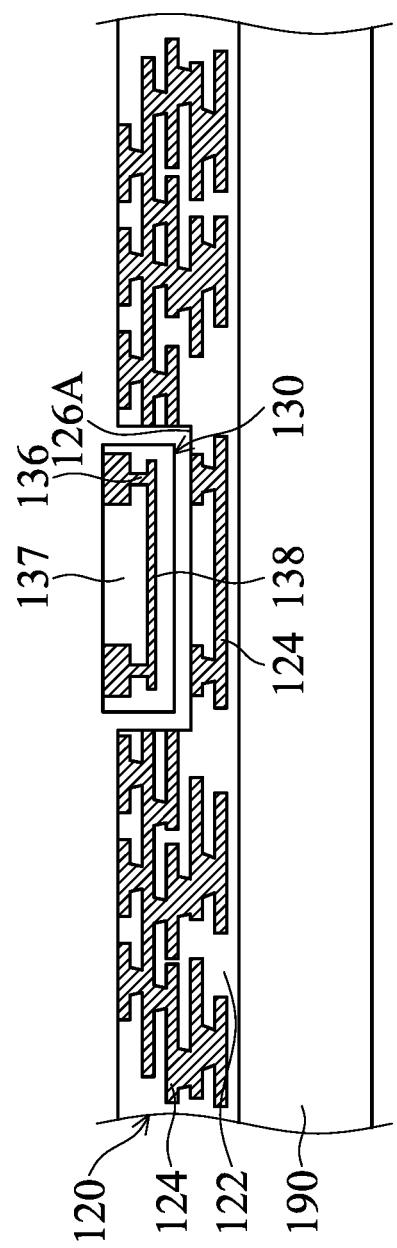

In FIG. 6B, the connecting element 130 is provided in the recess 126, in accordance with some embodiments of the present disclosure. In some embodiments, the connecting element 130 protrudes from the recess 126. In other words, the top surface of the connecting element 130 is higher than the top surface of the interposer substrate 120. In some embodiments, the connecting element 130 is in contact with a bottom surface 126A of the recess 126.

Figure 6C:
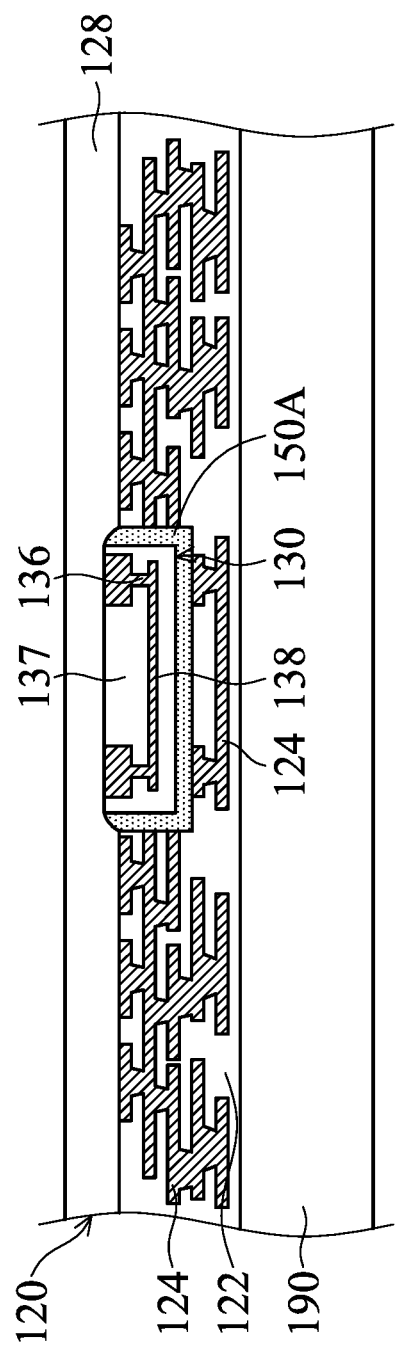

In FIG. 6C, an underfill element 150A is provided to fill the space in the recess 126, such as the space between the connecting element 130 and the interposer substrate 120. In some embodiments, the underfill element 150A surrounds the connecting element 130. A molding compound 128 is provided to cover the interposer substrate 120, the connecting element 130, and the underfill element 150A, in accordance with some embodiments of the present disclosure. In some embodiments, the underfill element 150A and the molding compound 128 may include different materials, such as different kinds of epoxy with different compositions and additives.

Figure 6D:
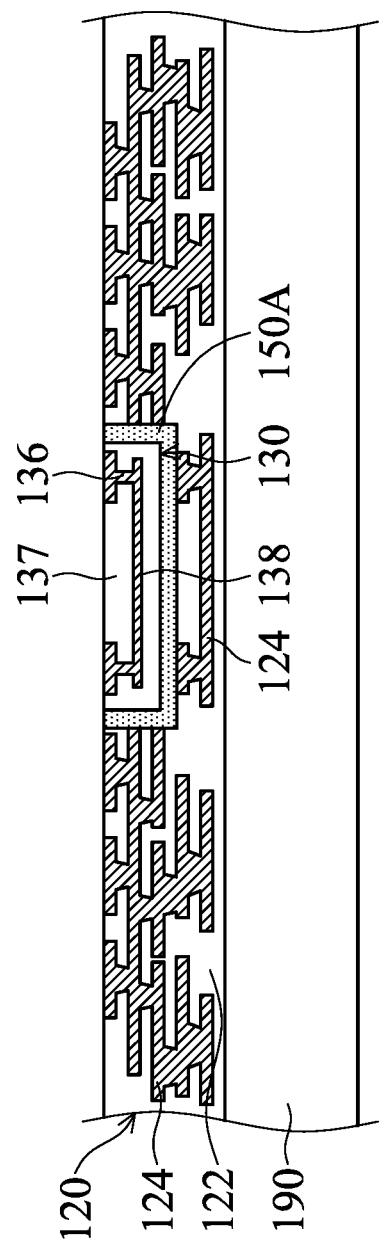

In FIG. 6D, the molding compound 128 and a portion of the connecting element 130 are removed (e.g. by grinding), so that the connecting element 130 and the interposer substrate 120 have substantially coplanar top surfaces, in accordance with some embodiments of the present disclosure. In some embodiments, a portion of the interposer substrate 120 is removed as well.

Figure 6E:
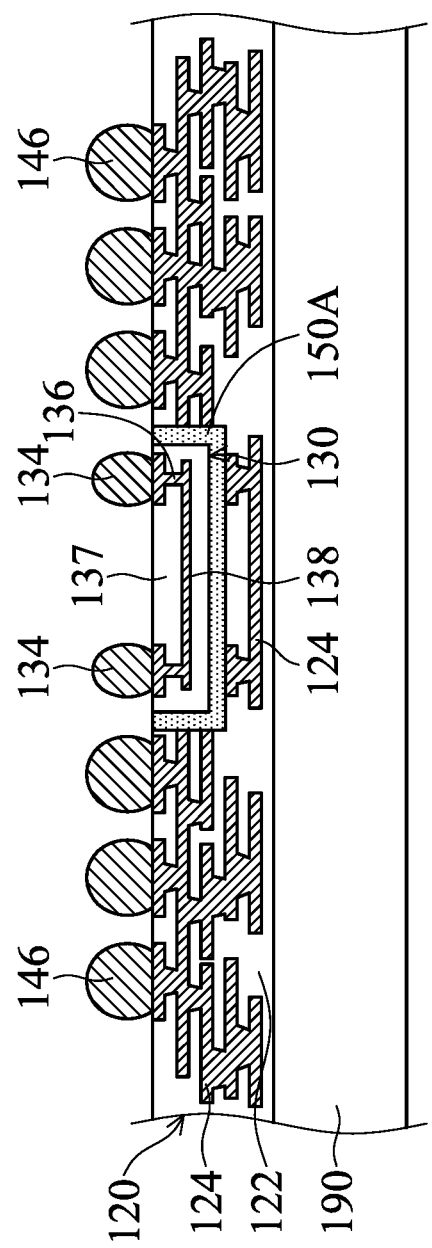

In FIG. 6E, conductive structures 134 are provided on the connecting element 130, and the conductive structures 146 are provided on the interposer substrate 120, in accordance with some embodiments of the present disclosure. In some embodiments, the size of the conductive structures 134 and the conductive structures 146 may be identical or different. For example, the size of the conductive structures 134 may be smaller than the size of the conductive structures 146, in accordance with some embodiments of the present disclosure.

Figure 6F:
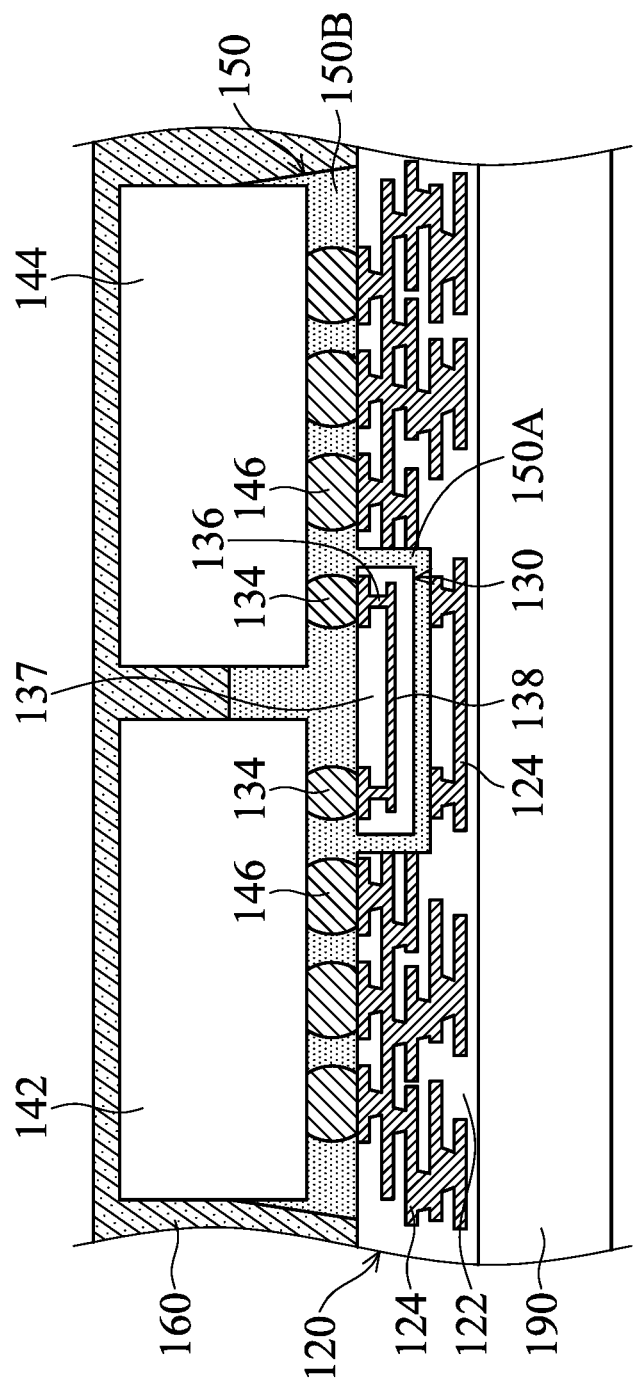

In FIG. 6F, the first semiconductor device 142 and the second semiconductor device 144 are provided on the conductive structures 134 and the conductive structures 146, in accordance with some embodiments of the present disclosure. In some embodiments, the connecting element 130 is exposed from the interposer substrate 120 when the first semiconductor device 142 and the second semiconductor device 144 are provided on the interposer substrate 120. In some embodiments, an underfill element 150B provided on the interposer substrate 120 and the underfill element 150A, and between the first semiconductor device 142 and the second semiconductor device 144. In some embodiments, the underfill element 150A and the underfill element 150B form the underfill layer 150. Therefore, the underfill layer 150 continuously extends between the interposer substrate 120, the connecting element 130, first semiconductor device 142, and the second semiconductor device 144. In some embodiments, the molding layer 160 is provided to cover and surround the first semiconductor device 142 and the second semiconductor device 144.

Figure 6G:
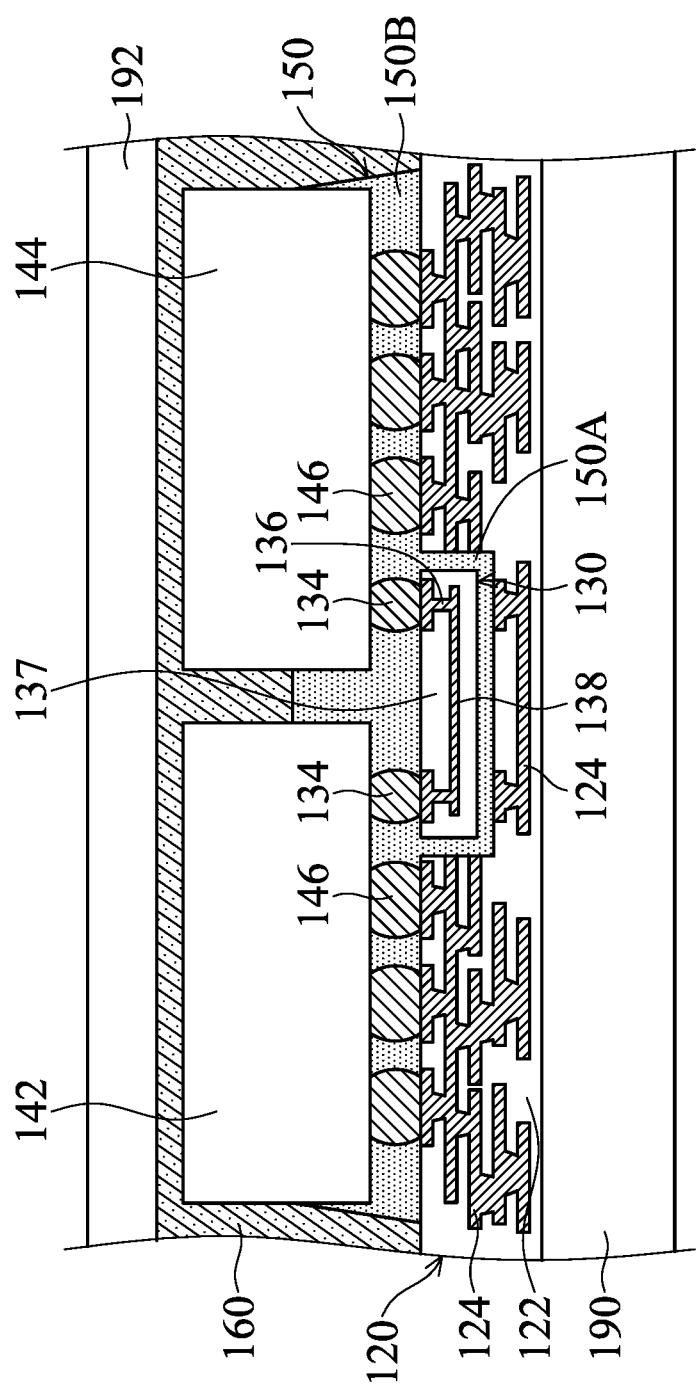
Figure 6H:
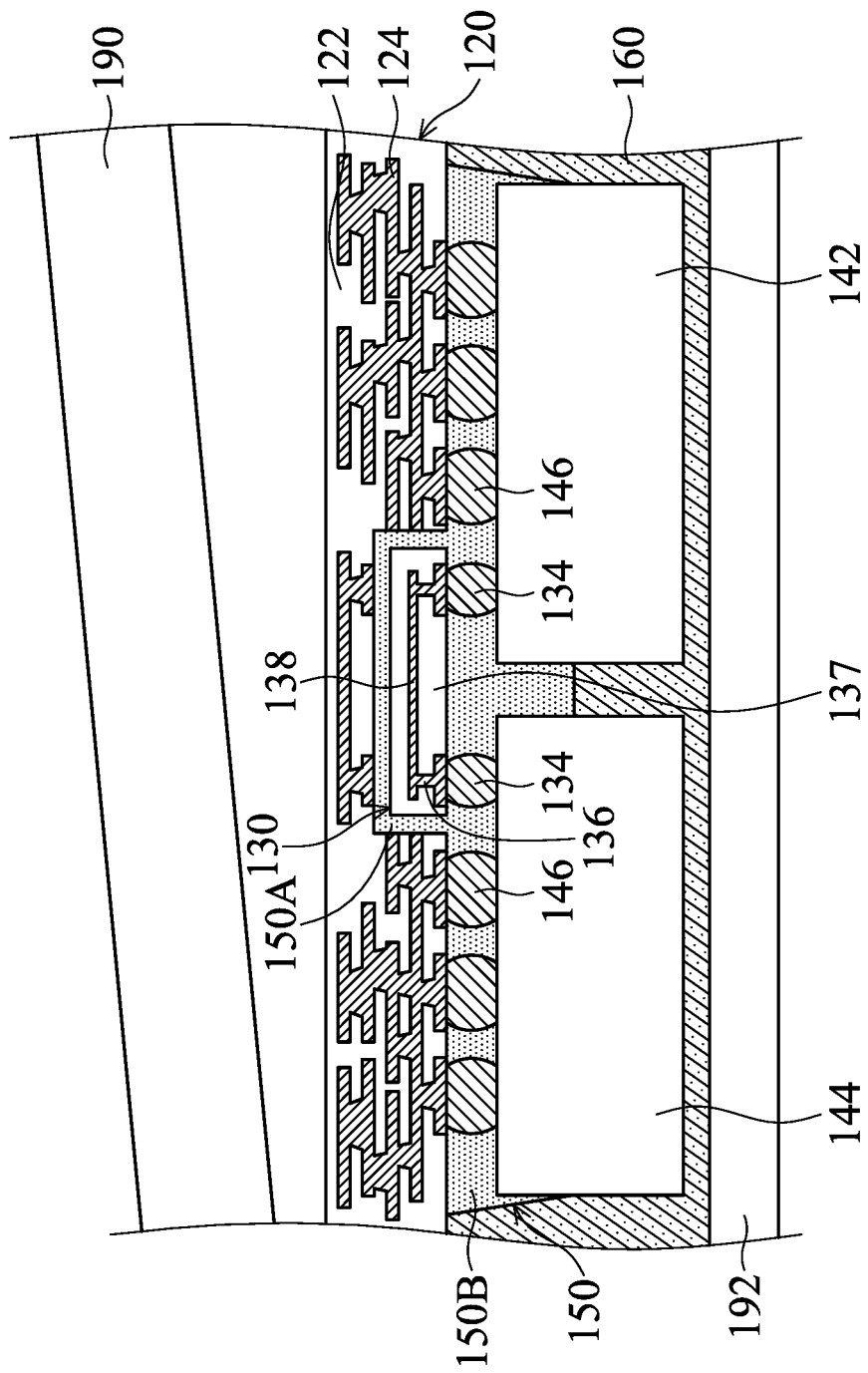

In FIG. 6G, a second carrier 192 is provided on the molding layer 160. In some embodiments, the first carrier 190 and the second carrier 192 are disposed on opposite sides of the interposer substrate 120. In some embodiments, a die attach film (DAF) is provided between the second carrier 192 and the molding layer 160 to attach the second carrier 192 onto the molding layer 160, in accordance with some embodiments of the present disclosure. In FIG. 6H, the whole structure is flipped, and the first carrier 190 is removed in some embodiments.

Figure 6I:
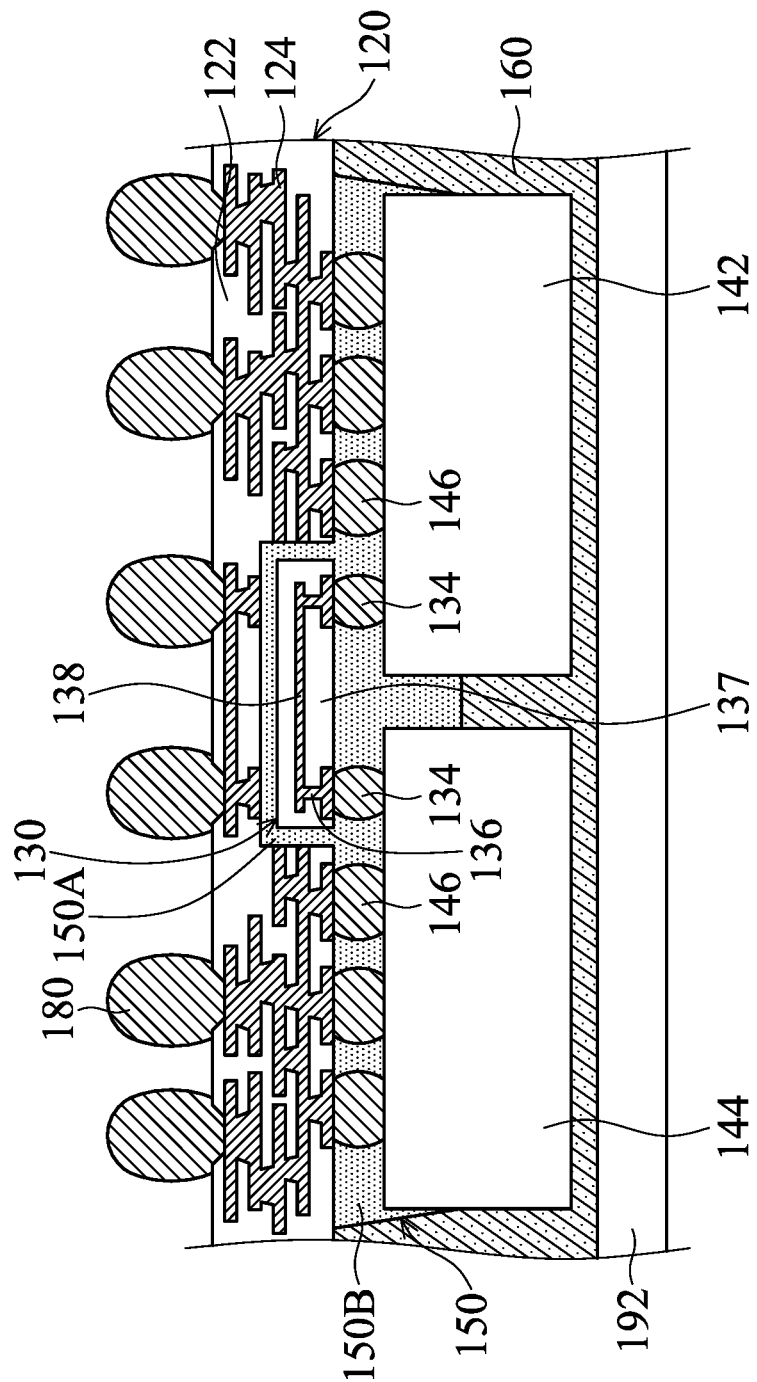

In FIG. 6I, holes are formed on the interposer substrate 120 (e.g. by etching) to expose the conductive features 124, and conductive structures 180 are formed on the interposer substrate 120 and partially formed in the holes of the interposer substrate 120 to in contact with the conductive features 124 in the interposer substrate 120, in accordance with some embodiments of the present disclosure.

Figure 6J:
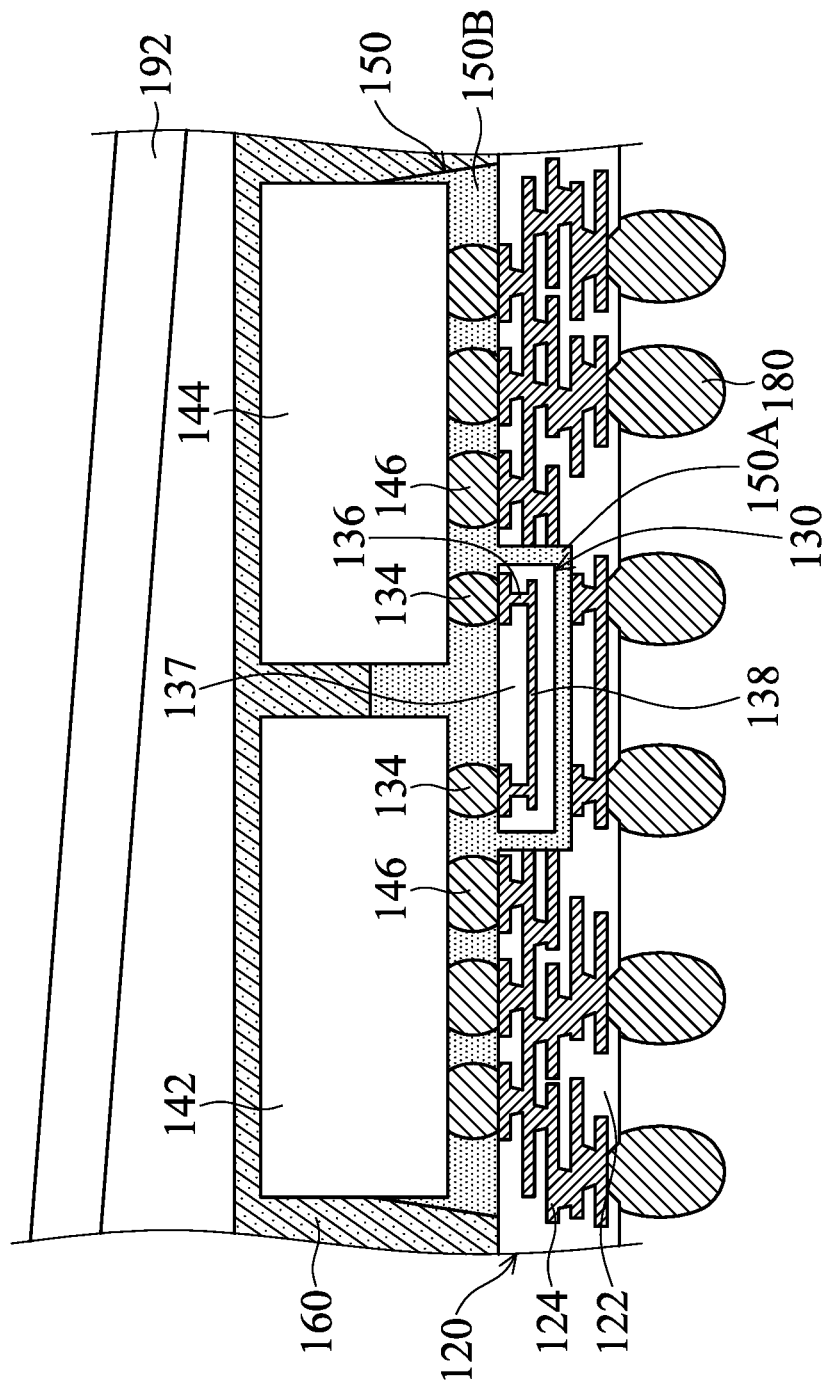
Figure 6K:
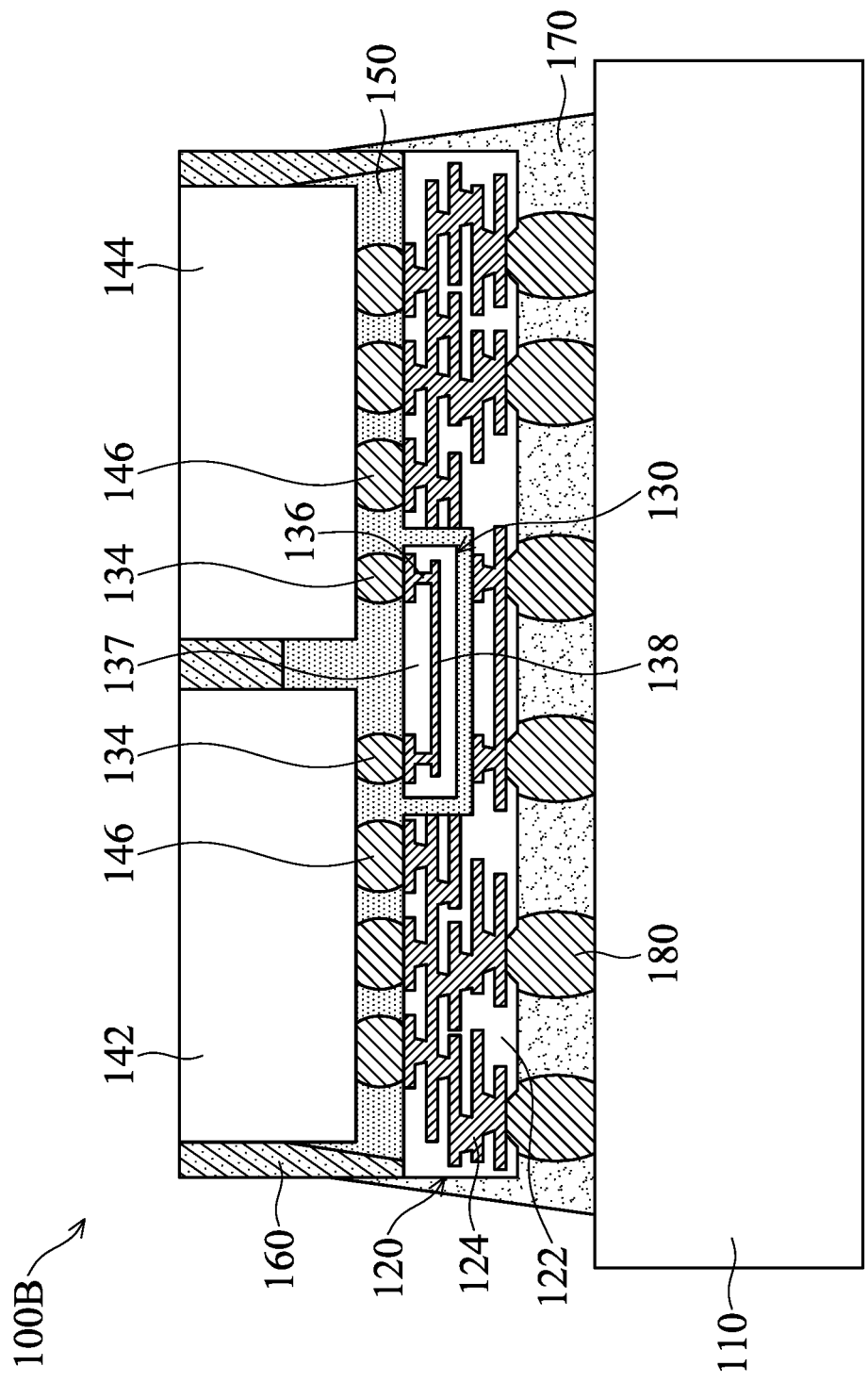

In FIG. 6J, the second carrier 192 is removed. In FIG. 6K, a dicing process is performed to let the molding layer 160 and the interposer substrate 120 have a straight sidewall, and then the carrier substrate 110 is connected to the interposer substrate 120 by the conductive structures 180, in accordance with some embodiments of the present disclosure. In some embodiments, the connecting element 130 and the conductive structures 180 are disposed on opposite sides of the interposer substrate 120. In some embodiments, the underfill layer 170 is provided to surround the conductive structures 180. In some embodiments, a portion of the molding layer 160 is removed to expose the top surface of the first semiconductor device 142 and/or the top surface of the second semiconductor device 144, such as by grinding in some embodiments of the present disclosure. Therefore, the semiconductor package structure 100B is formed, in accordance with some embodiments of the present disclosure.

Figure 7A:
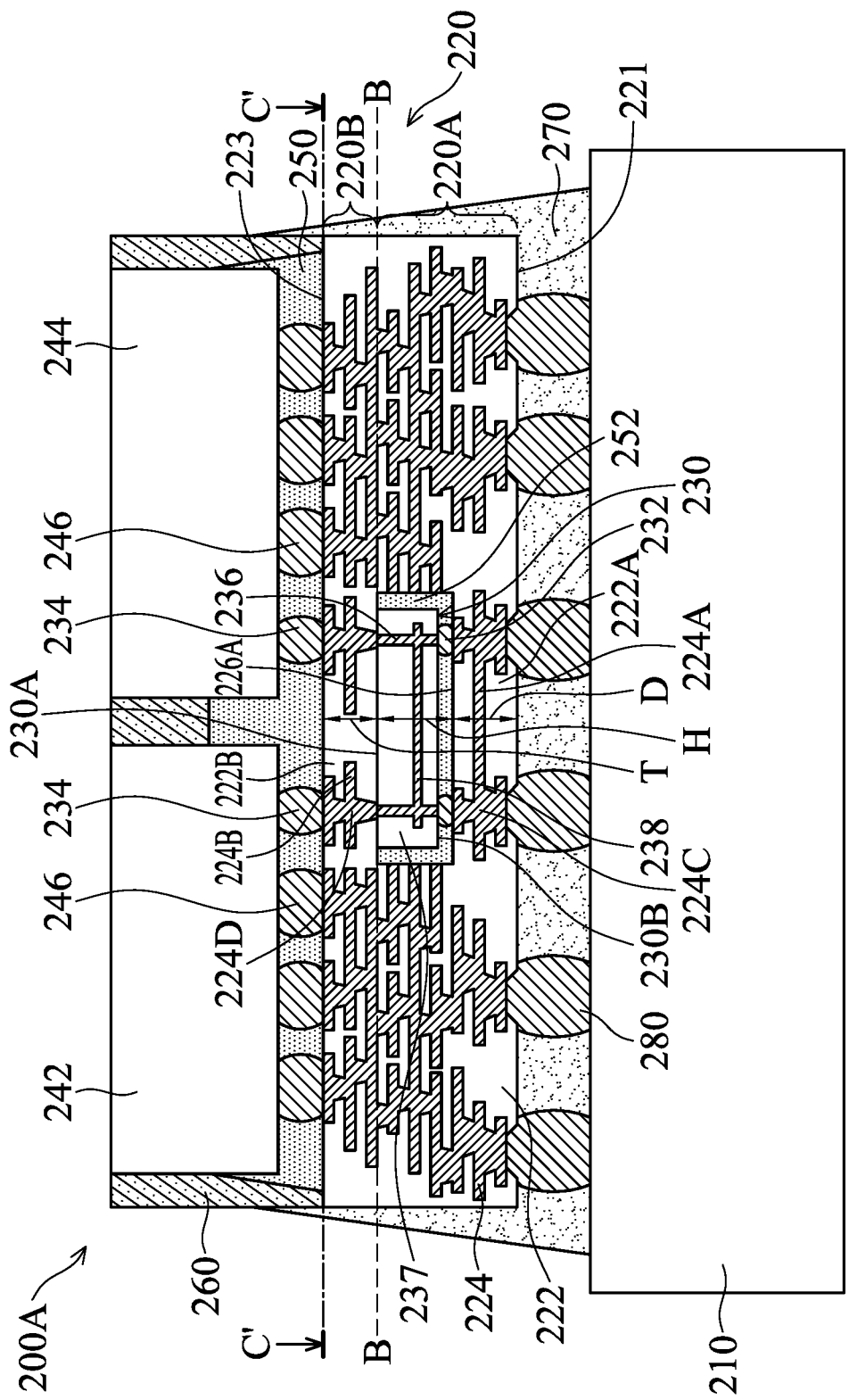
FIG. 7A is a schematic view of a semiconductor package structure, in accordance with some embodiments of the present disclosure.

FIG. 7A is a schematic view of a semiconductor package structure 200A, in accordance with some embodiments of the present disclosure. As shown in FIG. 7A, the semiconductor package structure 200A mainly includes a carrier substrate 210, an interposer substrate 220, a connecting element 230, a first semiconductor device 242, a second semiconductor device 244, an underfill layer 250, a molding layer 260, and an underfill layer 270, in accordance with some embodiments of the present disclosure.

In some embodiments, the carrier substrate 210 is a semiconductor substrate. By way of example, the material of the carrier substrate 210 may include elementary semiconductor such as silicon or germanium; a compound semiconductor such as silicon germanium, silicon carbide, gallium arsenic, gallium phosphide, indium phosphide or indium arsenide; or combinations thereof. Alternatively, the carrier substrate 210 may be a silicon-on-insulator (SOI) substrate, a germanium-on-insulator (GOI) substrate, or the like. In some other embodiments, the carrier substrate 210 is a printed circuit board (PCB), a ceramic substrate, or another suitable package substrate. The carrier substrate 210 may be a core or a core-less substrate, in accordance with some embodiments.

In some embodiments, the interposer substrate 220 is disposed on the carrier substrate 210, such as connected to the carrier substrate 210 by conductive structures 280. An underfill layer 270 is provided to surround and protect the conductive structures 280, in accordance with some embodiments of the present disclosure. For example, a sidewall of the molding layer 260 is in contact with the underfill layer 270, in accordance with some embodiments of the present disclosure. In some embodiments, the interposer substrate 220 includes a board 222 and conductive features 224. In some embodiments the board 222 has a first portion 222A and a second portion 222B disposed on opposite sides of the connecting element 230. In some embodiments, conductive features 224 have a first conductive feature 224A, a second conductive feature 224B, third conductive features 224C, and fourth conductive features 224D. In some embodiments, the first conductive feature 224A and the third conductive features 224C are in the first portion 222A, and the second conductive feature 224B and the fourth conductive feature 224D are in the second portion 222B. In some embodiments, the first conductive feature 224A and the second conductive feature 224B are wirings, and the third conductive features 224C and fourth conductive features 224D are vias.

The conductive features 224 may be made of or include copper, aluminum, cobalt, nickel, gold, silver, tungsten, one or more other suitable materials, or a combination thereof. The board 222 may be made of or include a polymer material, a ceramic material, a metal material, a semiconductor material, one or more other suitable materials, or a combination thereof. In the embodiments that the board 222 includes organic materials, the coefficient of thermal expansion (CTE) mismatch issue between the board 222 and other elements may be mitigated, which reduces the stress between the elements. For example, the board 222 includes resin, prepreg, glass, and/or ceramic. In cases where the board 222 is made of a metal material or a semiconductor material, dielectric layers may be formed between the board 222 and the conductive features 224 to prevent short circuiting. In some embodiments, the conductive features 224 include circuits with pitches between about 2 μm to about 20 μm. In some embodiments, the conductive features 224 include circuits with linewidths between about 1 μm to about 10 μm.

In some embodiments, the conductive structures 280 may include conductive pillars, solder bumps, one or more other suitable bonding structures, or a combination thereof. The conductive structures 280 are made of a solder material, such as Sn and Ag or another suitable conductive material (e.g., gold), in accordance with some embodiments. The conductive structures 280 are solder balls, in accordance with some embodiments. A reflow process (not shown) may be performed to make the metallurgical connections between the carrier substrate 210, the conductive structures 280, and the interposer substrate 220, in accordance with some embodiments of the present disclosure.

In some embodiments, the underfill layer 270 is dispensed (e.g., by a dispenser (not shown)) into the space between the interposer substrate 220 and the carrier substrate 210 and the space between adjacent conductive structures 280, and then cured (e.g., ultraviolet (UV) or thermally cured) to harden. The underfill layer 270 may be configured to provide a stronger mechanical connection and a heat bridge between the interposer substrate 220 and the carrier substrate 210, to reduce cracking in the conductive structures 280 caused by thermal expansion mismatches between the interposer substrate 220 and the carrier substrate 210, and to protect the joints from contaminants, thereby improving reliability of the fabricated semiconductor package structure 200A. In some embodiments, the underfill layer 270 includes liquid epoxy, deformable gel, silicon rubber, or the like.

In cases where the board 222 is made of or includes a polymer material, the board 222 may further include fillers that are dispersed in the polymer material. The polymer material may be made of or include epoxy-based resin, polyimide-based resin, one or more other suitable polymer materials, or a combination thereof. The examples of the fillers may include fibers (such as silica fibers and/or carbon-containing fibers), particles (such as silica particles and/or carbon-containing particles), or a combination thereof.

In some embodiments, an accommodating space is formed in the interposer substrate 220, and the connecting element 230 is disposed in the accommodating space of the interposer substrate 220. In some embodiments, a portion of the interposer substrate 220 extends between the connecting element 230 and the carrier substrate 210. In some embodiments, a portion of the interposer substrate 220 extends between the connecting element 230 and the first semiconductor device 242, and between the connecting element 230 and the second semiconductor device 244. In some embodiments, the first semiconductor device 242 and the second semiconductor device 244 are connected to the connecting element 230 through the fourth conductive features 224D and the conductive structures 234. Therefore, the first semiconductor device 242 is electrically connected to the second semiconductor device 244 through the connecting element 230. The connecting element 230 may be a silicon bridge, which enables direct fine pitch electrical connection through high density silicon interconnects of the connecting element 230, in accordance with some embodiments of the present disclosure.

In some embodiments, the first semiconductor device 242 or the second semiconductor device 244 may be a functional integrated circuit (IC) die such as a semiconductor die, an electronic die, a Micro-Electro Mechanical Systems (MEMS) die, or a combination thereof. The functional IC die may include one or more application processors, logic circuits, memory devices, power management integrated circuits, analog circuits, digital circuits, mixed signal circuits, one or more other suitable functional integrated circuits, or a combination thereof, depending on actual needs. In some alternative embodiments, the first semiconductor device 242 or the second semiconductor device 244 may be a package module that has one or more semiconductor dies and an interposer substrate carrying these semiconductor dies. These structures of the first semiconductor device 242 or the second semiconductor device 244 are well known in the art and therefore not described herein. The first semiconductor device 242 or the second semiconductor device 244 can be fabricated by various processes such as deposition, etching, implantation, photolithography, annealing, and/or other suitable processes.

In some embodiments, the connecting element 230 includes a passive device (such as a capacitor, a resistor, etc.), a transistor, a memory device, etc. disposed in a dielectric element 237 of the connecting element 230. In some embodiments, conductive structures 232 may be disposed below the connecting element 230, and disposed between the interposer substrate 220 and the connecting element 230. In some embodiments, conductive features 236 and conductive features 238 may be provided in the dielectric element 237 of the connecting element 230, such as embedded in the dielectric element 237. In some embodiments, a portion of the conductive features 236 is exposed from the dielectric element 237, such as in contact with the conductive structures 232 for electrical conduction. In some embodiments, the conductive features 236 may be through silicon vias (TSV) and vertically pass through the dielectric element 237 of the connecting element 230 to provide electrical connection in the vertical direction. For example, the connecting element 230 may be disposed between the first interposer element 220A and the second interposer element 220B in some embodiments. In some embodiments, the connecting element 230 has a first surface 230A facing away from the carrier substrate 210, and a second surface 230B facing away from the first surface 230A. In accordance with some embodiments, the conductive features 236 may extend across the first surface 230A and the second surface 230B, and in contact with the conductive structures 232 below the connecting element 230 and the conductive features 224 above the connecting element 230, such as the fourth conductive features 224D. Therefore, electrical signal may be transported vertically from the first semiconductor device 242 or the second semiconductor device 244 through the conductive structures 234 and the conductive features 224 above the connecting element 230, the conductive features 236 in the connecting element 230, and the conductive structures 232 under the connecting element 230 to the interposer substrate 220, in accordance with some embodiments of the present disclosure. As a result, electrical signal can be transmitted to the first semiconductor device 242 or the second semiconductor device 244 in a shorter path, in accordance with some embodiments of the present disclosure.

In some embodiments, the material of the conductive features 236 may include metal, such as Cu, Al, W, or another suitable conductive material. In some embodiments, the dielectric element 237 includes dielectric materials, such as silicon or another suitable dielectric material. In some embodiments, the material of the conductive features 238 may include metal, such as Cu, Al, W, or another suitable conductive material. In some embodiments, the conductive features 238 include circuits with pitches between about 0.8 μm and about 2 μm. In some embodiments, the conductive features 238 include circuits with linewidths between about 0.4 μm and about 1 μm.

In some embodiments, the conductive features 238 may be a redistribution layer to connect the conductive features 236, so that the first semiconductor device 242 may be electrically connected to the second semiconductor device 244 through the conductive features 236 and the conductive features 238. Therefore, the signal transport speed of the semiconductor package structure 200A may be increased by the connecting element 230, in accordance with some embodiments of the present disclosure. Moreover, using the connecting element 230 for signal transmission reduces the number of required through silicon vias (TSVs), which reduces overall cost and preserves low resistance for high frequency signals, in accordance with some embodiments of the present disclosure.

In some embodiments, as shown in FIG. 7A, the interposer substrate 220 includes a first interposer element 220A and a second interposer element 220B, and the interface between the first interposer element 220A and the second interposer element 220B is indicated by the line B-B. In some embodiments, the interposer substrate 220 further includes a bottom surface 221 and a top surface 223. In some embodiments, the bottom surface 221 faces the carrier substrate 210, and the top surface 223 faces the first semiconductor device 242 and the second semiconductor device 244. In some embodiments, the accommodating space has a bottom surface 226A. In some embodiments, a distance D is between the bottom surface 221 of the interposer substrate 220 and the bottom surface 226A of the accommodating space, a height H of the accommodating space in the interposer substrate 220 is greater than the distance D, and greater than a thickness T of the second interposer element 220B. In some embodiments, the distance D and the thickness T are substantially identical. In some embodiments, the height H is greater than the distance D or the thickness T. For example, in some embodiments, a ratio of T:H:D is between 1:5:1 and 2:3:2. Therefore, in some embodiments, a ratio between the height H of the accommodating space and a sum of the distance D and the thickness T of the second portion is between 0.75 and 2.5. Therefore, enough space is provided for the connecting element 230, so that the connecting element 230 can provide better electrical connection for the first semiconductor device 242 and the second semiconductor device 244, in accordance with some embodiments of the present disclosure.

Moreover, the conductive features 224 are provided with the first conductive feature 224A and the third conductive features 224C below the connecting element 230, and the second conductive feature 224B and the fourth conductive features 224D above the connecting element 230, which means the connecting element 230 is between the first conductive feature 224A and the second conductive feature 224B in a vertical direction, so the routability of the interposer substrate 220 can be maintained, in accordance with some embodiments of the present disclosure. In some embodiments, the connecting element 230 is sandwiched between the first portion 222A and the second portion 222B of the board 222, so the mechanical strength of the interposer substrate 220 can be maintained when the connecting element 230 is provide in the space of the interposer substrate 220. For example, the portions of the interposer substrate 220 above and below the connecting element 230 prevent imbalance thermal expansion, in accordance with some embodiments of the present disclosure. Moreover, more conductive structures 280 may be provided on the interposer substrate 220, such as may be provided on the portion of the interposer substrate 220 under the recess, in accordance with some embodiments of the present disclosure. In some embodiments, the connecting element 230 is thinner than the interposer substrate 220 to achieve miniaturization.

In some embodiments, the conductive structures 232 may include conductive pillars, solder bumps, one or more other suitable bonding structures, or a combination thereof. The conductive structures 232 are made of a solder material, such as Sn and Ag or another suitable conductive material (e.g., gold), in accordance with some embodiments. The conductive structures 232 are solder balls, in accordance with some embodiments. A reflow process (not shown) may be performed to make the metallurgical connections between the interposer substrate 220 and the connecting element 230, in accordance with some embodiments of the present disclosure.

In some embodiments, the first semiconductor device 242 and the second semiconductor device 244 are bonded onto the conductive structures 234 and the conductive structures 246. The conductive structures 234 and the conductive structures 246 may include conductive pillars, solder bumps, one or more other suitable bonding structures, or a combination thereof, in accordance with some embodiments of the present disclosure. The conductive structures 234 and the conductive structures 246 are made of a solder material, such as Sn and Ag or another suitable conductive material (e.g., gold), in accordance with some embodiments of the present disclosure. The conductive structures 234 and the conductive structures 246 are solder balls, in accordance with some embodiments. A reflow process (not shown) may be performed to make the metallurgical connections between the interposer substrate 220, the first semiconductor device 242, the second semiconductor device 244, the conductive structures 234, and the conductive structures 246, in accordance with some embodiments of the present disclosure.

In some embodiments, an underfill layer 250 is dispensed (e.g., by a dispenser (not shown)) into the space between the interposer substrate 220, the first semiconductor device 242, and the second semiconductor device 244, and then cured (e.g., ultraviolet (UV) or thermally cured) to harden. In some embodiments, the underfill layer 250 is separated from the connecting element 230 by the interposer substrate 220. The underfill layer 250 may be configured to provide a stronger mechanical connection and a heat bridge between the interposer substrate 220, the first semiconductor device 242, and the second semiconductor device 244 to reduce cracking in the conductive structures 234 and the conductive structures 246 caused by thermal expansion mismatches between the interposer substrate 220, the first semiconductor device 242, and the second semiconductor device 244, and to protect the joints from contaminants, thereby improving reliability of the fabricated semiconductor package structure 200A, in accordance with some embodiments of the present disclosure. In some embodiments, the underfill layer 250 includes liquid epoxy, deformable gel, silicon rubber, or the like. In some embodiments, an underfill element 252 is filled in the accommodating space of the interposer substrate 220, and may be in contact with the connecting element 230 and the conductive structures 232. The material and the forming process of the underfill element 252 may be similar to that of the underfill layer 250, and is not repeated. In some embodiments, the underfill layer 250 is separated from the underfill element 252 by the interposer substrate 220.

In some embodiments, a molding layer 260 fills gaps between the first semiconductor device 242 and the second semiconductor device 244, in accordance with some embodiments. The molding layer 260 in the gaps surrounds the first semiconductor device 242 and the second semiconductor device 244, in accordance with some embodiments. The molding layer 260 may be configured to provide package stiffness, a protective or hermetic shielding, and/or provide a heat conductive path to prevent chip overheating, in accordance with some embodiments of the present disclosure. The molding layer 260 may be formed by a spin-on coating process, an injection molding process, or the like, in accordance with some embodiments of the present disclosure.

The molding layer 260 includes a polymer material, in accordance with some embodiments. The term "polymer" here can represent thermosetting polymers, thermoplastic polymers, or any mixtures thereof, in accordance with some embodiments. The polymer material can include, for example, plastic materials, epoxy resin, polyimide, polyethylene terephthalate (PET), polyvinyl chloride (PVC), polymethylmethacrylate (PMMA), polymer components doped with specific fillers including fiber, clay, ceramic, inorganic particles, or any combinations thereof. In other embodiments, the molding layer 260 can be made of epoxy resin, such as epoxy cresol novolac (ECN), biphenyl epoxy resin, multifunctional liquid epoxy resin, or any combinations thereof, in accordance with some embodiments. In still other embodiments, the molding layer 260 can be made of epoxy resin optionally including one or more fillers to provide the composition with any of a variety of desirable properties. Examples of fillers can be aluminum, titanium dioxide, carbon black, calcium carbonate, silica, or any combinations thereof, in accordance with some embodiments. A thermal process is performed on the molding layer 260 to cure the molding layer 260, in accordance with some embodiments of the present disclosure.

Figure 7B:
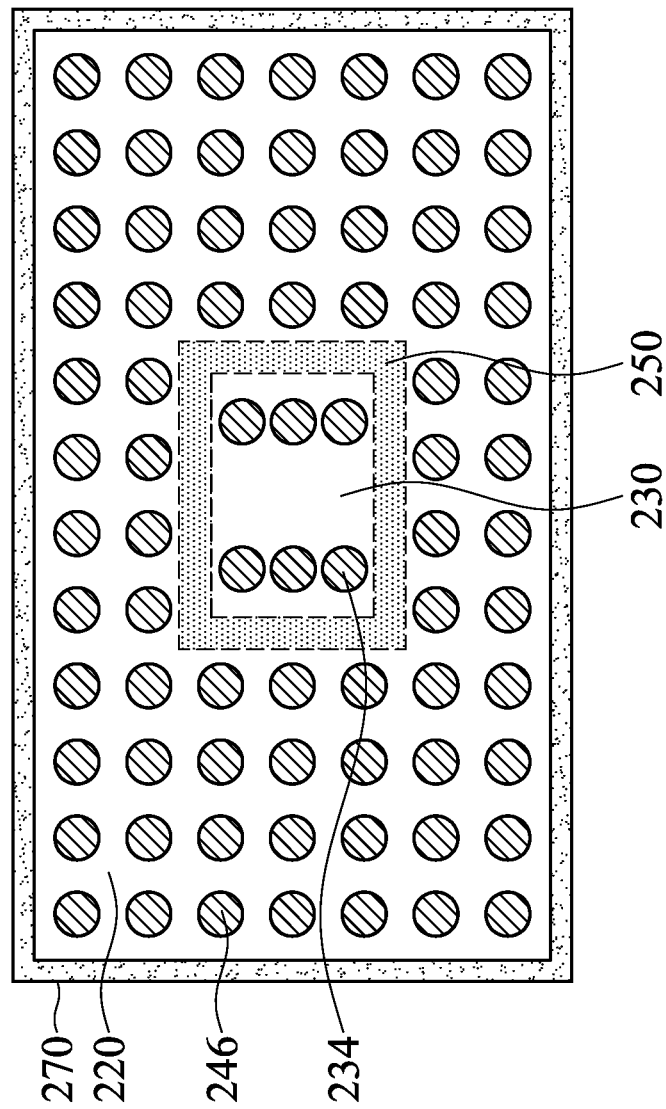
FIG. 7B is a top view illustrated along line C'-C' in FIG. 7A, in accordance with some embodiments of the present disclosure.

In some embodiments, the connecting element 230 and the interposer substrate 220 are separated by the underfill layer 250. For example, FIG. 7B is a top view illustrated along line C'-C' in FIG. 7A, in accordance with some embodiments of the present disclosure. In some embodiments, the connecting element 230 is surrounded by the interposer substrate 220, and the underfill element 252 fills the gap between the connecting element 230 and the interposer substrate 220 in the accommodating space. In some embodiments, the connecting structures 234 overlap the connecting element 230, and the connecting structures 246 overlap the interposer substrate 220. In other words, the conductive structures 246 are separated from the connecting element 230 in the top view, in accordance with some embodiments of the present disclosure.

Figure 7C:
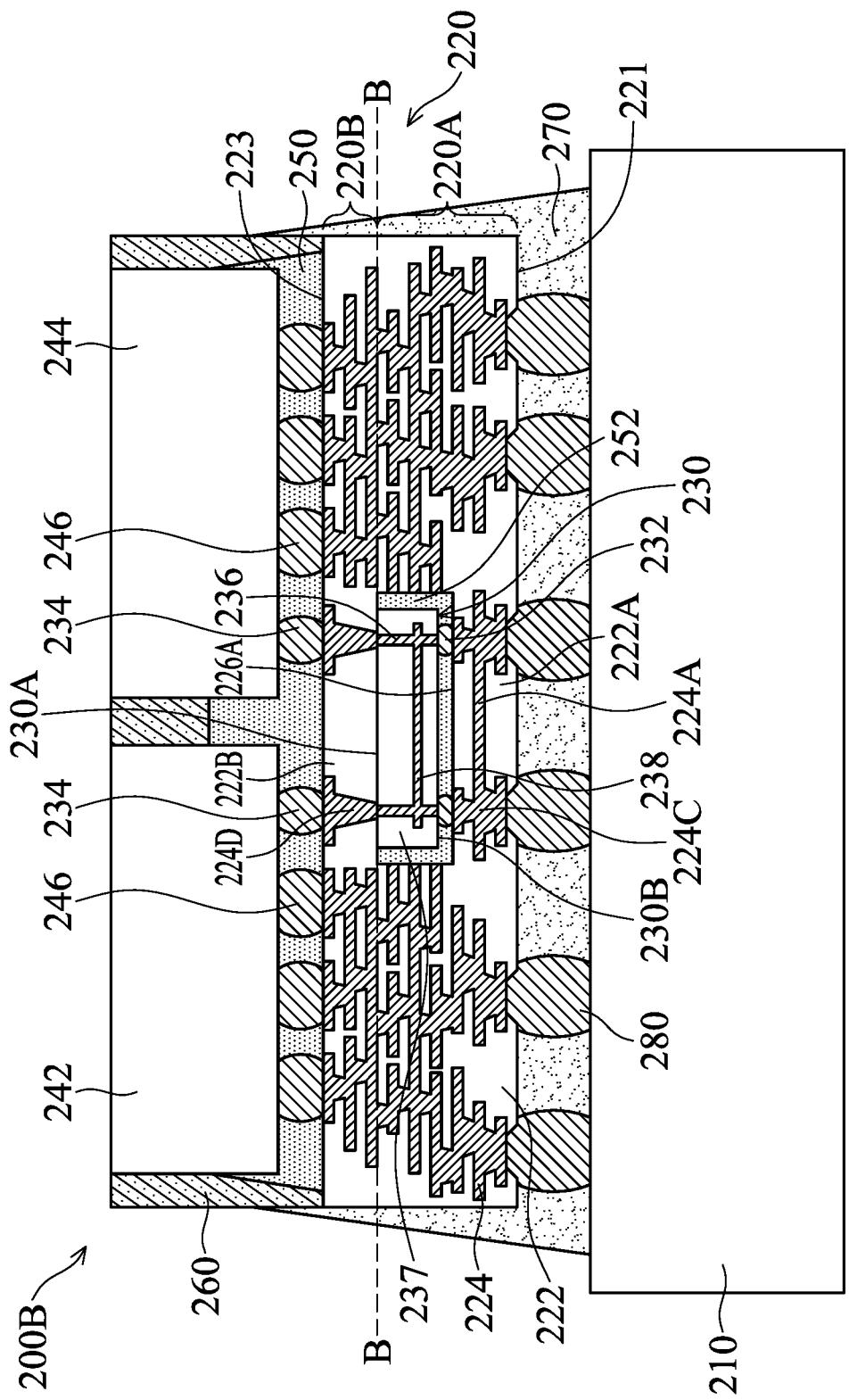
FIG. 7C is a schematic view of a semiconductor package structure, in accordance with some embodiments of the present disclosure.

FIG. 7C is a schematic view of a semiconductor package structure 200B, in accordance with some embodiments of the present disclosure. Elements in the semiconductor package structure 200B that are similar to the elements in the semiconductor package structure 200A are not described again. As shown in FIG. 7C, the second conductive feature 224B (e.g. wirings) above the connecting element 230 in FIG. 7A may be omitted, and the fourth conductive features 224D (e.g. vias) may be remained.

Figure 7D:
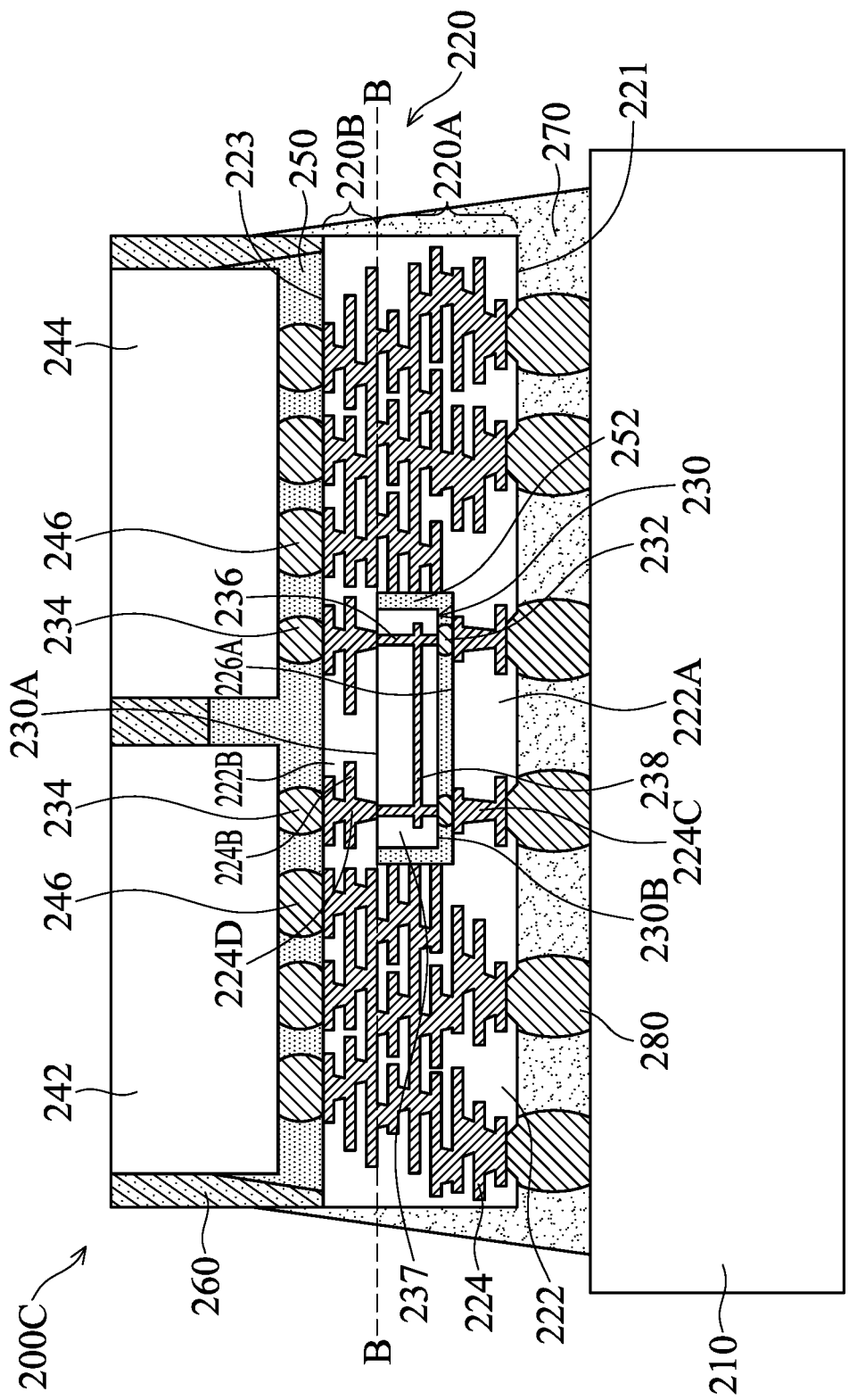
FIG. 7D is a schematic view of a semiconductor package structure, in accordance with some embodiments of the present disclosure.

FIG. 7D is a schematic view of a semiconductor package structure 200C, in accordance with some embodiments of the present disclosure. Elements in the semiconductor package structure 200C that are similar to the elements in the semiconductor package structure 200A are not described again. As shown in FIG. 7D, the first conductive feature 224A (e.g. wirings) above the connecting element 230 in FIG. 7A may be omitted, and the third conductive features 224C (e.g. vias) may be remained.

Figure 8A:
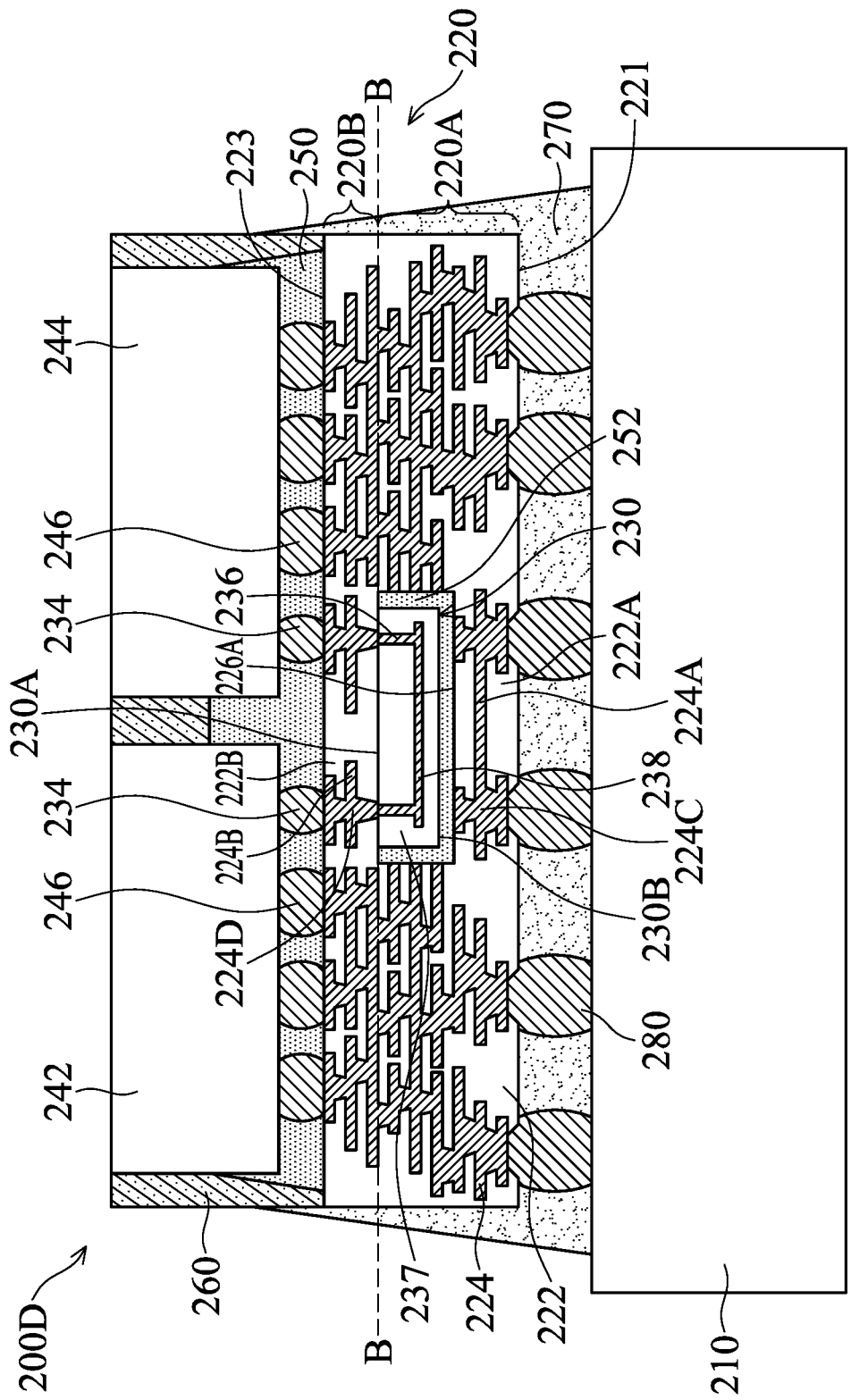
FIG. 8A is a schematic view of a semiconductor package structure, in accordance with some embodiments of the present disclosure.

In some embodiments, the conductive structure 232 may be omitted. FIG. 8A is a schematic view of a semiconductor package structure 200D, in accordance with some embodiments of the present disclosure. In some embodiments, the connecting element 230 is separated from the first interposer element 220A of the interposer substrate 220, and the underfill element 252 fills the space between the interposer substrate 220 and the connecting element 230. Therefore, the connecting element 230 is not directly electrically connected to the first interposer element 220A. Since in the semiconductor package structure 200D, no conductive structure is provided between the interposer substrate 220 and the connecting element 230 in the recess of the interposer substrate 220, the process steps and costs may be reduced, in accordance with some embodiments of the present disclosure.

Figure 8B:
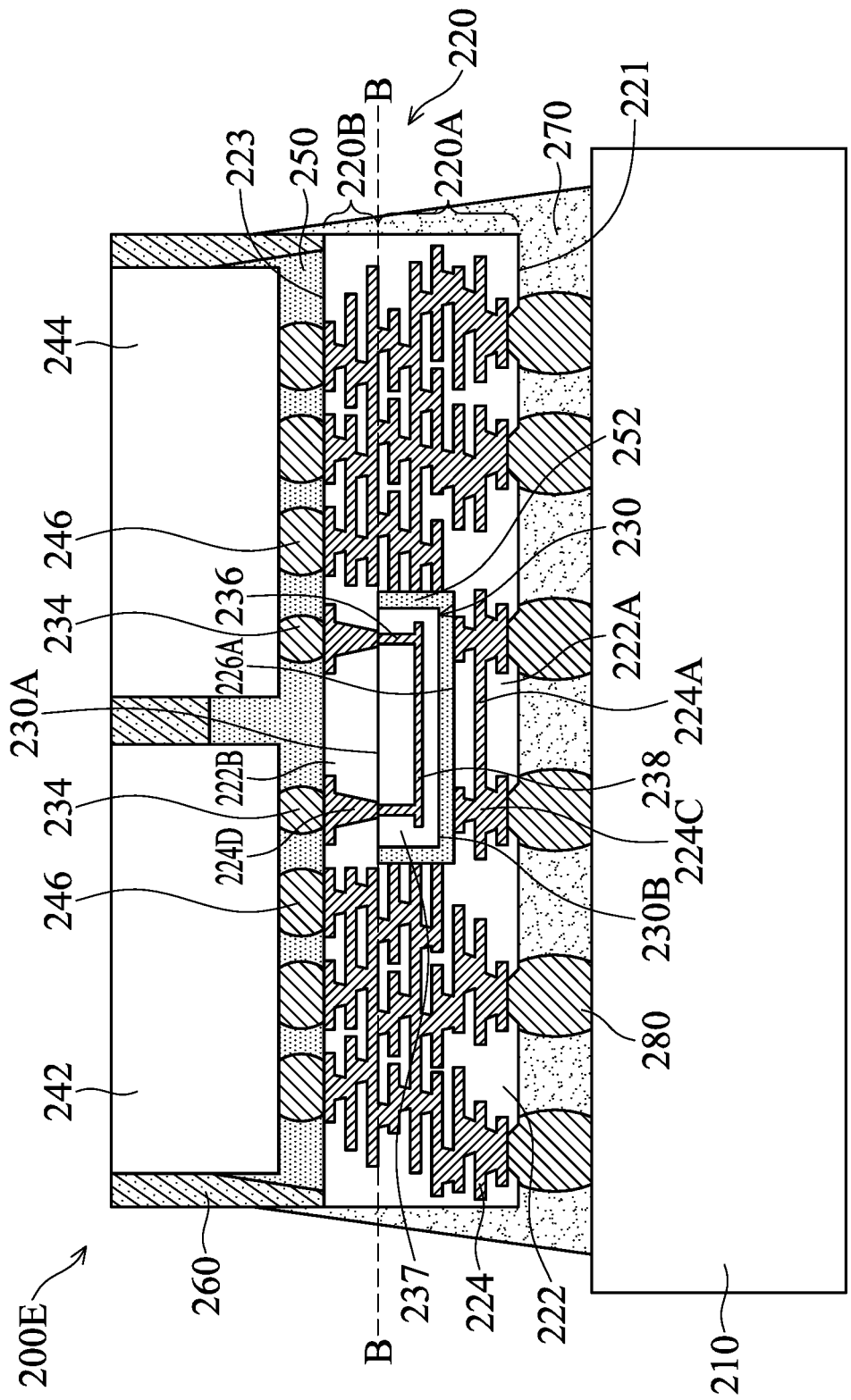
FIG. 8B is a schematic view of a semiconductor package structure, in accordance with some embodiments of the present disclosure.

FIG. 8B is a schematic view of a semiconductor package structure 200E, in accordance with some embodiments of the present disclosure. Elements in the semiconductor package structure 200E that are similar to the elements in the semiconductor package structure 200D are not described again. As shown in FIG. 8B, the second conductive feature 224B (e.g. wirings) above the connecting element 230 in FIG. 8A may be omitted, and the fourth conductive features 224D (e.g. vias) may be remained.

Figure 8C:
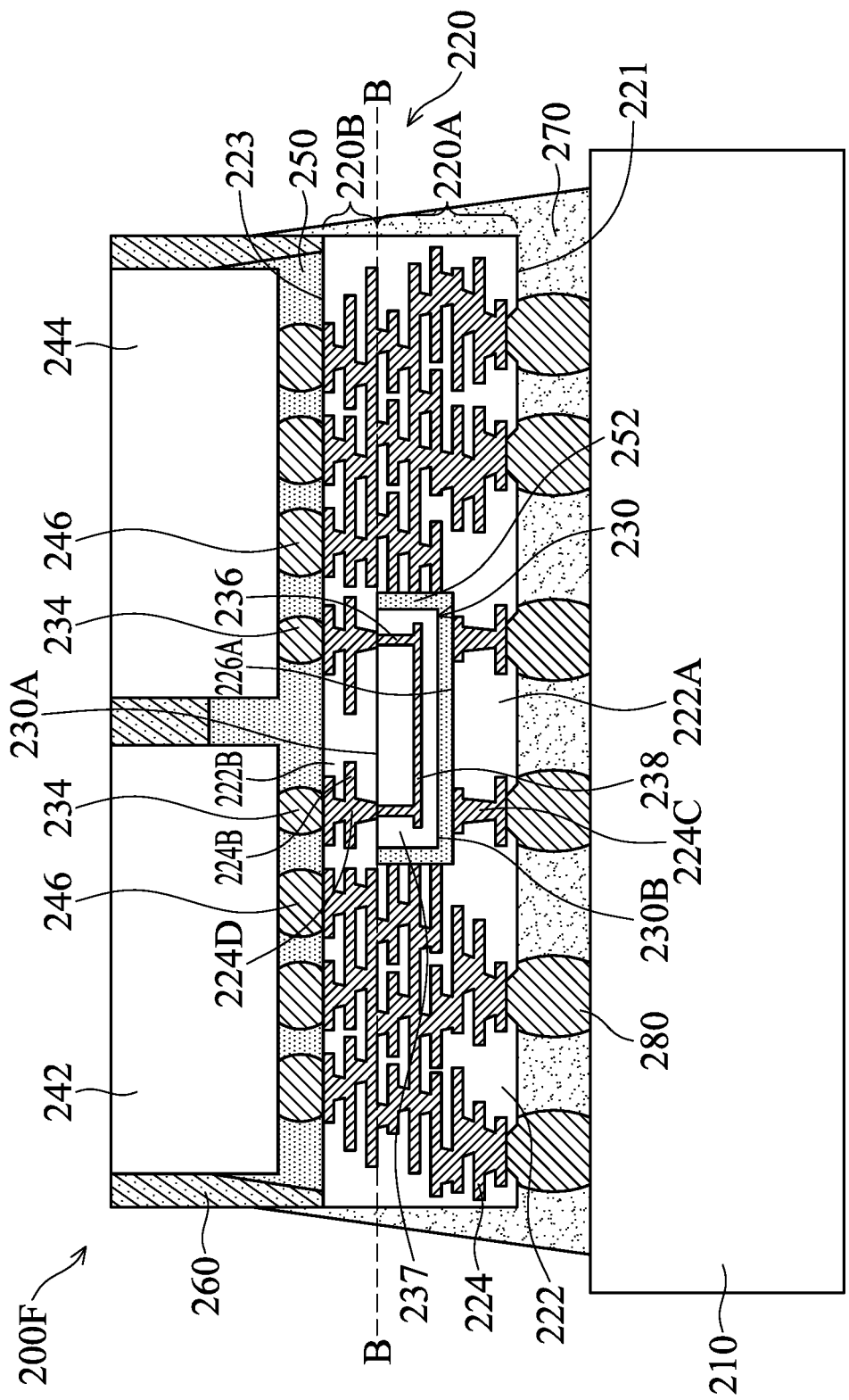
FIG. 8C is a schematic view of a semiconductor package structure, in accordance with some embodiments of the present disclosure.

FIG. 8C is a schematic view of a semiconductor package structure 200F, in accordance with some embodiments of the present disclosure. Elements in the semiconductor package structure 200F that are similar to the elements in the semiconductor package structure 200D are not described again. As shown in FIG. 8C, the first conductive feature 224A (e.g. wirings) above the connecting element 230 in FIG. 8A may be omitted, and the third conductive features 224C (e.g. vias) may be remained.

Figure 8D:
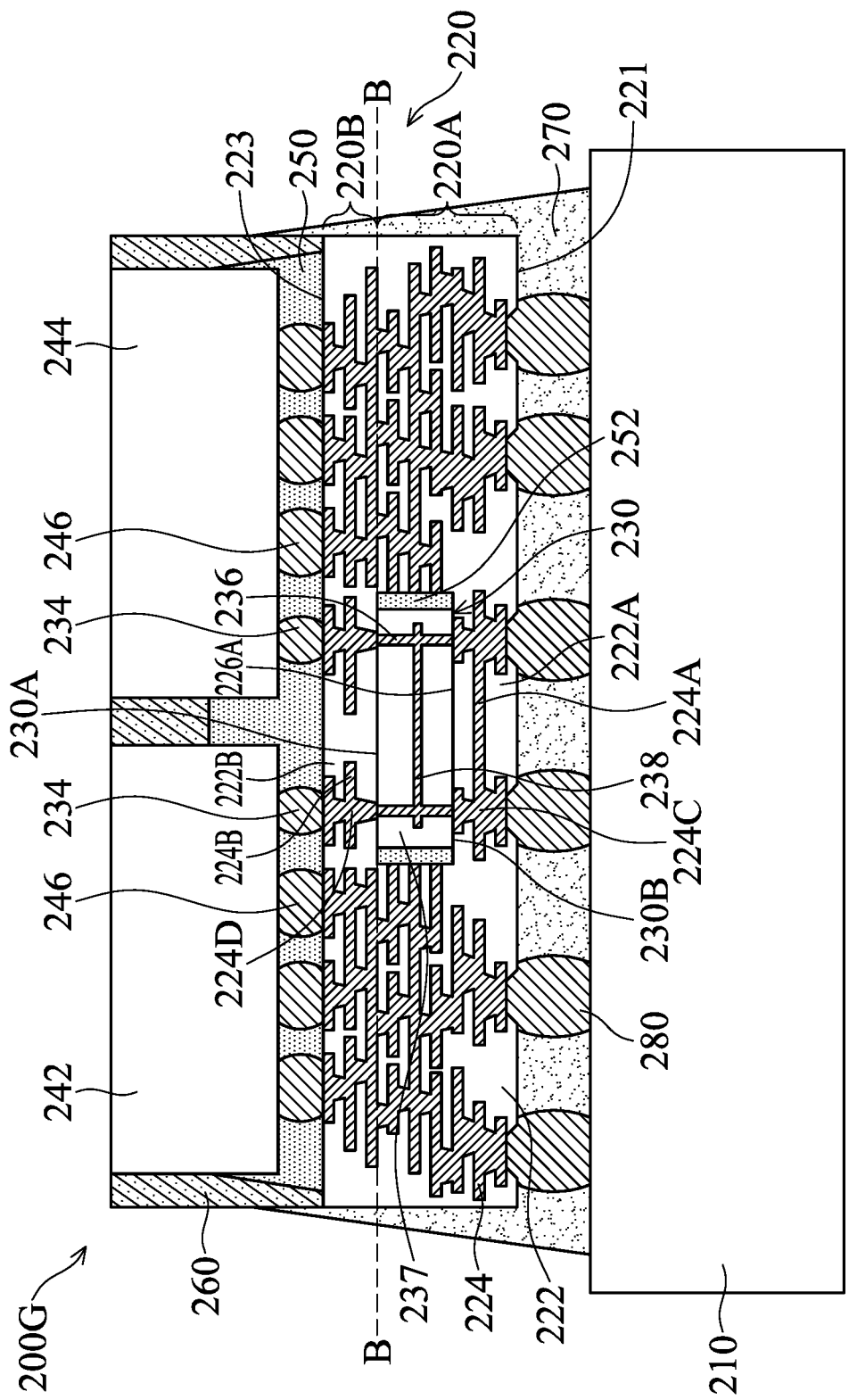
FIG. 8D is a schematic view of a semiconductor package structure, in accordance with some embodiments of the present disclosure.

FIG. 8D is a schematic view of a semiconductor package structure 200G, in accordance with some embodiments of the present disclosure. In FIG. 8D, the connecting element 230 is in direct contact with the first interposer element 220A of the interposer substrate 220, in accordance with some embodiments of the present disclosure. In some embodiments, the conductive features 236 are in direct contact with the third conductive features 224C in the first interposer element 220A to allow vertical electrical connection. Therefore, the path for signal transmission path may be reduced.

Figure 9:
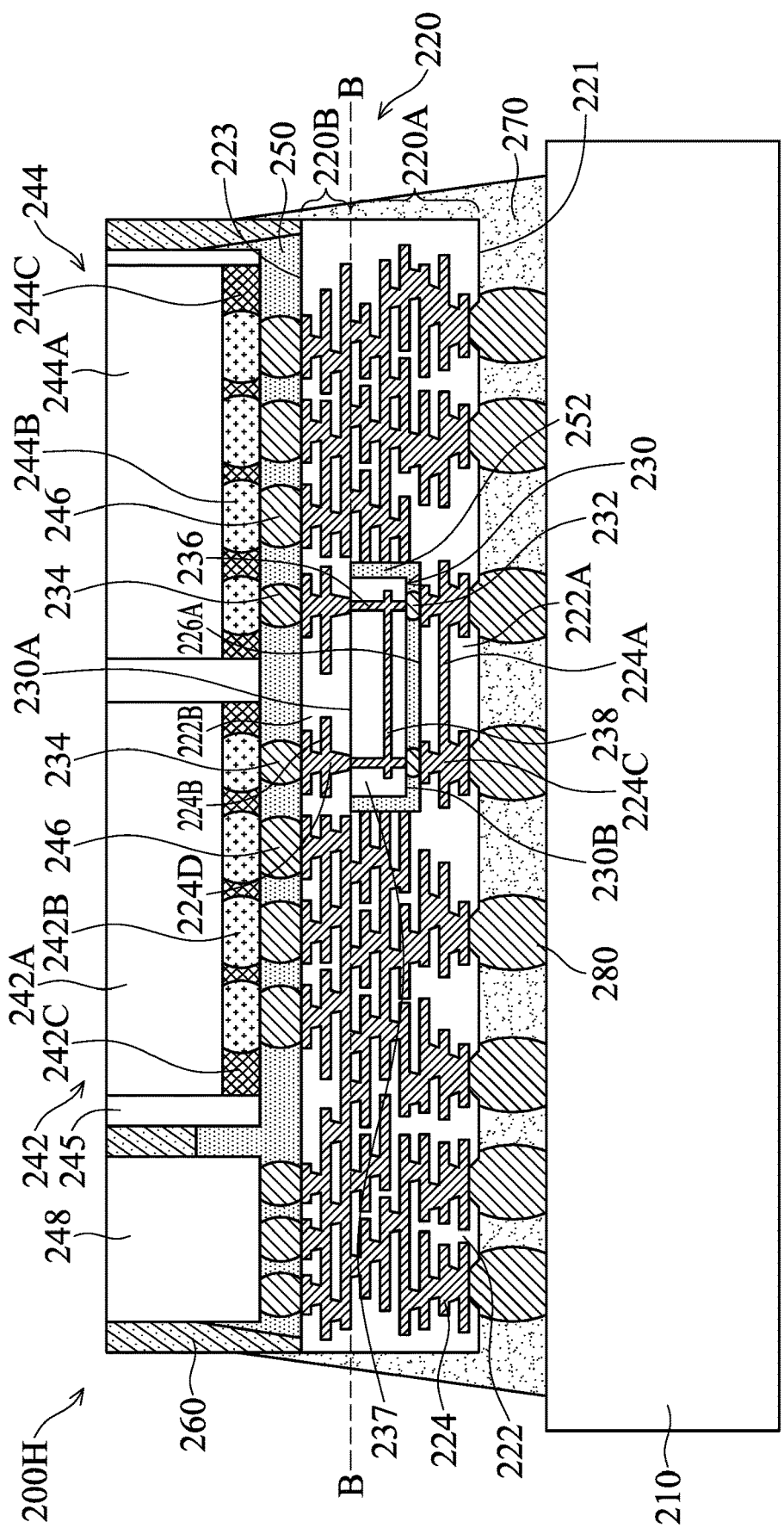
FIG. 9 is a schematic view of a semiconductor package structure, in accordance with some embodiments of the present disclosure.

FIG. 9 is a schematic view of a semiconductor package structure 200H, in accordance with some embodiments of the present disclosure. In the semiconductor package structure 200H, the first semiconductor device 242 and the second semiconductor device 244 may be chip packages. For example, the first semiconductor device 242 includes a chip 242A, conductive structures 242B under the chip 242A, and an underfill layer 242C under the chip 242A and surrounding the conductive structures 242B, in accordance with some embodiments of the present disclosure. The second semiconductor device 244 includes a chip 244A, conductive structures 244B under the chip 244A, and an underfill layer 244C under the chip 244A and surrounding the conductive structures 244B, in accordance with some embodiments of the present disclosure. A molding structure 245 is provided to continuously surround the first semiconductor device 242 and the second semiconductor device 244, in accordance with some embodiments of the present disclosure. In some embodiments, a third semiconductor device 248 is provided in the semiconductor package structure 200H. In some embodiments, the third semiconductor device 248 is connected to the interposer substrate 220, and is surrounded by the underfill layer 250 and the molding layer 260. In some embodiments, the chip 242A, the chip 244A, and the third semiconductor device 248 have different heights or functions. For example, the heights the conductive structures 242B and conductive structures 244B are adjustable for chips with different heights.

Figure 10:
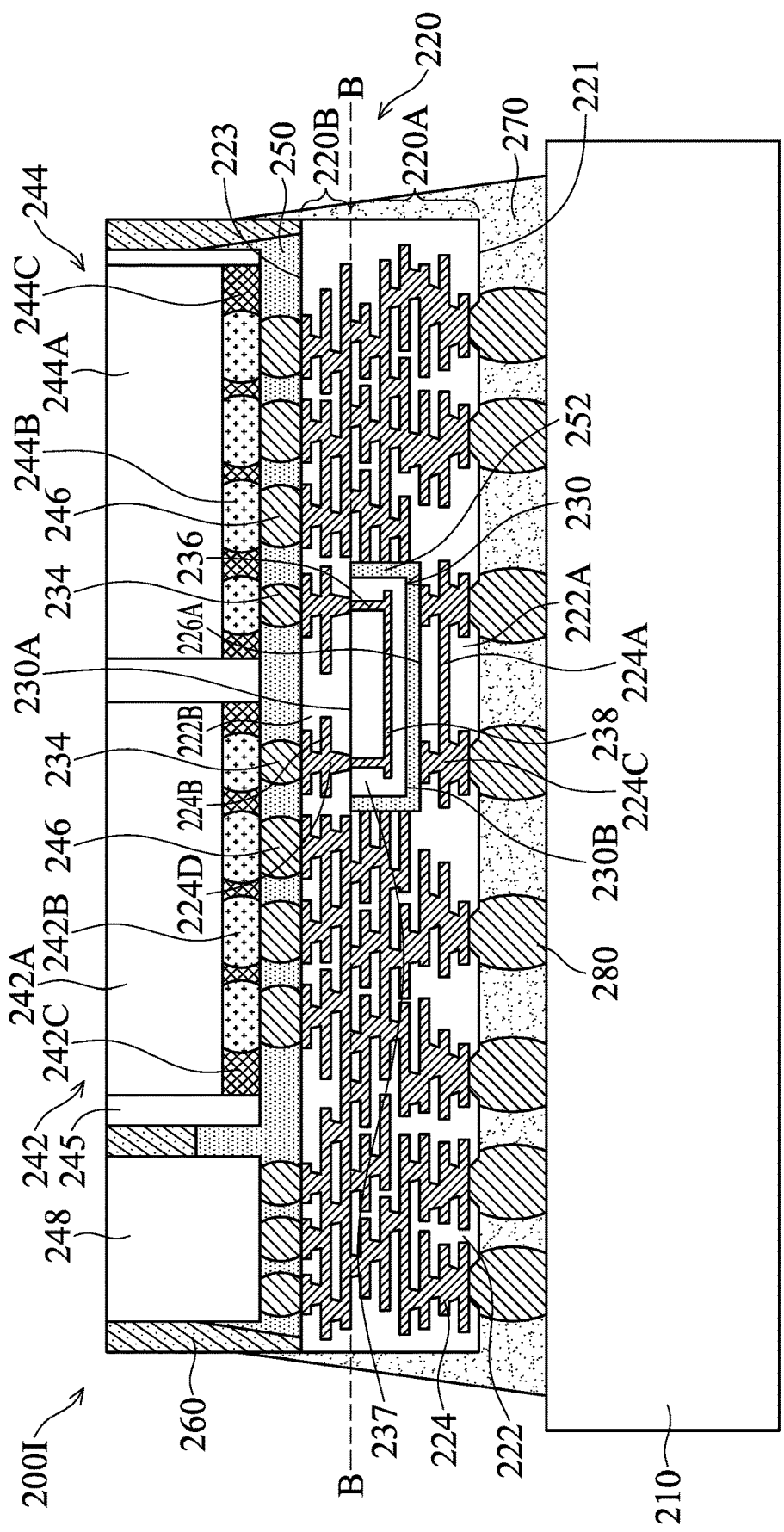
FIG. 10 is a schematic view of a semiconductor package structure, in accordance with some embodiments of the present disclosure.

In accordance with some embodiments of the present disclosure, FIG. 10 is schematic views of a semiconductor package structure 200I. Elements in the semiconductor package structure 200I that are similar to the elements in the semiconductor package structure 200H are not described again. As shown in FIG. 10, the conductive structure 232 may be omitted, and the connecting element 230 is not directly electrically connected to the interposer substrate 220 through the third conductive features 224C under the connecting element 230, in accordance with some embodiments of the present disclosure.

Figure 11A:
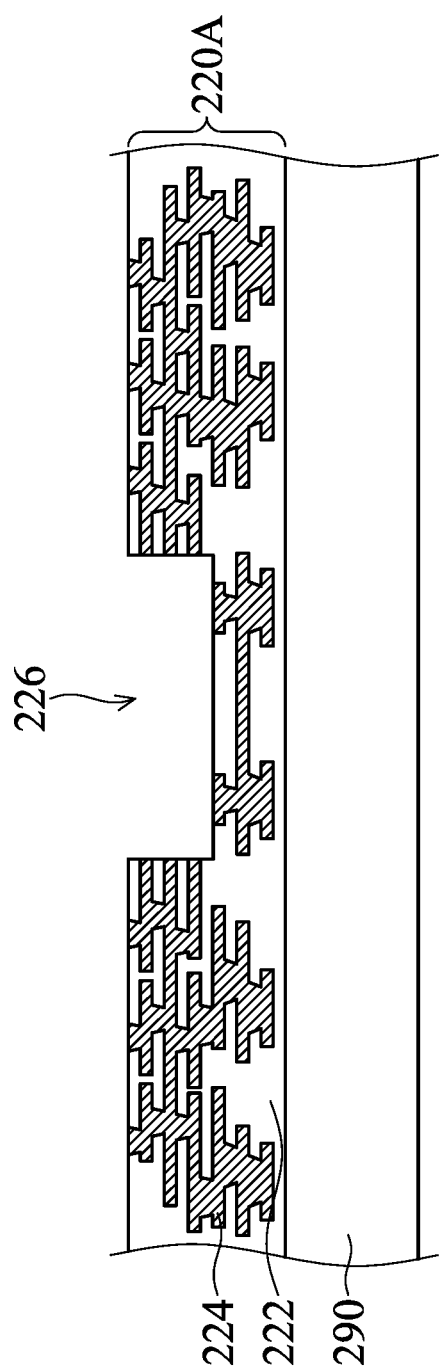
FIG. 11A to FIG. 11L show a process flow of forming the semiconductor package structure, in accordance with some embodiments of the present disclosure.

FIG. 11A to FIG. 11L show a process flow of forming the semiconductor package structure 200A, in accordance with some embodiments of the present disclosure. In FIG. 11A, the first interposer element 220A is provide on a first carrier 290, in accordance with some embodiments of the present disclosure. In some embodiments, the interposer substrate 220 includes a recess 226. In some embodiments, conductive features 224 are disposed in the portion of the first interposer element 220A under the recess 226. In some embodiments, a die attach film (DAF) is provided between the first carrier 290 and the first interposer element 220A to attach the first carrier 290 onto the first interposer element 220A, in accordance with some embodiments of the present disclosure.

Figure 11B:
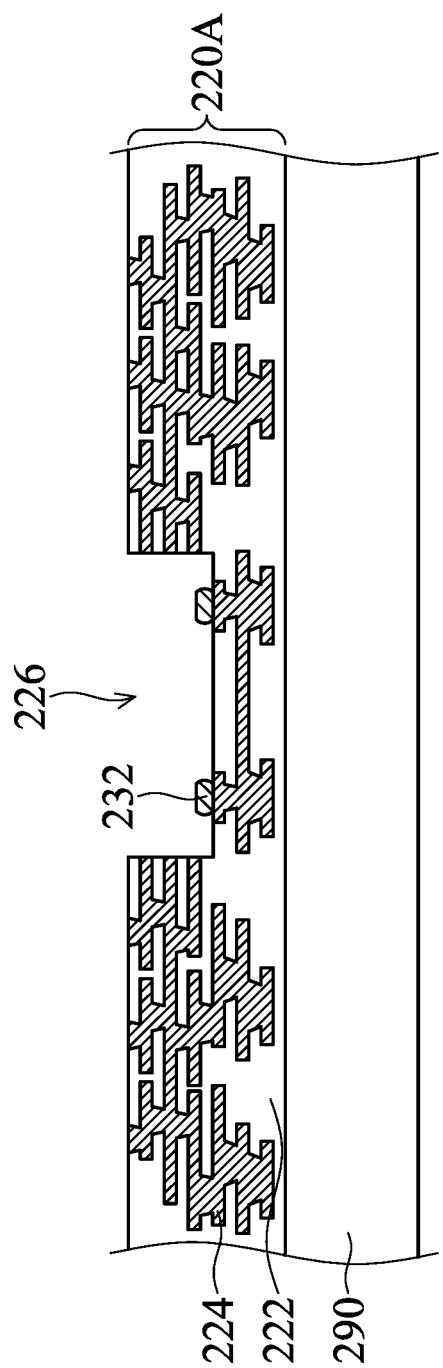
Figure 11C:
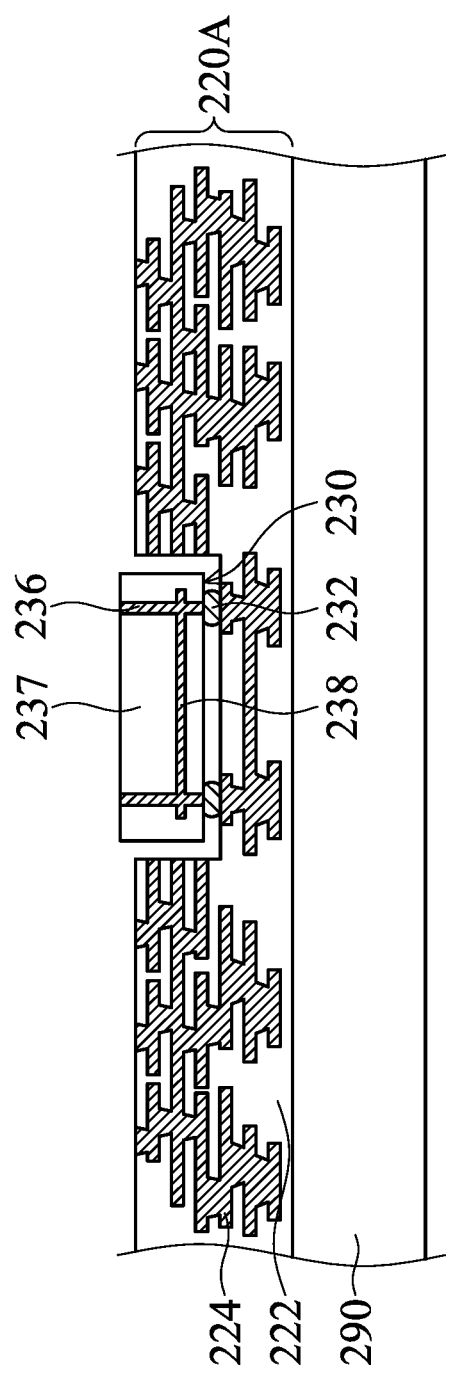

In FIG. 11B, conductive structures 232 are disposed in the recess 226 of the first interposer element 220A, in accordance with some embodiments of the present disclosure. In some embodiments, the conductive structures 232 are electrically connected to the conductive features 224 in the portion of first interposer element 220A under the recess 226. In FIG. 11C, the connecting element 230 is provided in the recess 226 and disposed on the conductive structures 232, in accordance with some embodiments of the present disclosure. In some embodiments, the connecting element 230 protrudes from the recess 226. In other words, the top surface of the connecting element 230 is higher than the top surface of the first interposer element 220A.

Figure 11D:
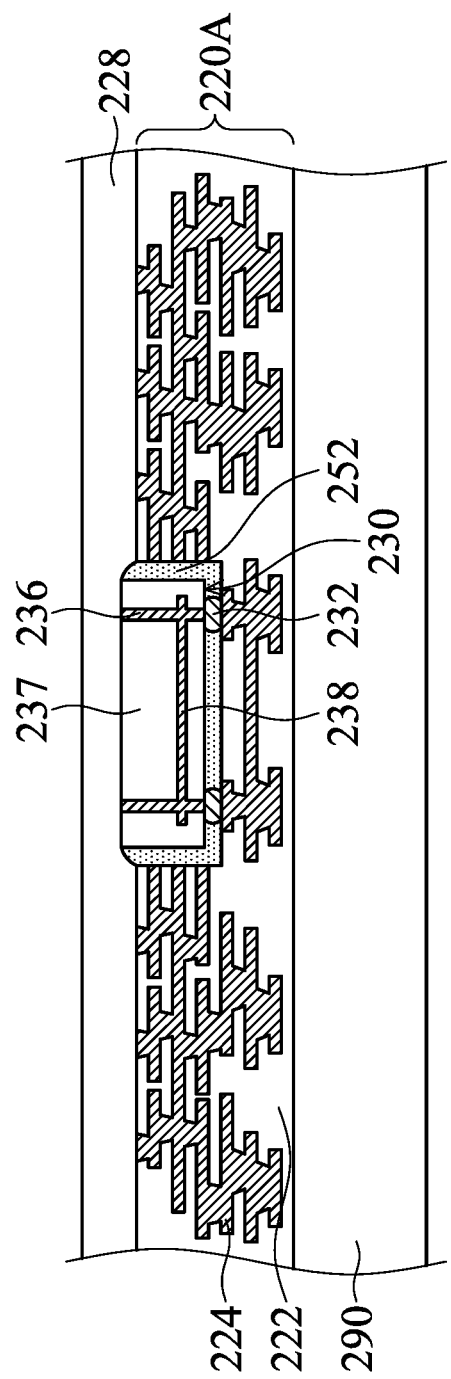

In FIG. 11D, an underfill element 252 is provided to fill the space in the recess 226, such as the space between the connecting element 230 and the first interposer element 220A. In some embodiments, the underfill element 252 surrounds the conductive structures 232. A molding compound 228 is provided to cover the first interposer element 220A, the connecting element 230, and the underfill element 252, in accordance with some embodiments of the present disclosure. In some embodiments, the underfill element 252 and the molding compound 228 may include different materials, such as different kinds of epoxy with different compositions and additives.

The molding compound 228 includes a polymer material, in accordance with some embodiments. The term "polymer" here can represent thermosetting polymers, thermoplastic polymers, or any mixtures thereof, in accordance with some embodiments. The polymer material can include, for example, plastic materials, epoxy resin, polyimide, polyethylene terephthalate (PET), polyvinyl chloride (PVC), polymethylmethacrylate (PMMA), polymer components doped with specific fillers including fiber, clay, ceramic, inorganic particles, or any combinations thereof. In other embodiments, the molding compound 228 can be made of epoxy resin, such as epoxy cresol novolac (ECN), biphenyl epoxy resin, multifunctional liquid epoxy resin, or any combinations thereof, in accordance with some embodiments. In still other embodiments, the molding compound 228 can be made of epoxy resin optionally including one or more fillers to provide the composition with any of a variety of desirable properties. Examples of fillers can be aluminum, titanium dioxide, carbon black, calcium carbonate, silica, or any combinations thereof, in accordance with some embodiments. A thermal process is performed on the molding compound 228 to cure the molding compound 228, in accordance with some embodiments of the present disclosure.

Figure 11E:
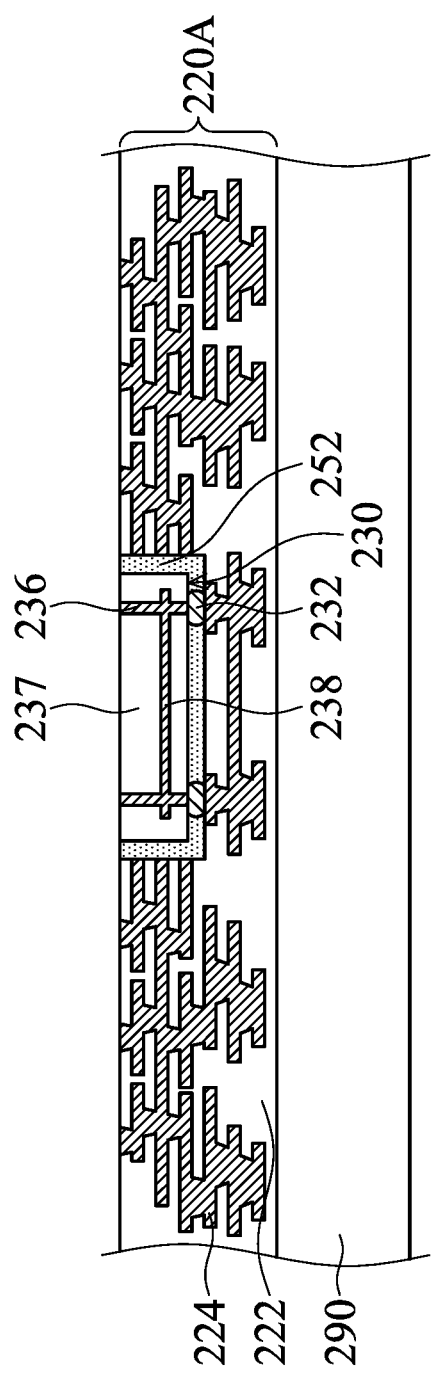

In FIG. 11E, the molding compound 228 and a portion of the connecting element 230 are removed (e.g. by grinding), so that the connecting element 230 and the first interposer element 220A have substantially coplanar top surfaces, in accordance with some embodiments of the present disclosure. In some embodiments, a portion of the first interposer element 220A is removed as well.

Figure 11F:
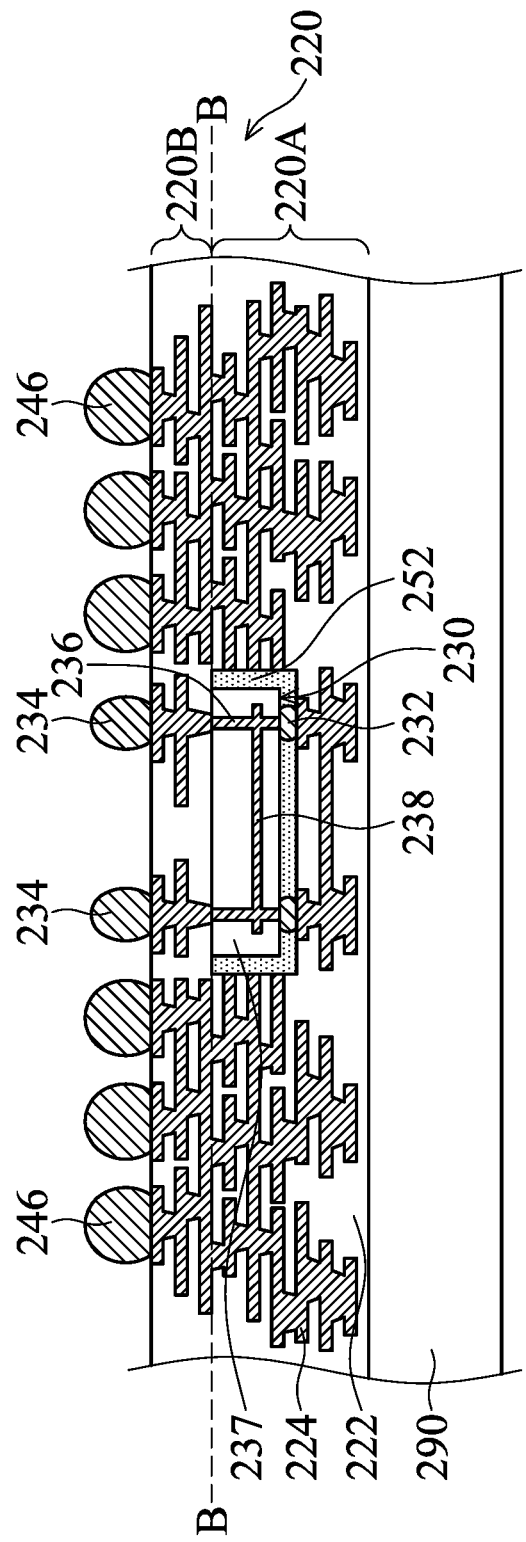

In FIG. 11F, a second interposer element 220B is provided on the first interposer element 220A, and the conductive structures 234 and the conductive structures 246 are provided on the second interposer element 220B, in accordance with some embodiments of the present disclosure. The conductive structures 234 are provided above the connecting element 230 (e.g. overlap the connecting element 230 in the vertical direction), and the conductive structures 246 are separated from the connecting element 230 in the vertical direction, in accordance with some embodiments of the present disclosure. In some embodiments, the size of the conductive structures 234 and the conductive structures 246 may be identical or different. For example, the size of the conductive structures 234 may be smaller than the size of the conductive structures 246, in accordance with some embodiments of the present disclosure. In some embodiments, the recess 226 of the first interposer element 220A is covered by the second interposer element 220B to form the accommodating space.

Figure 11G:
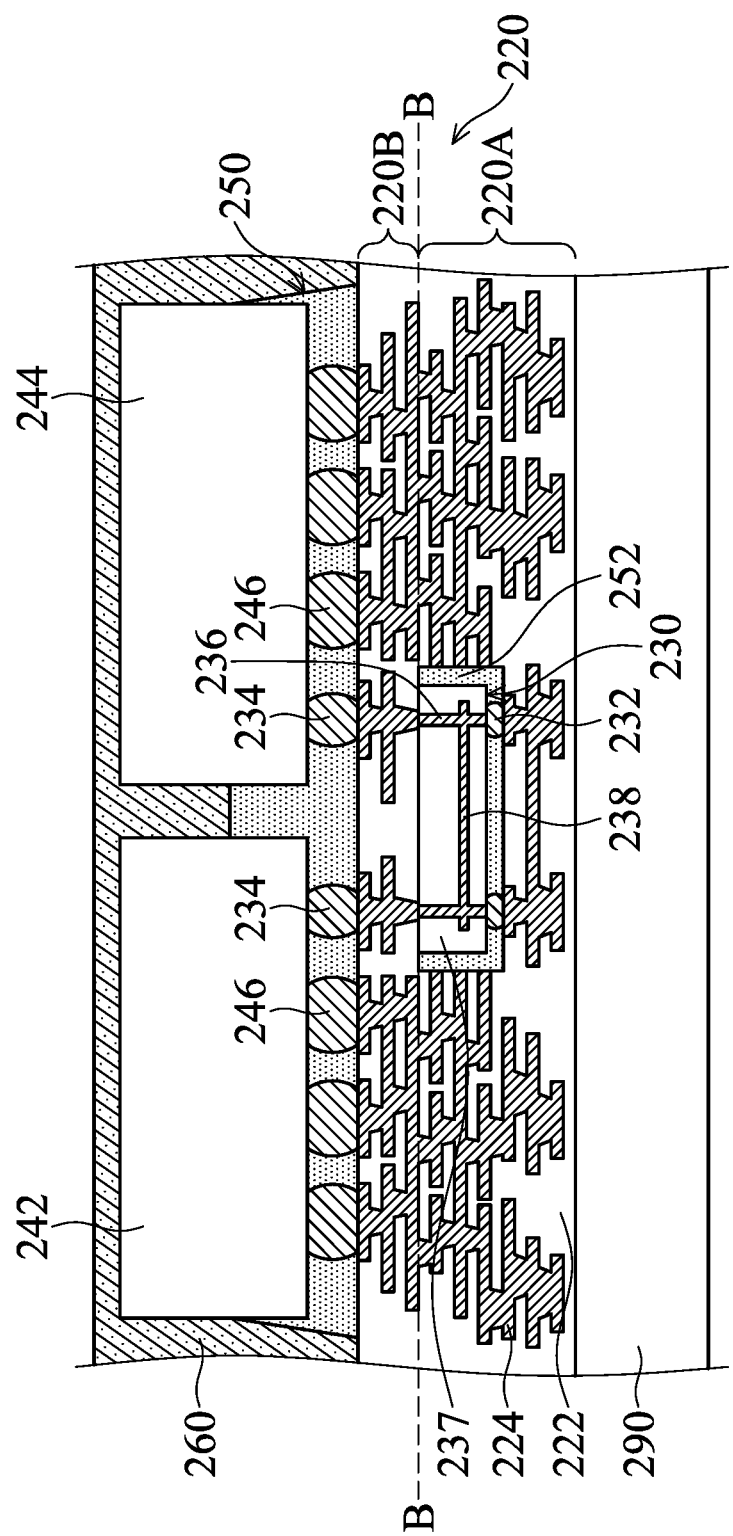

In FIG. 11G, the first semiconductor device 242 and the second semiconductor device 244 are provided on the conductive structures 234 and the conductive structures 246, in accordance with some embodiments of the present disclosure. In some embodiments, the connecting element 230 is enclosed in the interposer substrate 220 when the first semiconductor device 242 and the second semiconductor device 244 are provided on the interposer substrate 220. In some embodiments, the underfill layer 250 is provided on the interposer substrate 220, and between the first semiconductor device 242 and the second semiconductor device 244. Therefore, the underfill layer 250 continuously extends between the interposer substrate 220, the first semiconductor device 242, and the second semiconductor device 244. In some embodiments, the molding layer 260 is provided to cover and surround the first semiconductor device 242 and the second semiconductor device 244.

Figure 11H:
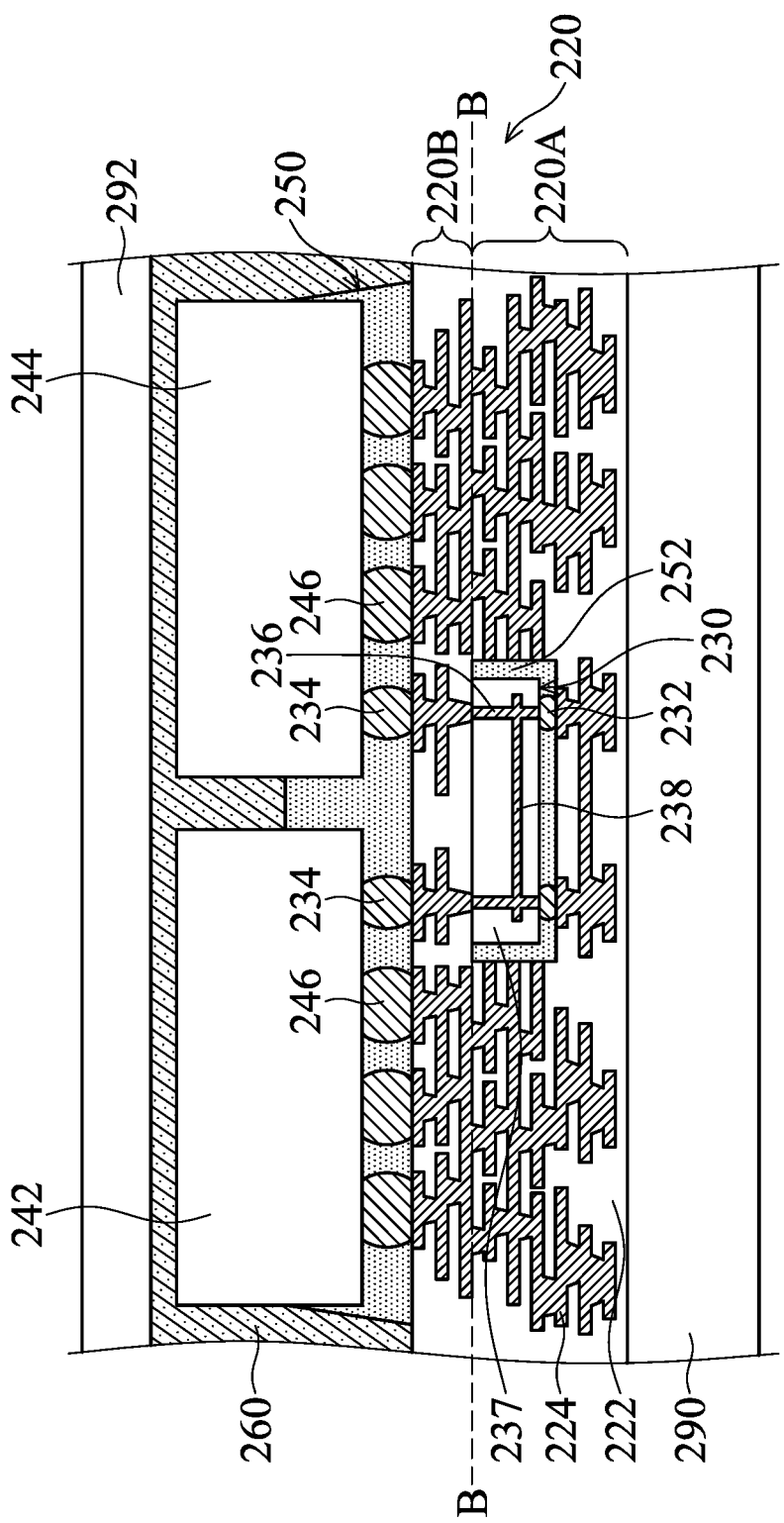
Figure 11I:
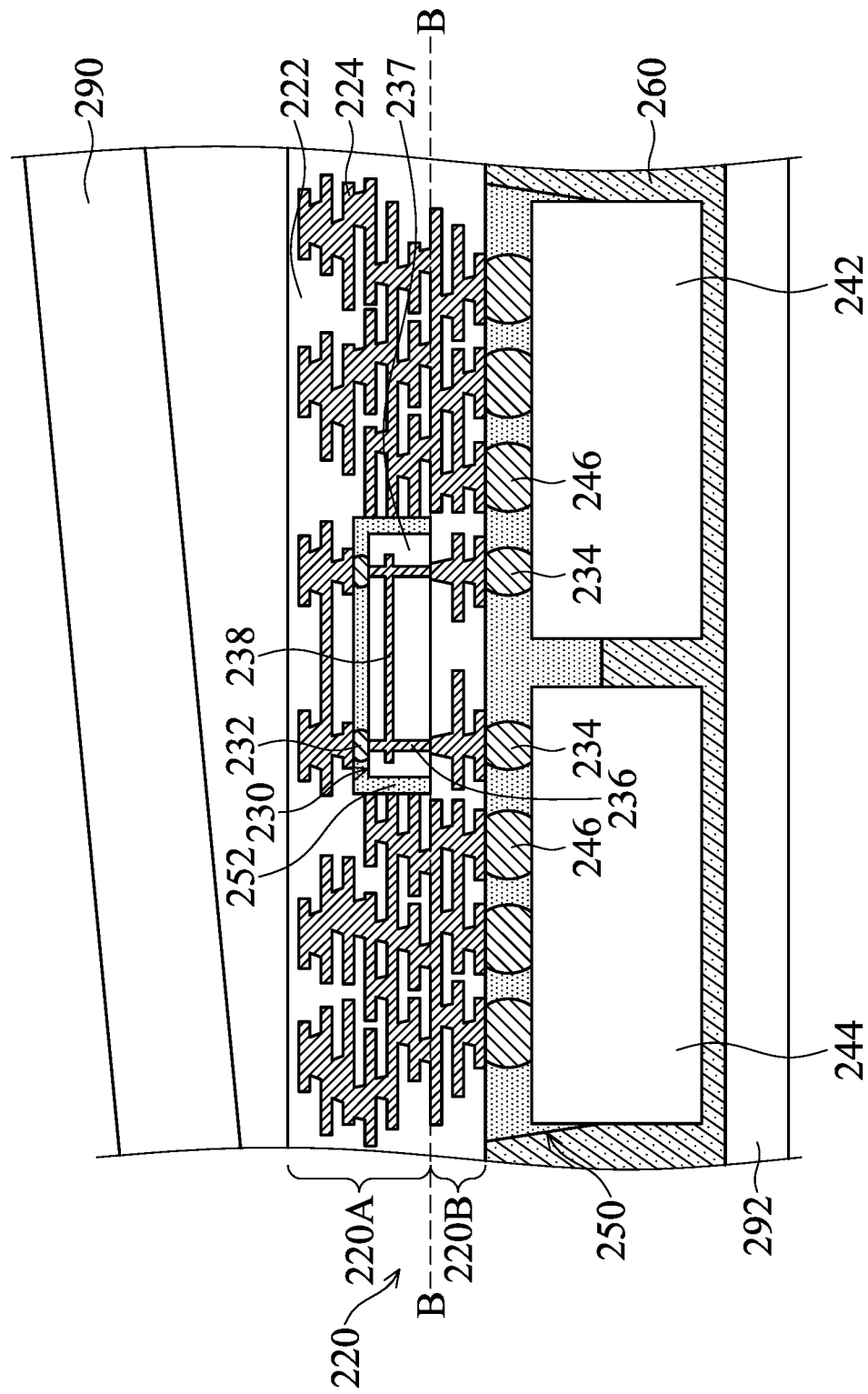

In FIG. 11H, a second carrier 292 is provided on the molding layer 260. In some embodiments, the first carrier 290 and the second carrier 292 are disposed on opposite sides of the interposer substrate 220. In some embodiments, a die attach film (DAF) is provided between the second carrier 292 and the molding layer 260 to attach the second carrier 292 onto the molding layer 260, in accordance with some embodiments of the present disclosure. In FIG. 11I, the whole structure is flipped, and the first carrier 290 is removed in some embodiments.

Figure 11J:
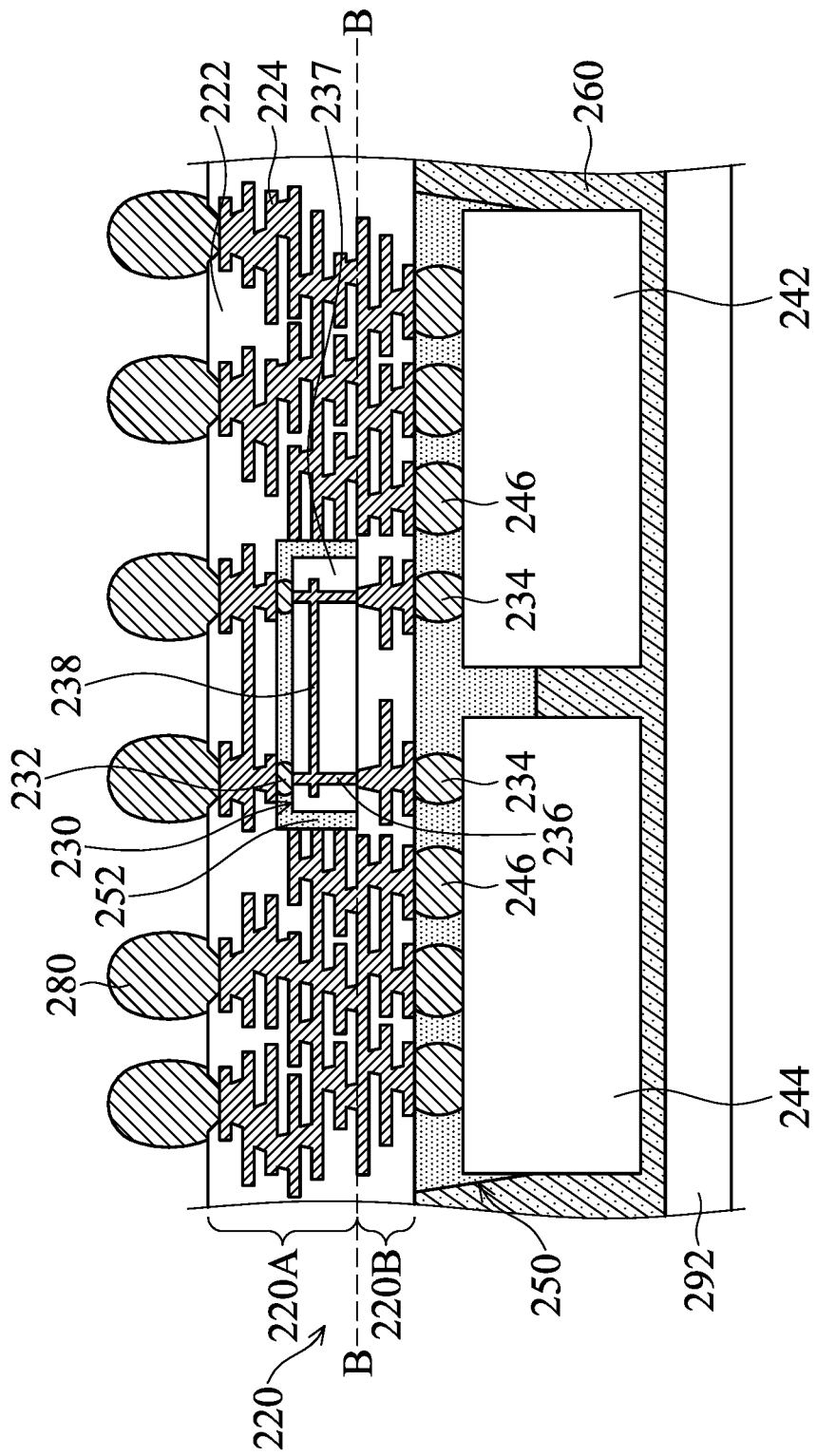

In FIG. 11J, holes are formed on the interposer substrate 220 (e.g. by etching) to expose the conductive features 224, and conductive structures 280 are formed on the interposer substrate 220 and partially formed in the holes of the interposer substrate 220 to in contact with the conductive features 224 in the interposer substrate 220, in accordance with some embodiments of the present disclosure.

Figure 11K:
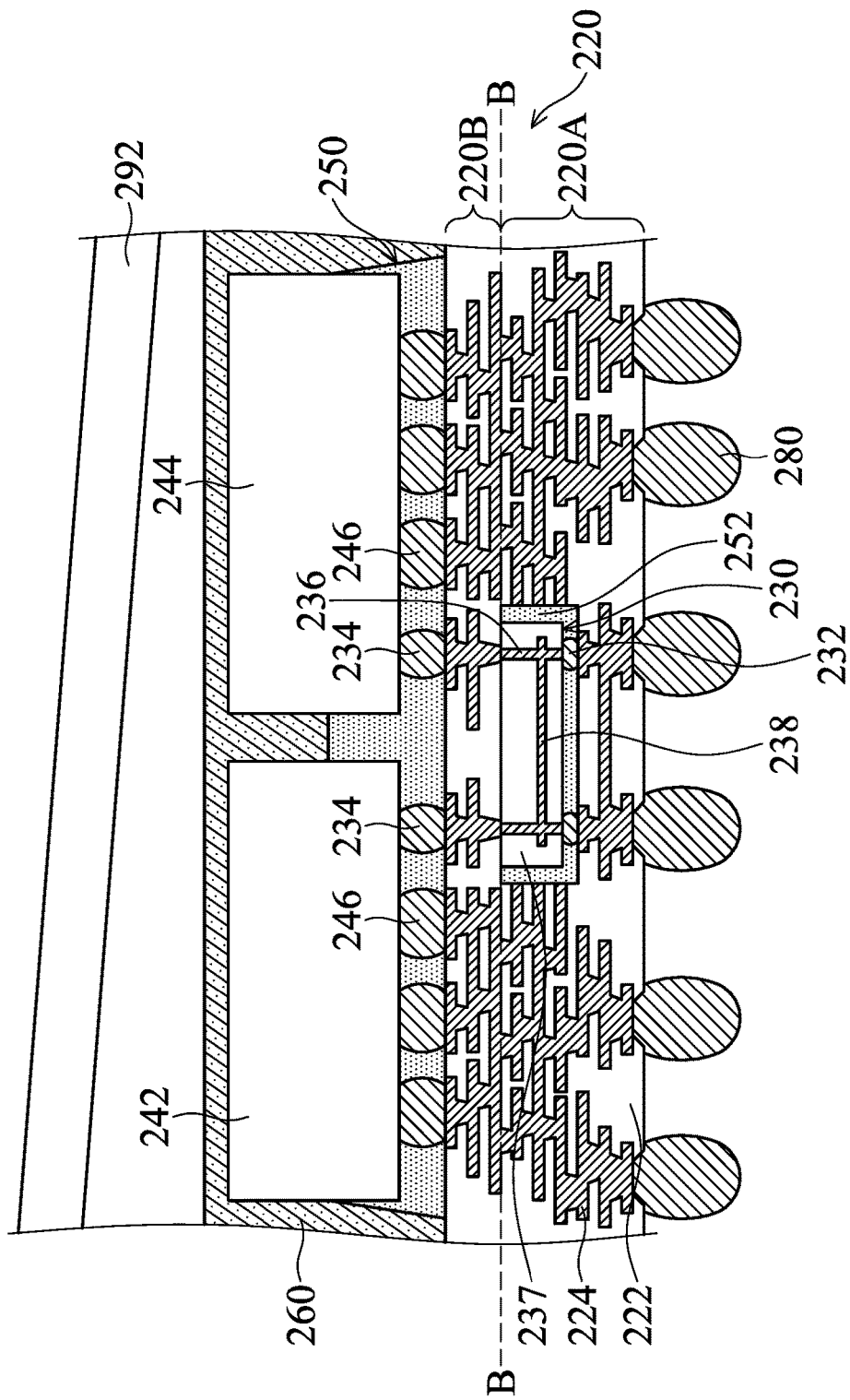
Figure 11L:
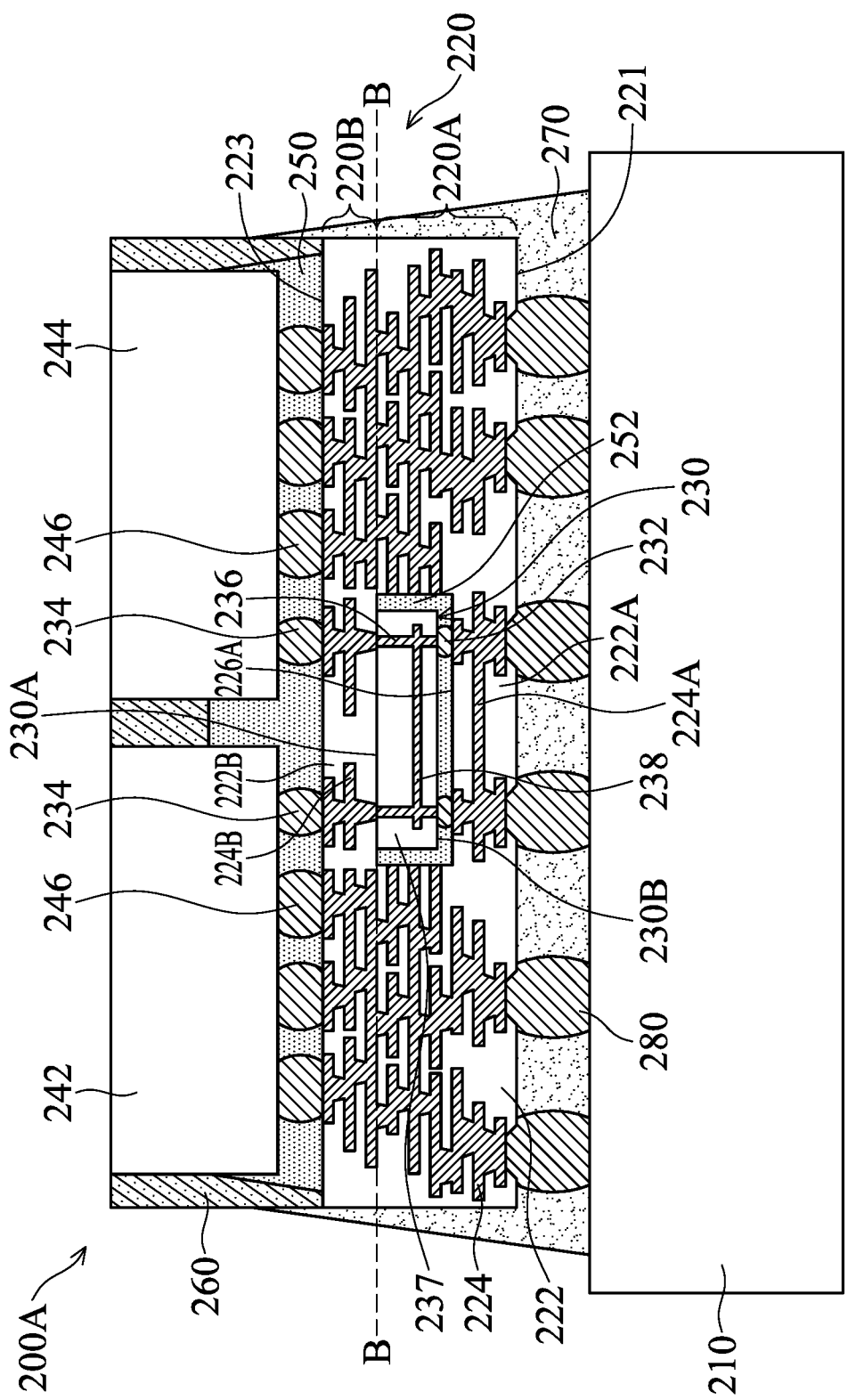

In FIG. 11K, the second carrier 292 is removed. In FIG. 11L, a dicing process is performed to let the molding layer 260 and the interposer substrate 220 have a straight sidewall, and then the carrier substrate 210 is connected to the interposer substrate 220 by the conductive structures 280, in accordance with some embodiments of the present disclosure. In some embodiments, the underfill layer 270 is provided to surround the conductive structures 280. In some embodiments, a portion of the molding layer 260 is removed to expose the top surface of the first semiconductor device 242 and/or the top surface of the second semiconductor device 244, such as by grinding in some embodiments of the present disclosure. Therefore, the semiconductor package structure 200A is formed, in accordance with some embodiments of the present disclosure.

Figure 12A:
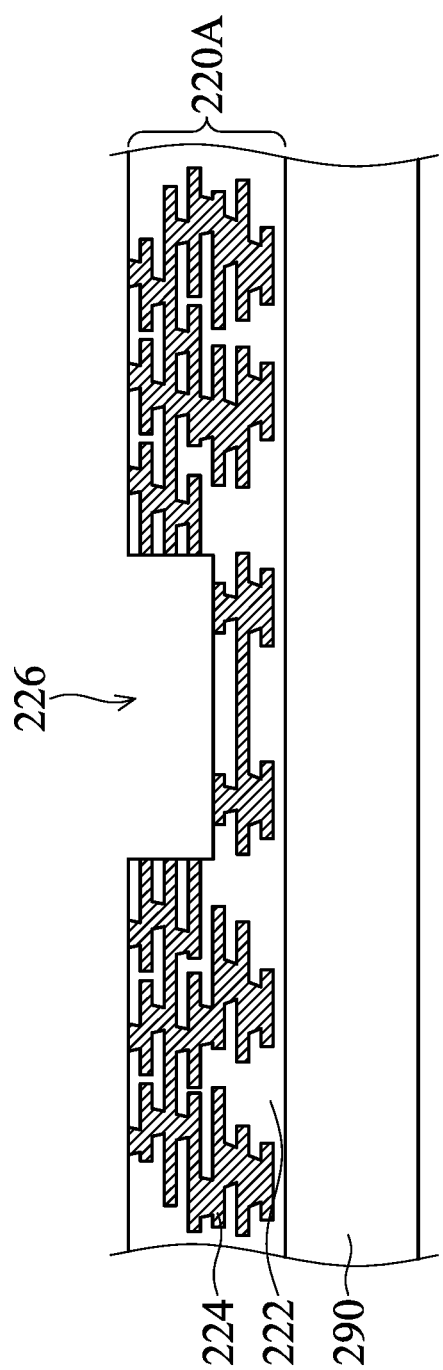
FIG. 12A to FIG. 12K show a process flow of forming the semiconductor package structure, in accordance with some embodiments of the present disclosure.

FIG. 12A to FIG. 12K show a process flow of forming the semiconductor package structure 200B, in accordance with some embodiments of the present disclosure. In FIG. 12A, the first interposer element 220A is provide on a first carrier 290, in accordance with some embodiments of the present disclosure. In some embodiments, the first interposer element 220A includes a recess 226. In some embodiments, conductive features 224 are formed in the portion of the first interposer element 220A under the recess 226. In some embodiments, a die attach film (DAF) is provided between the first carrier 290 and the first interposer element 220A to attach the first carrier 290 onto the first interposer element 220A, in accordance with some embodiments of the present disclosure.

Figure 12B:
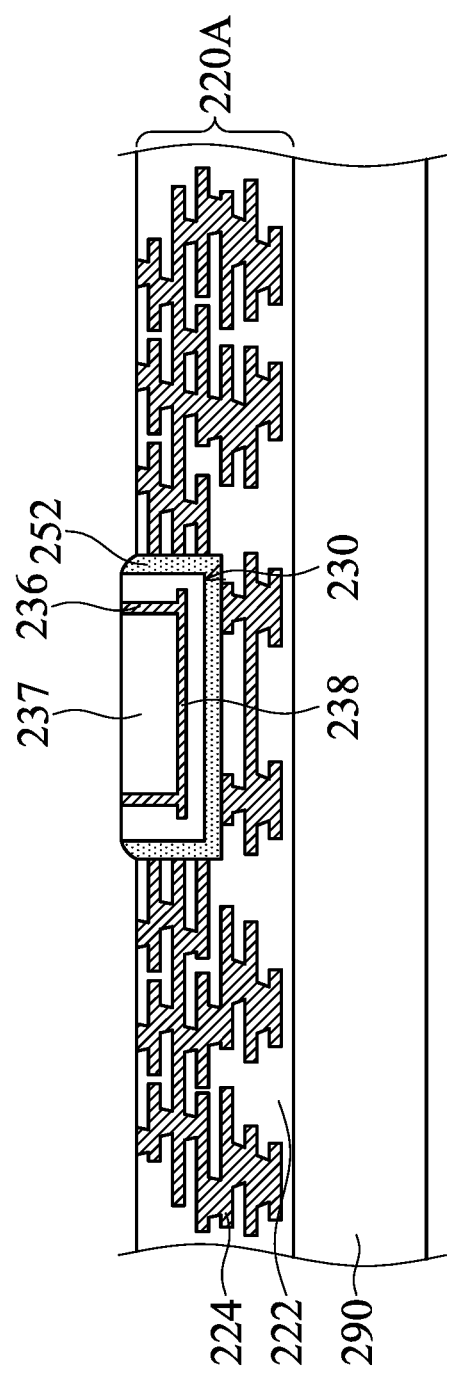

In FIG. 12B, the connecting element 230 and the underfill element 252 are provided in the recess 226, in accordance with some embodiments of the present disclosure. In some embodiments, the connecting element 230 protrudes from the recess 226. In other words, the top surface of the connecting element 230 is higher than the top surface of the first interposer element 220A. In some embodiments, the underfill element 252 is formed in the recess 226 before providing the connecting element 230 in the recess 226.

Figure 12C:
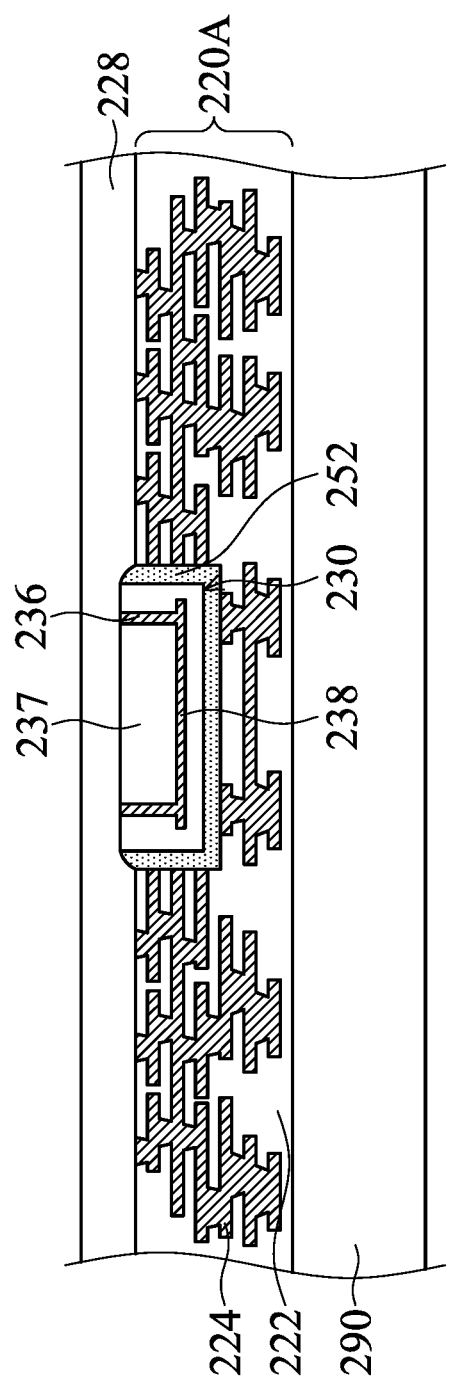

In FIG. 12C, a molding compound 228 is provided to cover the first interposer element 220A, the connecting element 230, and the underfill element 252, in accordance with some embodiments of the present disclosure. In some embodiments, the underfill element 252 and the molding compound 228 may include different materials, such as different kinds of epoxy with different compositions and additives.

Figure 12D:
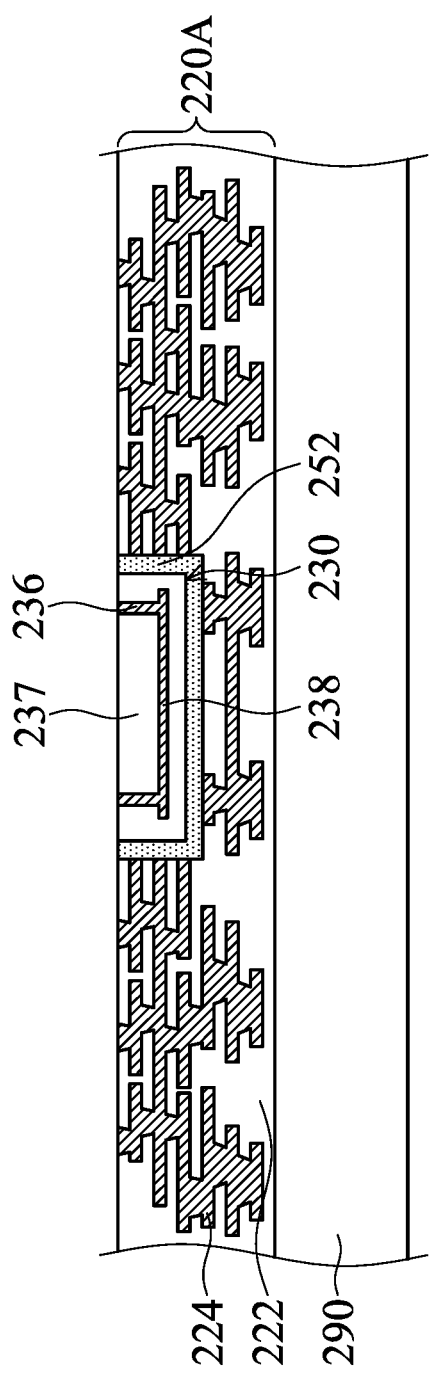

In FIG. 12D, the molding compound 228 and a portion of the connecting element 230 are removed (e.g. by grinding), so that the connecting element 230 and the first interposer element 220A have substantially coplanar top surfaces, in accordance with some embodiments of the present disclosure. In some embodiments, a portion of the first interposer element 220A is removed as well.

Figure 12E:
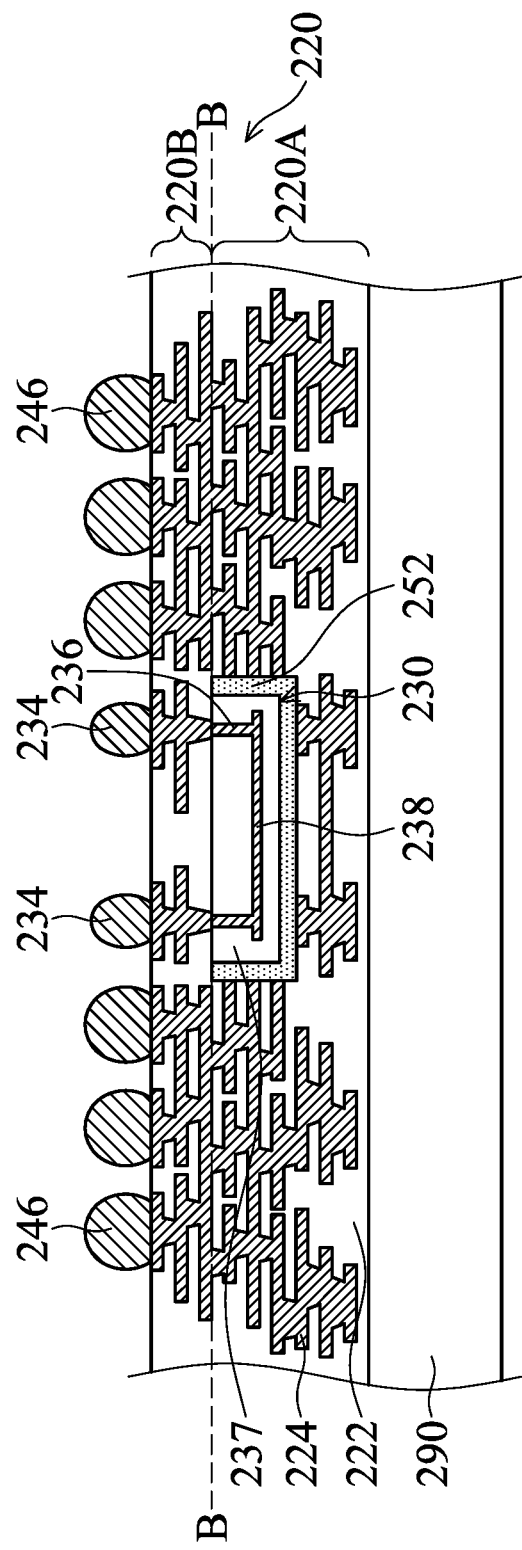

In FIG. 12E, a second interposer element 220B is provided on the first interposer element 220A, and the conductive structures 234 and the conductive structures 246 are provided on the second interposer element 220B, in accordance with some embodiments of the present disclosure. The conductive structures 234 are provided above the connecting element 230 (e.g. overlap the connecting element 230 in the vertical direction), and the conductive structures 246 are separated from the connecting element 230 in the vertical direction, in accordance with some embodiments of the present disclosure. In some embodiments, the size of the conductive structures 234 and the conductive structures 246 may be identical or different. For example, the size of the conductive structures 234 may be smaller than the size of the conductive structures 246, in accordance with some embodiments of the present disclosure.

Figure 12F:
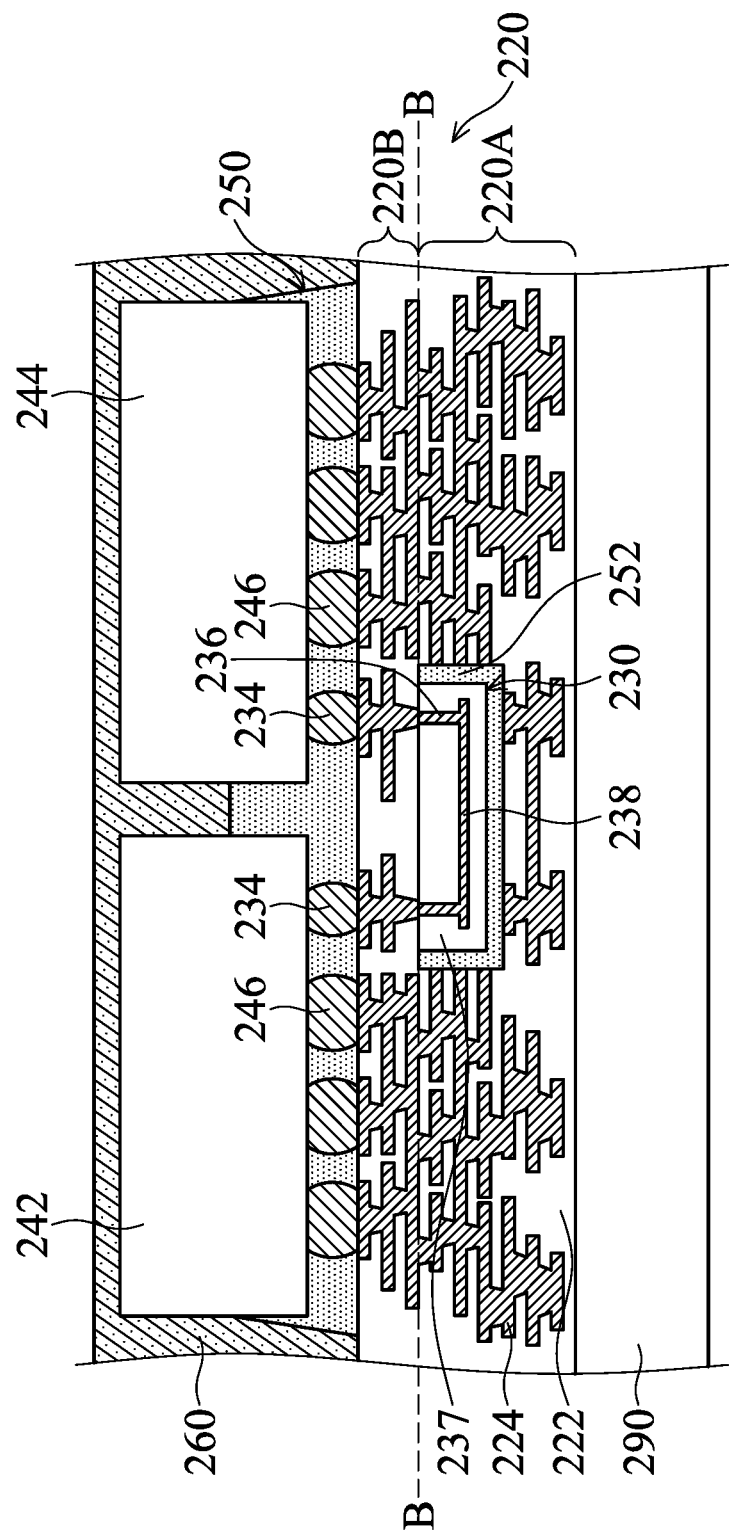

In FIG. 12F, the first semiconductor device 242 and the second semiconductor device 244 are provided on the conductive structures 234 and the conductive structures 246, in accordance with some embodiments of the present disclosure. In some embodiments, the connecting element 230 is enclosed in the interposer substrate 220 when the first semiconductor device 242 and the second semiconductor device 244 are provided on the interposer substrate 220. In some embodiments, an underfill layer 250 is provided on the interposer substrate 220, and between the first semiconductor device 242 and the second semiconductor device 244.

Therefore, the underfill layer 250 continuously extends between the interposer substrate 220, the first semiconductor device 242, and the second semiconductor device 244. In some embodiments, the molding layer 260 is provided to cover and surround the first semiconductor device 242 and the second semiconductor device 244.

Figure 12G:
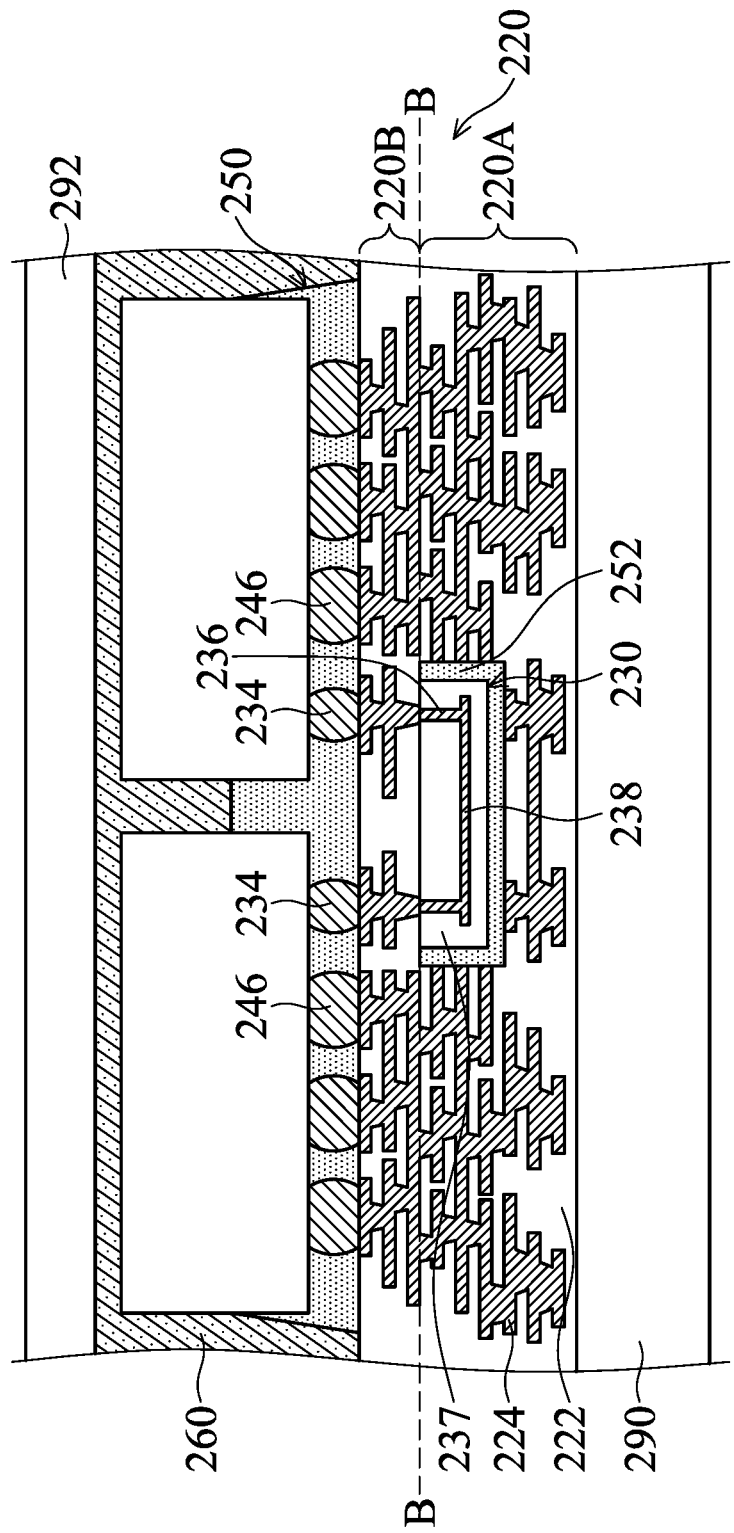
Figure 12H:
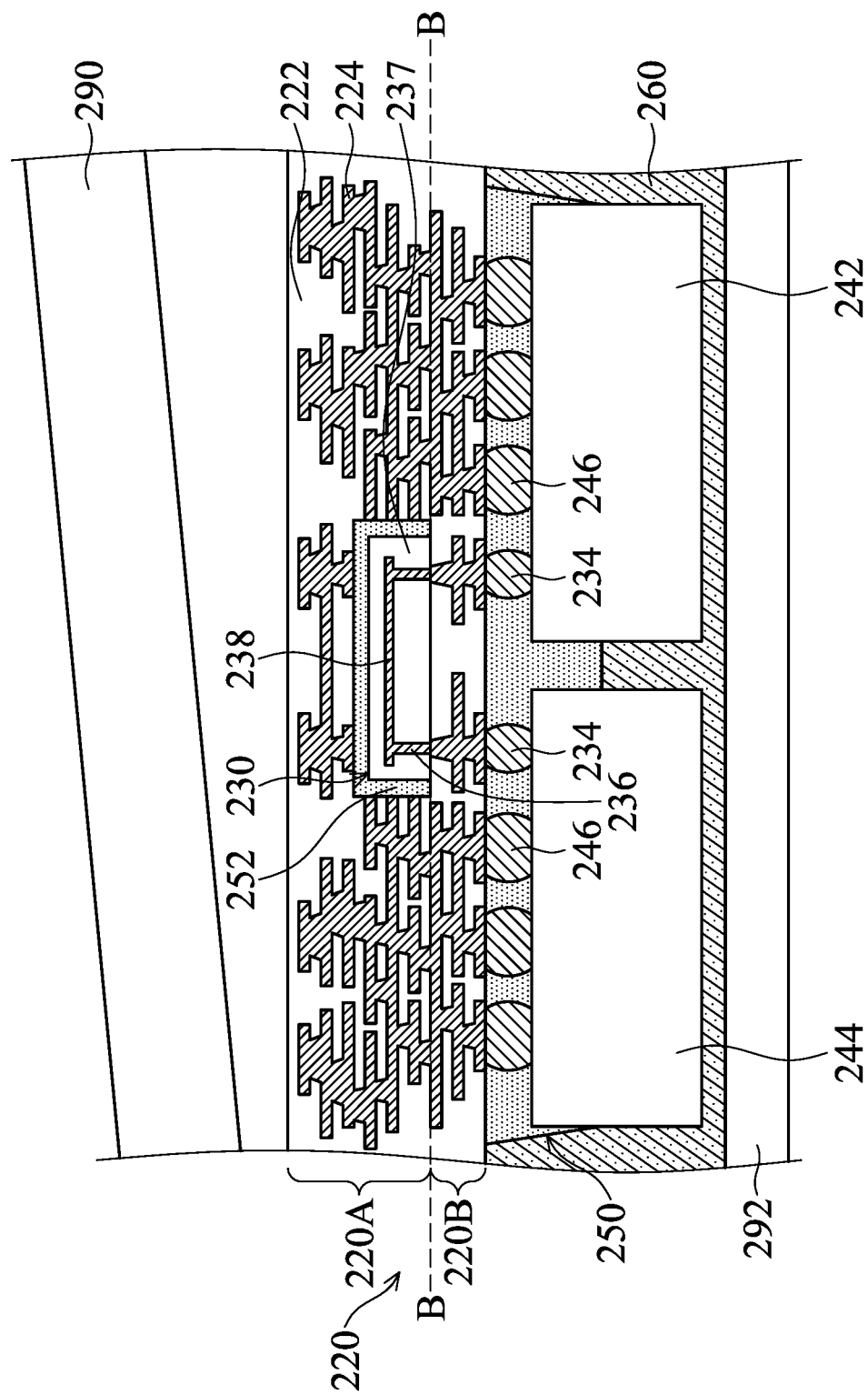
Figure 12I:
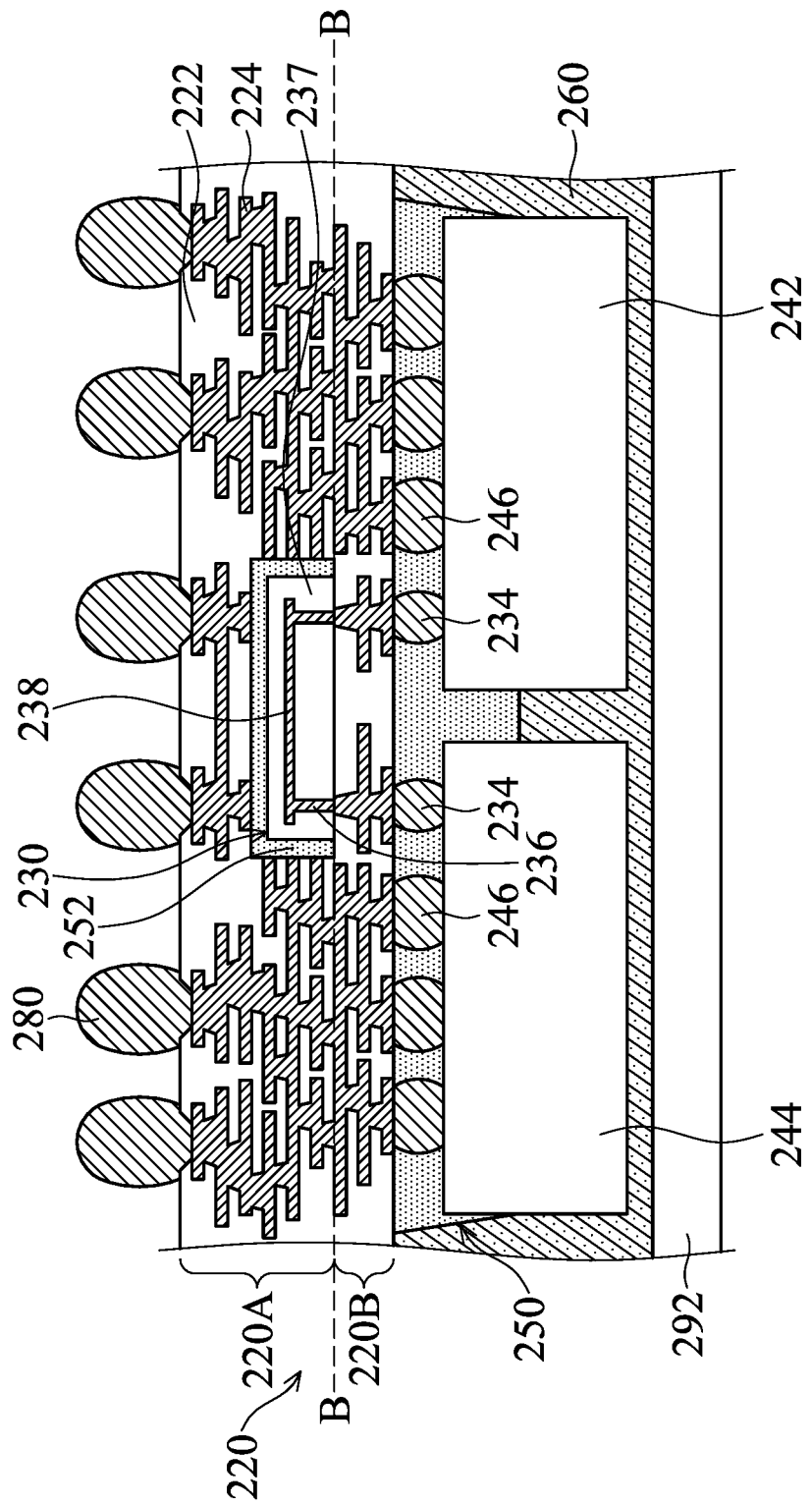

In FIG. 12G, a second carrier 292 is provided on the molding layer 260. In some embodiments, the first carrier 290 and the second carrier 292 are disposed on opposite sides of the interposer substrate 220. In some embodiments, a die attach film (DAF) is provided between the second carrier 292 and the molding layer 260 to attach the second carrier 292 onto the molding layer 260, in accordance with some embodiments of the present disclosure. In FIG. 12H, the whole structure is flipped, and the first carrier 290 is removed in some embodiments. In FIG. 12I, holes are formed on the interposer substrate 220 (e.g. by etching) to expose the conductive features 224, and conductive structures 280 are formed on the interposer substrate 220 and partially formed in the holes of the interposer substrate 220 to in contact with the conductive features 224 in the interposer substrate 220, in accordance with some embodiments of the present disclosure.

Figure 12J:
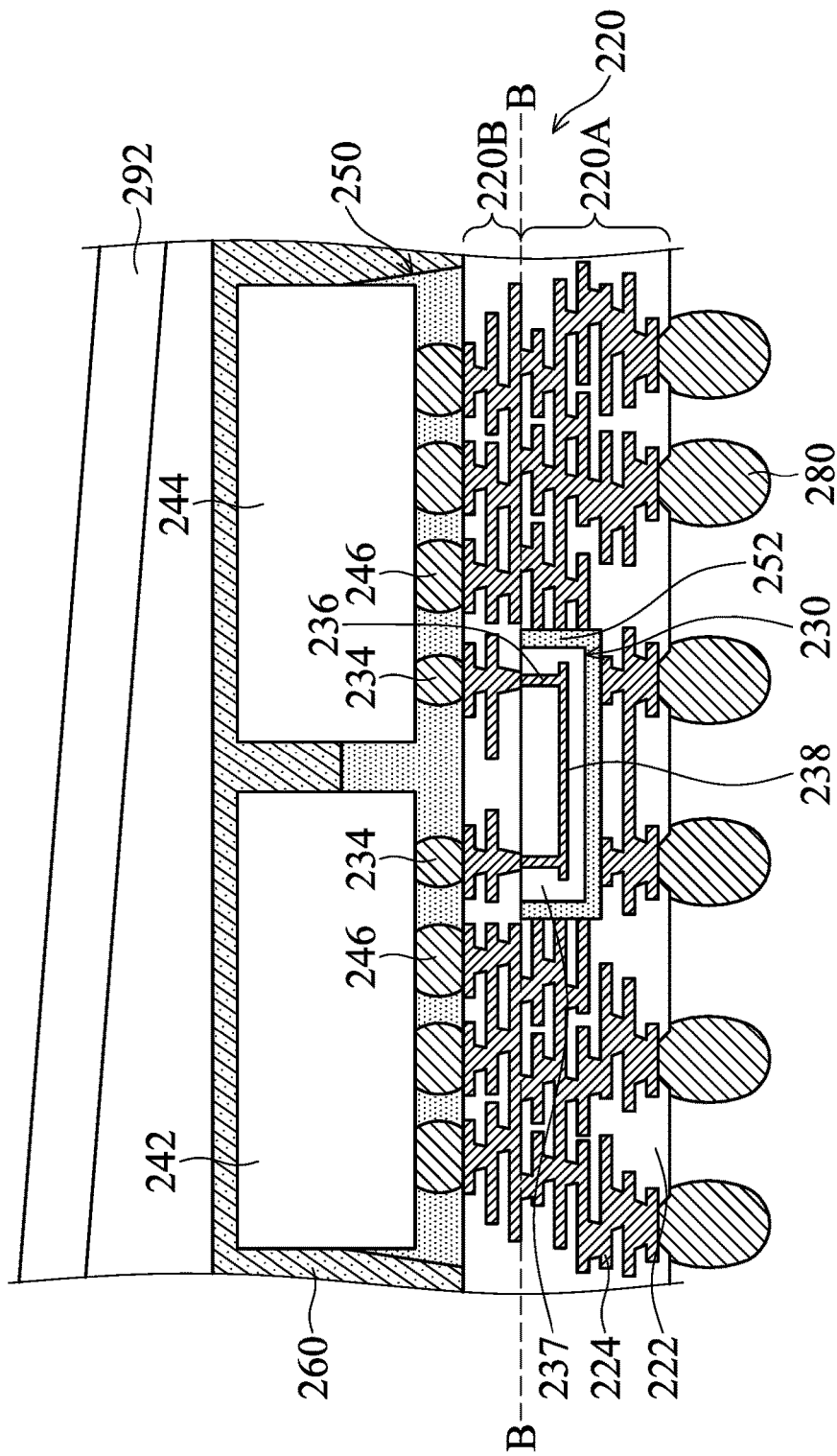
Figure 12K:
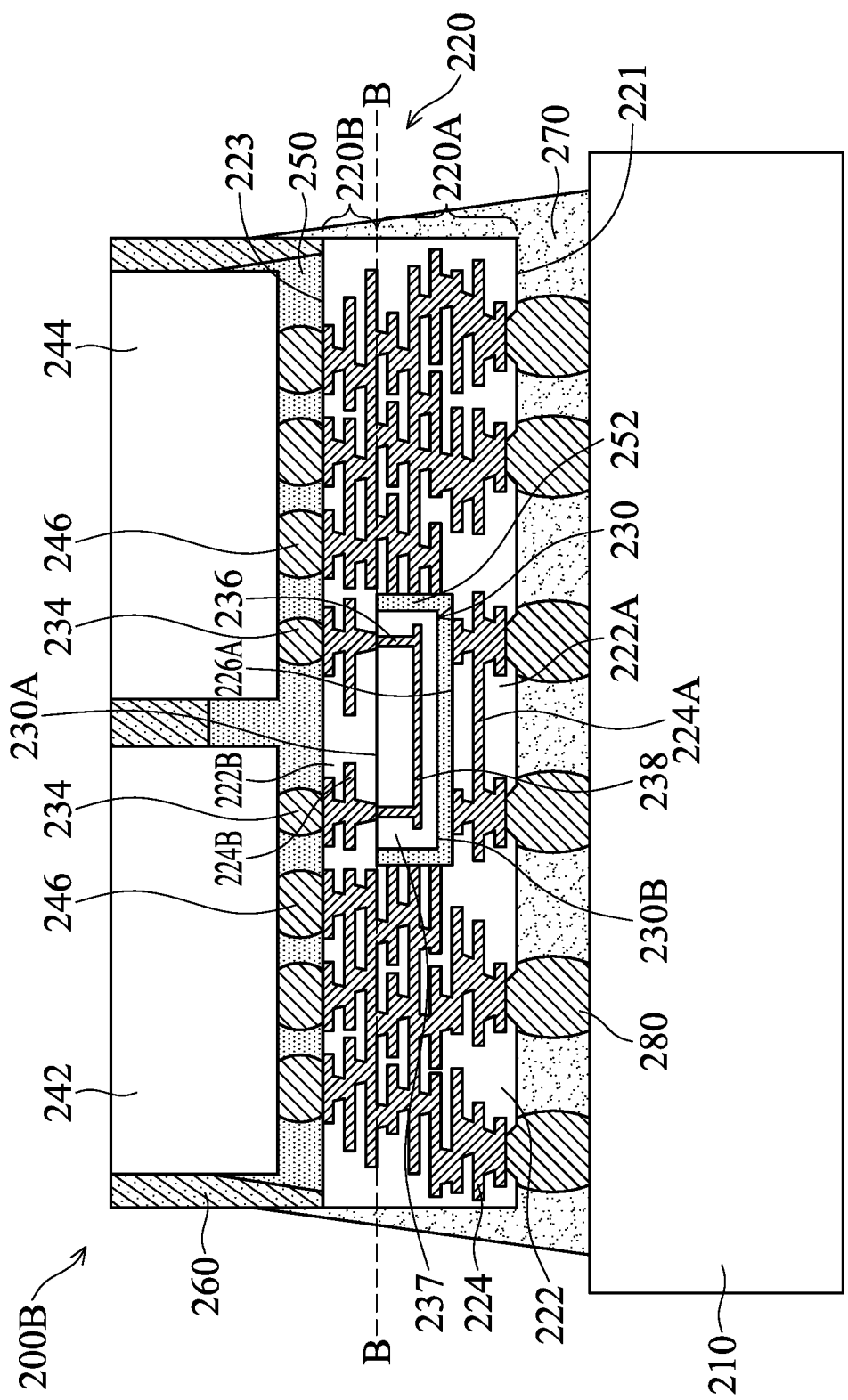

In FIG. 12J, the second carrier 292 is removed. In FIG. 12K, a dicing process is performed to let the molding layer 260 and the interposer substrate 220 have a straight sidewall, and then the carrier substrate 210 is connected to the interposer substrate 220 by the conductive structures 280, in accordance with some embodiments of the present disclosure. In some embodiments, the connecting element 230 and the conductive structures 280 are disposed on opposite sides of the interposer substrate 220. In some embodiments, the underfill layer 270 is provided to surround the conductive structures 280. In some embodiments, a portion of the molding layer 260 is removed to expose the top surface of the first semiconductor device 242 and/or the top surface of the second semiconductor device 244, such as by grinding in some embodiments of the present disclosure. Therefore, the semiconductor package structure 200B is formed, in accordance with some embodiments of the present disclosure.

In summary, a semiconductor package structure having a connecting element disposed in the recess of the interposer substrate for connecting semiconductor devices and a semiconductor package structure having a connecting element disposed in the accommodating space of the interposer substrate for connecting semiconductor devices are provided in some embodiments of the present disclosure. Such configuration allows signal of the semiconductor devices being transmitted faster, keeps the routability of the interposer substrate, and saves space for bumps on the interposer substrate. Therefore, the total cost is reduced, and miniaturization may be achieved. Moreover, providing the interposer substrate on both sides of the connecting elements keeps the mechanical strength of the interposer substrate, so the reliability of the semiconductor package structure may be enhanced.

A semiconductor package structure is provided in some embodiments, The semiconductor package structure includes a carrier substrate, an interposer substrate, a first semiconductor device, a second semiconductor device, a first underfill layer, and a package layer. The interposer substrate is disposed on the carrier substrate. The connecting element is disposed in the interposer substrate, wherein the connecting element includes a dielectric element and first conductive features disposed in the dielectric element. The first semiconductor device and the second semiconductor device are disposed on the interposer substrate, wherein the first semiconductor device is electrically connected to the second semiconductor device through the connecting element. The first underfill layer is disposed between the first semiconductor device, the second semiconductor device, and the interposer substrate. The package layer surrounds the first semiconductor device, the second semiconductor device, and the first underfill layer.

A method for forming a semiconductor package structure is provided in some embodiments of the present disclosure. The method includes providing an interposer substrate. The method further includes providing a connecting element in the interposer substrate, wherein the connecting element includes a dielectric element and conductive features disposed in the dielectric element. The method further includes providing a first semiconductor device and a second semiconductor device on the interposer substrate, wherein the first semiconductor device and the second semiconductor device are electrically connected to the connecting element. The method further includes bonding the interposer substrate to a carrier substrate.

A method for forming a semiconductor package structure is provided in some embodiments of the present disclosure. The method includes providing an interposer substrate. The method further includes providing a connecting element in the interposer substrate, wherein the connecting element includes a dielectric element and conductive features disposed in the dielectric element. The method further includes providing a first semiconductor device and a second semiconductor device on the interposer substrate, wherein the first semiconductor device and the second semiconductor device are electrically connected to the connecting element. The method further includes forming a first underfill layer between the first semiconductor device, the second semiconductor device, and the interposer substrate. The method further includes forming a package layer surrounding the first semiconductor device, the second semiconductor device, and the first underfill layer. The method further includes bonding a carrier substrate to the interposer substrate. The method further includes forming a second underfill layer between the carrier substrate and the interposer substrate.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor package structure, comprising:
    a carrier substrate;
    an interposer substrate disposed on the carrier substrate, wherein a recess is formed in the interposer substrate and over a first portion of the interposer substrate, and the first portion comprises a dielectric layer and second conductive features disposed in the dielectric layer;
    a connecting element disposed in the interposer substrate, wherein the connecting element comprises a dielectric element and first conductive features disposed in the dielectric element, and the dielectric element is in contact with the second conductive features;
    a first semiconductor device and a second semiconductor device disposed on the interposer substrate, wherein the first semiconductor device is electrically connected to the second semiconductor device through the connecting element;
    a first underfill layer disposed between the first semiconductor device, the second semiconductor device, and the interposer substrate; and
    a package layer surrounding the first semiconductor device, the second semiconductor device, and the first underfill layer.

2. The semiconductor package structure as claimed in claim 1, wherein the first underfill layer is disposed in the recess of the interposer substrate.

3. The semiconductor package structure as claimed in claim 1, wherein the interposer substrate has an accommodating space, the connecting element is embedded in the accommodating space, and a first surface of the connecting element facing away from the carrier substrate is covered by the interposer substrate.

4. The semiconductor package structure as claimed in claim 3, wherein the interposer substrate comprises a first interposer element and a second interposer element arranged in a vertical direction, and the connecting element is disposed between the first interposer element and the second interposer element.

5. The semiconductor package structure as claimed in claim 4, wherein a distance is between a bottom surface of the interposer substrate and a bottom surface of the accommodating space, and a height of the accommodating space in the interposer substrate is greater than the distance, and greater than a thickness of the second interposer element.

6. The semiconductor package structure as claimed in claim 1, wherein the first underfill layer is in contact with the second conductive features in the recess.

7. A method for forming a semiconductor package structure, comprising:
    providing an interposer substrate having a recess and a first portion above the recess, wherein the first portion comprises a dielectric layer and first conductive features;
    providing a connecting element in the recess of the interposer substrate, wherein the connecting element comprises a dielectric element and second conductive features disposed in the dielectric element, and the dielectric element is in contact with the first conductive features;
    providing a first semiconductor device and a second semiconductor device on the interposer substrate, wherein the first semiconductor device and the second semiconductor device are electrically connected to the connecting element;
    forming a first underfill layer between the first semiconductor device, second semiconductor device, and the interposer substrate, wherein the first underfill layer is in contact with the first conductive features; and
    bonding the interposer substrate to a carrier substrate.

8. The method as claimed in claim 7, further comprising thinning the connecting element to remove a portion of the second conductive features.

9. The method as claimed in claim 7, wherein the interposer substrate further comprises a second portion surrounding the recess, and a first thickness of the first portion is less than a second thickness of the second portion.

10. The method as claimed in claim 9, wherein the first portion is connected to the second portion.

11. The method as claimed in claim 7, further comprising forming a second underfill layer in the recess and surrounding the connecting element.

12. The method as claimed in claim 11, wherein a sidewall of the interposer substrate is physically separated from a sidewall of the recess by the second underfill layer.

13. The method as claimed in claim 7, wherein the interposer substrate further comprises a third portion below the recess, and the connecting element is sandwiched by the first portion and the third portion.

14. The method as claimed in claim 13, wherein the connecting element is in contact with the first portion and the third portion.

15. The method as claimed in claim 14, further comprising forming a second underfill layer in the recess and surrounding the connecting element, wherein the second underfill layer is in contact with the first portion and the third portion.

16. The method as claimed in claim 14, wherein the second conductive features are in contact with the first portion and the third portion.

17. A method for forming a semiconductor package structure, comprising:
  providing an interposer substrate comprising a board and first conductive features disposed in the board, comprising:
    providing a first interposer element having a recess; and
    providing a second interposer element on the first interposer element, wherein the recess of the first interposer element is covered by the second interposer element, and the first interposer element and the second interposer element form the interposer substrate;
  providing a connecting element in the interposer substrate, wherein the connecting element comprises a dielectric element and second conductive features disposed in the dielectric element, and the first conductive features extend below the connecting element;
  providing an underfill element in the recess;
  providing a molding compound to cover the connecting element and the underfill element; and
  removing the molding compound, a portion of the connecting element, and a portion of the underfill element, so that the connecting element and the first interposer element have coplanar top surfaces;
  providing a first semiconductor device and a second semiconductor device on the interposer substrate, wherein the first semiconductor device and the second semiconductor device are electrically connected to the connecting element;
  forming a first underfill layer between the first semiconductor device, the second semiconductor device, and the interposer substrate;
  forming a package layer surrounding the first semiconductor device, the second semiconductor device, and the first underfill layer;
  bonding a carrier substrate to the interposer substrate; and
  forming a second underfill layer between the carrier substrate and the interposer substrate.

18. The method as claimed in claim 17, wherein the interposer substrate has a recess, the connecting element is provided in the recess, and the first underfill layer is formed in the recess of the interposer substrate, wherein the first underfill layer is in contact with the connecting element.

19. The method as claimed in claim 17, further comprising third conductive features in contact with the first conductive features, the second conductive features, and the first underfill layer.

* * * * *